(12) United States Patent
Meersmann et al.

(10) Patent No.: US 7,576,538 B2
(45) Date of Patent: Aug. 18, 2009

(54) NUCLEAR ELECTRIC QUADRUPOLAR PROPERTIES OF HYPERPOLARIZED GASES TO PROBE SURFACES AND INTERFACES

(75) Inventors: Thomas Meersmann, 1900 Kingsborough, Fort Collins, CO (US) 80526; Galina E. Pavlovskaya, Fort Collins, CO (US); Zackary I. Cleveland, Fort Collins, CO (US); Karl F. Stupic, Fort Collins, CO (US)

(73) Assignee: Thomas Meersmann, Fort Collins, CO (US)

( * ) Notice: Subject to any disclaimer, the term of this patent is extended or adjusted under 35 U.S.C. 154(b) by 15 days.

(21) Appl. No.: 11/686,009

(22) Filed: Mar. 14, 2007

(65) Prior Publication Data

US 2007/0241752 A1 Oct. 18, 2007

Related U.S. Application Data

(60) Provisional application No. 60/782,317, filed on Mar. 14, 2006.

(51) Int. Cl.
*G01V 3/00* (2006.01)
(52) U.S. Cl. .................................. 324/309; 324/304
(58) Field of Classification Search ......... 324/300–322; 600/410, 420, 422; 424/9, 9.3; 128/653
See application file for complete search history.

(56) References Cited

U.S. PATENT DOCUMENTS

| | | | |
|---|---|---|---|
| 5,617,860 | A | 4/1997 | Chupp et al. |
| 5,785,953 | A | 7/1998 | Albert et al. |
| 5,789,921 | A | 8/1998 | Albert et al. |
| 6,123,919 | A | 9/2000 | Albert et al. |
| 6,241,966 | B1 | 6/2001 | Albert et al. |
| 6,426,058 | B1 * | 7/2002 | Pines et al. ............... 424/9.3 |
| 6,593,144 | B2 * | 7/2003 | Albert et al. ............. 436/173 |
| 6,666,047 | B1 | 12/2003 | Shah et al. |
| 6,818,202 | B2 * | 11/2004 | Pines et al. ............... 424/9.3 |

(Continued)

FOREIGN PATENT DOCUMENTS

WO WO 96/40585 12/1996

OTHER PUBLICATIONS

Brinkmann et al. (Jan. 1980) "Nuclear Magnetic Relaxation of $^{83}$Kr in Krypton Gas," *Phys. Rev. A* 21(1):163-167.

(Continued)

*Primary Examiner*—Brij B Shrivastav
(74) *Attorney, Agent, or Firm*—Greenlee, Winner and Sullivan, P.C.

(57) ABSTRACT

Methods and related devices are provided for probing a surface by application of a hyperpolarized noble gas having a nuclear electric quadrupole moment to the surface. In an embodiment, the hyperpolarized noble gas is substantially free of alkali metal vapor, such as rubidium vapor used to hyperpolarize the noble gas. Noble gas interaction with the surface of interest is detected by measuring quadrupolar-driven events such as $T_1$, $T_2$ relaxation or coherent processes by nuclear magnetic resonance spectroscopy or by magnetic resonance imaging, for example. The method is capable of probing a variety of surfaces that are difficult to analyze by conventional methods, including biological or non-biological surfaces, to obtain detailed and reliable information related to surface chemical composition.

30 Claims, 24 Drawing Sheets

U.S. PATENT DOCUMENTS

| | | | | |
|---|---|---|---|---|
| 7,373,782 | B2* | 5/2008 | Driehuys et al. | 62/48.1 |
| 2001/0000726 | A1 | 5/2001 | Albert et al. | |
| 2005/0030026 | A1* | 2/2005 | Pines et al. | 324/309 |
| 2007/0080684 | A1* | 4/2007 | Appelt et al. | 324/304 |
| 2007/0156046 | A1* | 7/2007 | Hasing et al. | 600/420 |

OTHER PUBLICATIONS

Butscher et al. (Feb. 1996) "Nuclear Quadrapole Surface Interaction of Gas Phase $^{83}$Kr: Comparison with $^{131}$Xe," *Chem. Phys. Lett.* 249(5-6):444-450.

Butscher et al. (1994) "Nuclear Quadrupole Interaction of Highly Polarized Gas Phase $^{131}$Xe with a Glass Surface," *J. Chem. Phys.* 100:6923-6933.

Chupp et al. (Sep. 1985) "Polarization of $^{21}$Ne by Spin Exchange with Optically Pumped Rb Vapor," *Phys. Rev. Lett.* 55(10):1074-1077.

Cleveland et al. (2008) "Detection of Tobacco Smoke Deposition by Hyperpolarized Krypton-83 MRI," *Magn. Reson. Imag.* 26:270-278.

Cleveland et al. (2007) "Studying Porous Materials with Krypton-83 NMR Spectroscopy," *Magn. Reson. Chem.* 45:S12-S23.

Cleveland et al. (Jan. 25, 2006) "Exploring Hyperpolarized $^{83}$Kr by Remotely Detected NMR Relaxometry," *J. Chem. Phys.* 124:044312.

Cleveland et al. (2007) "Hyperpolarized $^{83}$Kr and $^{129}$Xe NMR Relaxation Measurements of Hydrated Surfaces: Implications for Materials Science and Pulmonary Diagnostics," *J. Am. Chem. Soc.* 129(6):1784-1792.

Cowgill et al. (Dec. 1973) "Spin-Lattice Relaxation and Chemical Shift of Kr$^{83}$ in Solid and Liquid Krypton," *Phys. Rev. B* 8(11):4966-4974.

Deschamps et al. (2000) "Nuclear Magnetic Resonance Study of Xenon-131 Interacting with Surfaces: Effective Liouvillian and Spectral Analysis," *J. Chem. Phys.* 13:1630-1640.

Driehuys et al. (Jun. 1995) "Surface Relaxation Mechanisms of Laser-Polarized $^{129}$Xe," *Phys. Rev. Lett.* 74(24):4943-4946.

Dybowski et al. (1991) "NMR Spectroscopy of Xenon in Confined Spaces: Clathrates, Intercalated, and Zeolites," *Ann. Rev. Phys. Chem.* 42:433-464.

Grover, B.C. (Feb. 1978) "Noble-Gas NMR Detection Through Noble-Gas-Rubidium Hyperfine Contact Interaction," *Phys. Rev. Lett.* 40(6):391-392.

Holz et al. (1995) "Temperature Dependence of $^{21}$Ne, $^{83}$Kr, and $^{131}$Xe Quadrupole Relaxation and of Xenon Diffusion in Polyatomic Solvents," *Appl. Magn. Reson.* 8:501-519.

Horton-Garcia et al. (Jan. 22, 2005) "Introducing Krypton NMR Spectroscopy as a Probe of Void Space in Solids," *J. Am. Chem. Soc.* 127:1958-1962.

Jokisaari et al. (Jan. 1993) "Electric Field Gradients Experienced by the Noble Gas Isotopes $^{21}$Ne, $^{83}$Kr and $^{131}$Xe in Thermotropic Liquid Crystals," *Mol. Phys.* 78(1):41-54.

Kwon et al. (Oct. 1981) "Quadrupole Nuclear Spin Relaxation of $^{131}$Xe in the Presence of Rubidium Vapor," *Phys. Rev. A* 24(4):1894-1903.

Long et al. (1995) "Xenon NMR Study of a Nematic Liquid Crystal Confined to Cylindrical Submicron Cavities," *J. Phys. Chem.* 99(31):11989-11993.

Luhmer et al. (1998) "Quadrupole NMR Relaxation of the Noble Gases Dissolved in Simple Liquids and Solutions—A Critical Review of Experimental Data in the Light of Computer Simulation Results," *Prog. NMR Spectrosc.* 33:57-76.

Meersmann et al. (Aug. 1998) "Magnetic Field Dependent Xenon-131 Quadrupolar Splitting in Gas and Liquid Phase NMR," *Phys. Rev. Lett.* 81(6):1211-1214.

Meersmann et al. (Feb. 1998) "Multiple-Quantum Filtered Xenon-131 NMR as a Surface Probe," *Phys. Rev. Lett.* 80(7):1398-1401.

Meersmann et al. (2001) "Probing Aerogels by Multiple Quantum Filtered $^{131}$Xe NMR Spectroscopy," *J. Am. Chem. Soc.* 123:941-945.

Millot et al. (2001) Quantification of Electric-Field Gradients in the Supercage of Y Zeolites by Comparing the Chemical Shifts of $^{131}$Xe (I=3/2) and $^{129}$Xe (I=1/2), *Stud. Surf. Sci. Catal.* 135.

Moudrakovski et al. (2001) "$^{131}$Xe, a New NMR Probe of Void Space in Solids," *J. Am. Chem. Soc.* 123(9):2066-2067.

Pavlovskaya et al. (1999) "Xenon-131 Surface Sensitive Imaging of Aerogels in Liquid Xenon Near the Critical Point," *J. Mag. Reson.* 137:258-264.

Pavlovskaya et al. (Dec. 20, 2005) "Hyperpolarized Krypton-83 as a Contrast Agent for Magnetic Resonance Imaging," *Proc. Nat. Acad. Sci. USA* 102(51):18275-18279.

Raftery, D. (2006) "Xenon NMR Spectroscopy," *Ann. Reports NMR Spectrosc.* 57:205-207.

Raftery et al. (Jul. 1994) "Multiple-Pulse Nuclear Magnetic Resonance of Optically Pumped Xenon in a Low Magnetic Field," *Phys. Rev. A* 50(1):567-574.

Raftery et al. (Feb. 1991) "High-Filed NMR of Adsorbed Xenon Polarized by Laser Pumping," *Phys. Rev. Lett.* 66(5):584-587.

Raftery et al. (1993) "Spin-Polarized Xenon-129 NMR Study of a Polymer Surface," *J. Phys. Chem.* 97(8):1649-1655.

Raftery et al. (1994) "Xenon NMR Spectroscopy," *NMR Basic Princ. Prog.* 30:111-158.

Raftery, D. (Feb. 2006) "A Cryptic Contrast Agent," *Nat. Phys.* 2:77-78.

Ratcliffe et al. (1998) "Xenon NMR," *NMR Spectrosc.* 36:123-221.

Schaefer et al. (Jun. 1990) "Determination of Spin-Exchange Parameters Between Optically Pumped Rubidium and $^{83}$Kr," *Phys. Rev. A* 41(11):6063-6070.

Schearer et al. (Apr. 5, 1969) "Optical Pumping of Neon 3P2 Metastable Atoms," *Phys. Rev.* 180(1):83-90.

Stupic et al. (2006) "Quadrupolar Relaxation of Hyperpolarized Krypton-83 as a Probe for Surfaces," *Solid State Nuc. Mag. Reson.* 29:79-84.

Vaara et al. (May 1994) "Computational and Experimental Study of NMR Relaxation of Quadrupolar Noble Gas Nuclei in Organic Solvents," *Mol. Phys.* 82(1):13-27.

Volk et al. (Jan. 1980) "Measurements of the Rb-$^{131}$Xe Spin-Exchange Cross Section in $^{131}$Xe Relaxation Studies," *Phys. Rev. Lett.* 44(3):136-139.

Volk et al. (Dec. 1979) "Spin Dephasing of Kr$^{83}$," *Phys. Rev. A* 20(6):2381-2388.

Walker et al. (1997) "Spin-Exchange Optical Pumping of Noble-Gas Nuclei," *Rev. Mod. Reson.* 69:629-642.

Wu et al. (Sep. 1987) "Coherent Nuclear-Spin Interactions of Adsorbed $^{131}$Xe Gas with Surfaces," *Phys. Rev. Lett.* 59(13):1480-1483.

Wu et al. (Feb. 15, 1988) "Coherent Interactions of the Polarized Nuclear Spins of Gaseous Atoms," *Phys. Rev. A* 37(4):1161-1175.

\* cited by examiner

NUCLEAR ELECTRIC QUADRUPOLAR PROPERTIES OF HYPERPOLARIZED GASES TO PROBE SURFACES AND INTERFACES

CROSS-REFERENCE TO RELATED APPLICATIONS

This application claims the benefit of U.S. Provisional Application No. 60/782,317, filed Mar. 14, 2006, herein incorporated by reference to the extent not inconsistent with the present disclosure.

STATEMENT REGARDING FEDERALLY SPONSORED RESEARCH OR DEVELOPMENT

This invention was made with government support under CHE-0135082 awarded by the National Science Foundation. The government has certain rights in the invention.

BACKGROUND OF THE INVENTION

The present invention is generally related to probing surfaces by spectroscopic and imaging techniques, where the signal being measured is generated by a hyperpolarized gas having a nuclear electric quadrupole moment.

Sensitive, reliable and robust techniques that provide information about a surface are important for a variety of industries. For example, surface probing can provide further understanding of surface chemistry, geometry and physical properties. Such understanding is important in diverse and wide-ranging applications, including materials science, manufacturing and surface patterning processes (ranging from the nano- and micro-size to large scale), drug delivery, and catalysis studies, to name but a few. It can be difficult to obtain useful, reliable and sensitive surface information by surface probing using conventional techniques. In particular, techniques known in the art are generally most useful for a relatively narrow range of situations. For example, optical-based techniques are generally ill-suited for porous surfaces and/or surfaces that are not visually accessible (e.g., located within an opaque medium). Other techniques, such as nuclear magnetic resonance (NMR) spectroscopy or magnetic resonance imaging (MRI) provide an ability to image optically inaccessible surfaces, but often suffer from limitations associated with the compound that is generating a detectable signal such as low signal intensity due to the low number of surface molecules and the inability to distinguish between signal arising from the surface and signal arising from the bulk material.

For example, a promising technique known in the art relies on hyperpolarized (hp) $^3$Helium (He) and hp $^{129}$Xenon (Xe), both having nuclear spin I=½, for use in a number NMR and MRI applications. The high spin polarization obtained through rubidium vapor spin exchange optical pumping (Rb-SEOP) leads to signal enhancements of many orders of magnitude over that obtained from thermal polarization and allows for applications that are otherwise not feasible.

One surface that is generally optically inaccessible, is an in vivo lung. A variety of MRI techniques have been used to image the lung, including lungs from a healthy subject and from a smoker, wherein multiple ventilation defects are observed. One such technique is hp $^3$He MRI. For examples of such images, see Edwin et al. The Proceedings of the American Thoracic Society 2:528-532 (2005) Hyperpolarized 3-Helium Magnetic Resonance Imaging to Probe Lung Function; Brookeman et al. (1998) Polarized Gas Targets and Polarized Beams: Seventh International Workshop, edited by Roy J. Holt and Michael A. Miller (1998) The American Institute of Physics. Polarized Noble Gas MRI; Jurasek (2003) Dynamic MRI Enables Airway Visualization 8(9). One of the fundamental parameters with high diagnostic value for hp $^3$He MRI is the spin density that is a result of the helium concentration in a particular volume. Spin density mapping of hp $^3$He can be applied to visualize ventilation in lungs. For example, a two dimensional fast low angle shot (FLASH) hp $^3$He magnetic resonance image of the lungs of a healthy subject is obtained in a single breath hold after inhalation of about one liter of hp $^3$He gas. The image shows a uniform distribution of the hp $^3$He gas which displays high signal intensity as brighter areas of the magnetic resonance image. Images obtained from the lung of a middle-aged heavy smoker which shows multiple ventilation defects in both lungs. See for example, deLange, Edward et al., "Lung Air Spaces: MR Imaging Evaluation With Hyperpolarized $^3$He Gas", Radiology 210: (3) 851-857 (1999), hereby incorporated by reference. That technique, however, does not provide adequate surface contrast, and suffers from an inability to analyze surface chemistry in detail.

In vivo MRI of airways with hp $^{129}$Xe as a contrast agent suffers from a lower sensitivity compared to hp $^3$He. However, $^{129}$Xe adds a further parameter not available by $^3$He, namely the chemical shift that allows for insights into the local environment of the xenon atoms. The $^{129}$Xe chemical shift has been used extensively for research in materials science, engineering and for xenon dissolved in liquids including human blood. The chemical shift obtained from hp $^{129}$Xe can be used to generate an in vivo MRI contrast that is a probe for exchange of the gaseous xenon with the lung parenchyma. See, Ruppert et al., 'Probing lung physiology with xenon polarization transfer contrast (XTC)', MAGNETIC RESONANCE IN MEDICINE 44 (3): 349-357 SEPTEMBER 2000; and Driehuys et al., 'Imaging alveolar-capillary gas transfer using hyperpolarized Xe-129 MRI', PNAS 103 (48): 18278-18283 Nov. 28, 2006 44 (3): 349-357 SEPTEMBER 2000, hereby incorporated by reference).

$^3$He and $^{129}$Xe are the only spin I=½ stable isotopes of the noble gas group, but there are three more NMR active isotopes in this group with higher nuclear spin (I>½) that possess a nuclear electric quadrupole moment. The three quadrupolar isotopes are $^{21}$Neon (Ne) (I=3/2, natural abundance 0.27%), $^{83}$Krypton (Kr) (I=9/2, natural abundance 11.5%) and $^{131}$Xe (I=3/2, natural abundance 21%). Importantly, these noble gases have quadrupolar interactions capable of causing spin relaxation and coherent spin evolution. The methods disclosed herein rely on these quadrupolar interactions to probe surfaces, thereby characterizing the shape, size and symmetry of void spaces in porous media, for example. Furthermore, such probing by detecting quadrupolar interactions are useful in characterizing the chemical composition of surfaces. Therefore, the information provided by hp $^{21}$Ne, hp $^{83}$Kr, and hp $^{131}$Xe is itself useful, and particularly can be incorporated into conventional hp-noble gas imaging systems to provide information that is highly complementary to that obtained from those hp $^3$He and hp $^{129}$Xe systems. See for example, FIG. 1, which shows thermally polarized liquid $^{131}$Xe used to generate a $T_2$ relaxation weighted MRI contrast in aerogels dependent on the adsorption of water onto the surface (as discussed by Meersmann, T. et al., "Probing Aerogels By Multiple Quantum Filtered $^{131}$Xe NMR Spectroscopy", J. Am. Chem. Soc., 123, 941-945 (2001), hereby specifically incorporated by reference).

Unfortunately there are substantial impediments related to the use of hp $^{21}$Ne, hp $^{83}$Kr, and/or hp $^{131}$Xe in a surface-probe technique. A first problem with using $^{21}$Ne, $^{83}$Kr, or $^{131}$Xe is that low thermal signal intensities make conventional gas phase MRI of these additional quadrupolar noble gases impractical. Moreover, high spin polarization of hp $^{21}$Ne, hp $^{83}$Kr, hp $^{131}$Xe by RbSEOP in previous work results in the presence of alkali metals, thereby prohibiting the use of these noble gases for MRI and NMR spectroscopy of reactive surfaces. Although alkali metal vapor spin exchange optical pumping of noble gas isotopes with quadrupolar nuclei has been explored previously, those studies suffer from the limitation that the paramagnetic and highly reactive alkali metal vapor (e.g., Rb) used in optical pumping (e.g., RbSEOP) is not removed. The removal of the reactive alkali metal from the hp-gas has not been previously attempted because of the additional time such removal process requires. It is unclear whether the generated high spin polarization would survive this removal process. Furthermore, it is unclear that an alkali metal vapor free I>½ noble gas is even useful for the study of, for example, porous media since the relaxation times in porous media are typically much shorter than the relaxation times in the gas phase. Therefore, it is unclear whether the spin polarization is capable of surviving transport into the porous media or sample area.

It is necessary to separate the alkali metal vapor for medical and most materials applications. The major obstacle for the production of Rb-free (or free of other alkali metals that may be used for the pumping process) hp $^{21}$Ne, hp $^{83}$Kr, or hp $^{131}$Xe can be attributed to the nuclear electric quadrupole moment, which significantly shortens the longitudinal relaxation ($T_1$) times. The problem is illustrated by the longitudinal relaxation times of the two NMR active isotopes of the noble gas xenon. $^{129}$Xe (I=½) has a gas-phase $T_1$ time on the order of 2 hours (h) at near ambient pressures and temperatures, but a $T_1$ relaxation time of only 25 seconds (s) has been reported for pure gas phase $^{131}$Xe (I=3/2) at 100 kilopascal (kPa). This relaxation time is further reduced to a $T_1$ of typically only a few seconds for $^{131}$Xe in 8-12 mm diameter glass containers at the same pressure, ambient temperature, and 9.4 Tesla (T) field strength. Relaxation times of only a few seconds are too short in duration in the context of conventional RbSEOP, alkali metal vapor removal, and transfer of the hp gas to a detection cell to be of practical use in NMR and MRI applications.

While the quadrupole moment of $^{83}$Kr (0.26×10$^{-28}$ m$^2$) is about twice that of $^{131}$Xe (0.12×10$^{-28}$ m$^2$), the quadrupole interactions can be smaller for krypton compared to xenon due to krypton's larger nuclear spin, smaller and less polarizable electron cloud, and smaller Sternheimer antishielding factor. The reduced quadrupolar interactions for krypton are reflected in a longer $T_1$ of 470 s that is expected in the absence of container walls at 300 Kelvin (K), 100 kPa, and 2.1 T (18). Even in 10 to 12.5 mm diameter and 4-5 cm long glass cylinders, the $T_1$ times can be 90-150 s at 297 K, 100-200 kPa, and 9.4 T, depending on the glass surface treatment. However, significant signal loss due to krypton container wall interactions currently constrain signal enhancement well below the theoretical limit.

Noble gases with spin I>½ have an additional parameter that is not available with spin=½ noble gas isotopes: the nuclear electric quadrupole moment. The nuclear electric quadrupole moment may provide information about surfaces, but also causes rapid loss of the hyperpolarization (i.e., depolarization). Like in the case of spin=½ noble gas isotopes, alkali metal vapor spin exchange optical pumping may provide increased signal intensity for spin >½ noble gas isotopes. However, the inherently fast self relaxation of these noble gas isotopes lead to the conclusion that the removal of the reactive alkali metal vapor is either not feasible or not worthwhile. Fast self relaxation of these I>½ noble gas isotopes during the purification process or during insertion into a sample area containing surfaces, was considered to be a powerful depolarization process that would leave little signal intensity for NMR detection. The resulting remaining NMR signal was considered to be mediocre at best and not worth the effort. We demonstrate that a strong hyperpolarization in purified (ie. purified from alkali metal vapor) spin I>½ noble gasses is indeed feasible. Building on this success, we use hyperpolarized spin I>½ noble gas isotopes to probe surfaces. The methods disclosed herein are based on probing surfaces with hyperpolarized and purified I>½ noble gas isotopes using quadrupolar interactions during surface contact that allow information to be extracted about the surfaces.

Although there has been interest in spin I=½ hp-noble gasses in material sciences, and in MRI as diagnostic probes for pulmonary diseases (Raftery et al. Phys. Rev. Lett. 66: 584-7 (1991); Goodson J. Magn Reson. 155:157-216 (2002); Moller et al. Mag. Res. Med. 47:1029-51 (2002); U.S. Pat. Nos. 6,818,202, 6,666,047, 6,593,144), those studies suffer from a variety of limitations including the gas being insensitive or incompatible with obtaining information about surface chemistry. Although this sensitivity can be obtained by using I>½ noble gas isotopes, the lack of signal intensity makes the usage of thermally polarized noble gasses unpractical. Previous work reports use of hyperpolarized I>½ noble gasses (Butscher et al., Chem. Phys. Lett., 249 (1996) 444-450; Butscher et al., J. Chem. Phys., 100 (1994) 6923-6933), but the lack of separation from the reactive alkali metal vapor prohibits their use for probing reactive surfaces. In particular, reactive surfaces of interest for surface probing such as lung parenchyma, hydrated surfaces, surfaces having reactive deposits (e.g., from tobacco smoke), react with alkali metal vapor such as rubidium. Prior to the work reported herein, it was unclear whether alkali metal vapor-free hyperpolarized I>½ noble gas isotopes would be effective for imaging reactive surfaces that induce signal loss and whether they could be used for surfaces that may require a time length for exposure to the hyperpolarized gas that is on the order of the time that the hyperpolarized gas relaxes to its non-hyperpolarized state. Indeed, some nano-porous media such as zeolites may exhibit relaxation times that prohibit the usage of hyperpolarized I>½ noble gas isotopes for their study. Furthermore, many of the hp-gasses previously used (e.g., $^3$He and xenon gas) are, unlike krypton, difficult and expensive to obtain (e.g., $^3$He is obtained exclusively through tritium decay from weapons-related programs) or have anesthetic properties in the case of xenon that may cause problems for use in human medical imaging, making its use as biological imaging tool problematic.

From the foregoing, it is apparent that there is a need in the art for a hp-noble gas that provides the capability to measure a number of useful surface properties by NMR and/or MRI that is sensitive and selective, while ensuring the noble gas is generated in a cost-effective manner without having an adverse biological impact and without altering surfaces that are of interest for materials science and related applications. It is further apparent that there is a need for methods that improve information generated from NMR spectroscopy and MRI, so that more accurate and detailed analysis of surfaces, and particularly reactive surfaces, under study is obtained. As will be apparent, the present invention addresses this need by employing a noble gas whose properties are very sensitive to surface interactions.

The herein disclosed methods are based on the availability of hyperpolarized and purified (i.e. alkali metal vapor free) noble gas isotopes with spin I>½. The inventors demonstrate that alkali metal vapor spin exchange optical pumping followed by a separation process is one means for providing hyperpolarized and purified gasses. In addition, a number of alternative techniques may emerge in the future that may permit production of noble gases having spin I>½ without using alkali metal vapor, therefore making the purification process unnecessary. An example of an alternative polarization technique that produces a hyperpolarized state without alkali metal vapor is metastability-exchange pumping for hyperpolarizing $^3$He (Suchanek et al. "Hyperpolarized He-3 gas production by metastability exchange optical pumping for magnetic resonance imaging" OPTICA APPLICATA 35 (2): 263-276 2005; Kauczor et al. "MRI using hyperpolarized noble gases", EUROPEAN RADIOLOGY 8 (5): 820-827 1998). Most likely, that technique may become useful for the hyperpolarization of $^{21}$Ne (INARD M, LEDUC M, "STUDY OF METASTABILITY EXCHANGE IN NEON BY OPTICAL-PUMPING", JOURNAL DE PHYSIQUE 38 (6): 609-622 1977), but the production of hp $^{83}$Kr and hp-$^{131}$Xe may also follow. Another example of an alternative polarization technique is dynamic nuclear polarization (DNP), a method that recently has been used to produce hyperpolarized molecules (Ardenkjaer-Larsen et al. "Increase in signal-to-noise ratio of >10,000 times in liquid-state NMR" PNAS 100 (18): 10158-10163 Sep. 2, 2003). Another alternative polarization technique that is known to produce hyperpolarized noble gasses with the nuclear spin I=½ is the 'brute force technique' (Krjukov EV, O'Neill J D, Owers-Bradley JR, 'Brute force polarization of Xe-129', JOURNAL OF LOW TEMPERATURE PHYSICS 140, 397-408, 2005; Biskup N, Kalechofsky N, Candela D, 'Spin polarization of xenon films at low-temperature induced by He-3', PHYSICA B-CONDENSED MATTER 329, 437-438, 2003). In brute force polarization, a very high polarization at thermal equilibrium at very low temperatures is utilized followed by a rapid warming of the sample. None of those hyperpolarization techniques, however, have been used to date to produce hyperpolarized noble gases having a nuclear electric quadrupole moment that are used in NMR and/or MRI methods for probing a surface.

SUMMARY OF THE INVENTION

The present invention provides a novel and robust method and associated devices for probing surfaces and interfaces with hyperpolarized and purified noble gases having a nuclear electric quadrupole moment. The methods can be used in a wide range of applications, ranging from general materials science studies of non-biological surfaces, manufacturing processes and biological analysis and diagnostics. Potential applications of this technique include water content analysis of solid chemicals, pharmaceutical products, and food materials that otherwise rely on inaccurate or time-consuming methods such as Karl Fischer water titrations that can be complicated by side reactions and reagent instability. In situ hp-$^{83}$Kr MR imaging permits the monitoring and spectroscopy of water distribution on surfaces ranging from porous fuel cell cathodes that require careful engineering of composite hydrophobic and hydrophilic surface sites to allow optimized water transport without flooding, to lung imaging for medical diagnostics.

The methods are particularly useful in probing surfaces that are capable of reacting with an alkali metal that is used to hyperpolarize the noble gas. In an exemplified embodiment, the hp-noble gas is purified by removing alkali metal vapor prior to introducing the gas to the surface. The invention is capable of using any hyperpolarization technique known in the art, including techniques that do not require the presence of alkali metal vapor, such as metastability exchange optical pumping, dynamic nuclear polarization, and brute force techniques (as disclosed herein). Although the methods and devices disclosed herein do not require any particular technique to produce the hyperpolarized state in I>½ noble gas atoms, the method does require that the hyperpolarized noble gas be largely freed from, or completely free of alkali metal vapor. The exemplified embodiment uses Rubidium spin exchange optical pumping. Hyperpolarized noble gas interactions, such as $^{83}$Kr quadrupolar-relaxation, is extremely dependent on surface properties. Accordingly, the methods are capable of obtaining surface property information by detecting or measuring the noble gas interaction with the surface via any number of physical parameters, such as noble gas longitudinal or transverse relaxation, line shifting/broadening, and other parameters known in the art.

In an embodiment, the present invention provides methods of probing a surface. A noble gas having a nuclear electric quadrupole moment is hyperpolarized by any means known in the art, such as by optical pumping in the presence of an alkali metal vapor that is capable of providing high nonequilibrium spin polarization of the noble gas. The alkali metal vapor is optionally selected from the group consisting of lithium-6, lithium-7, sodium-23, potassium-39, cesium-133, rubidium-85 and rubidium-87. Optionally, the alkali metal vapor is rubidium-85, rubidium-87, or a mixture thereof. The particular isotopes are optionally in a naturally-occurring ratio. Prior to introducing the hp-noble gas with a nuclear electric quadrupole moment to the surface, substantially all of the alkali metal vapor(s) is removed from the hyperpolarized noble gas to generate a hyperpolarized noble gas, purified from alkali metal vapor. This step maximizes signal generation and minimizes unwanted chemical reactions with the surface. The hyperpolarized noble gas, purified from alkali metal vapor is introduced to the surface. The introduction is by any means known in the art, including by stopped-flow and continuous-flow systems, so long as at least a significant portion of the introduced gas is capable of physical contact with the surface while remaining in a hyperpolarized state. The hyperpolarization technique can be by any hyperpolarizing methodology known in the art. In an exemplified embodiment, hyperpolarization is by spin exchange with Rb.

The surface is probed by detecting an event that is a nuclear electric quadrupole interaction, wherein the event is generated by surface contact of the introduced purified hyperpolarized noble gas and the detection is by nuclear magnetic resonance spectroscopy or magnetic resonance imaging. The probe information is obtained by recognizing and understanding that hp-noble gas behaves differently when residing entirely in a bulk gas phase compared to the gas in contact with a surface or surfaces. This difference is especially pronounced when the nuclear spin I>½ hp-noble gas resides in the void volume (e.g., the volume defined by one or more surfaces containing gas that has not contacted the surface), where it has a high probability of interacting with the surface after having undergone surface contact. These contact-generated events (or lack thereof) are a basis for surface probing. "Surface contact" refers to surface adsorption, absorption, surface scattering or any other physical contact of the noble gas atoms with the surface. The MR detection of the noble gas typically takes place in the gas phase where information arising from interactions during previous or ongoing brief surface contacts is extracted.

In an embodiment, the method is for probing a reactive surface. In an aspect, the reactive surface is selected from the group consisting of a biological surface, non-biological surface, or both. Reactive surfaces can be difficult to satisfactorily probe with methods known in the art because the alkali vapor gas interacts with the surface, affecting the ability to obtain reliable information about the surface. Examples of reactive surfaces include a surface that is at least partially hydrated. In another aspect, any of the surfaces to-be-probed, including a reactive surface, are exposed to a material or chemical, wherein the exposure occurs at a time that is prior to or simultaneous to the detection step. Some examples of chemicals that are commonly used on surfaces include, but are not limited to, any gas to which the surface is exposed, whether the gas chemically reacts with, or is adsorbed on, the surface. The exposure can also be to an aerosol that may include solid and/or liquid microparticles, any kind of plasma or other liquid to which the surface is exposed. In an aspect, the surface is exposed to cigarette tar. In an aspect, the surface is a human lung (including an in vivo human lung) that has been exposed to cigarette tar. In another aspect, the surface is part of a material that is porous and/or the surface is located within an opaque medium. Some surfaces, such as glass surfaces, will display no or little chemical reaction with the alkali metal vapor. However, the adsorption of alkali metal atoms may either render these surfaces as chemical reactive and/or cause changes in the quadrupolar interactions and hence in the measured parameters compared to the same surfaces without any alkali metal adsorption. Any such surface is hereby defined as 'reactive surface'. Surfaces that are not chemically reactive with the alkali metal but that are contained in a reactive environment (ambient atmosphere, for example) are also defined as a 'reactive surface'.

The method is capable of using any noble gas having a nuclear electric quadrupole moment. In an embodiment, the gas is selected from the group consisting of $^{21}$Ne, $^{83}$Kr, $^{131}$Xe, and any combination thereof. In another aspect, the gas mixture comprises other gases, such as $^{129}$Xe, $^3$He, $N_2$ or any combination thereof. These other gases are useful for providing further control or tunability of the system; varying the amount of these other gases provides an ability to adjust the amount (e.g., partial pressure) of the hp-noble gas that is primarily involved in generating an event that is detected. In addition, multiple components provide additional information that is complementary to the information generated by the hp-noble gas with a quadrupole moment. In an embodiment, any of the methods disclosed herein have a noble gas comprising $^{83}$Kr. In an embodiment, the noble gas is $^{83}$Kr. In an aspect, the hyperpolarized noble gas that probes a surface of interest is itself a gas mixture. In an aspect, the mixture has a first component that comprises a noble gas having a nuclear electric quadruple moment (e.g., one or more of $^{21}$Ne, $^{83}$Kr, $^{131}$Xe) and a second component that is an inert gas. "Inert gas" refers to any non-reactive gas, such as $N_2$ gas that competes with the noble gas for surface adsorption. Accordingly, the inert gas itself can be a noble gas. Such surface adsorption competition is an additional means for providing tunability to the system.

Complementary information to that of hp-$^{83}$Kr surface relaxation data can be obtained from hp-$^{129}$Xe relaxation measurements that are sensitive to the presence of paramagnetic surface sites. In contrast to the signal decay of hp-$^{129}$Xe, the longitudinal relaxation of $^{83}$Kr is largely unaffected by paramagnetic impurities. Complementary information to that of hp-$^{83}$Kr surface relaxation data can be obtained from hp-$^{129}$Xe XTC and/or chemical shift measurement of xenon perfusion that provides information of surface to volume ratios (Ruppert et al. 'Probing lung physiology with xenon polarization transfer contrast (XTC)', MAGNETIC RESONANCE IN MEDICINE 44 (3): 349-357 SEPTEMBER 2000; Driehuys et al. 'Imaging alveolar-capillary gas transfer using hyperpolarized Xe-129 MRI', PNAS 103 (48): 18278-18283 Nov. 28, 2006). Complementary information to that of hp-$^{83}$Kr surface relaxation data can be obtained from hp-$^{129}$Xe and/or hp-$^3$He MRI that provide insight into the ventilation of a lung (See for example, deLange, Edward et al., "Lung Air Spaces: MR Imaging Evaluation With Hyperpolarized $^3$He Gas", Radiology 210: (3) 851-857 (1999), hereby incorporated by reference).

A method of the present invention can measure any one or more of a number of parameters associated with interaction of the purified hp-noble gas with a surface. In an embodiment, the event is quadrupolar driven $T_1$ relaxation, quadrupolar driven $T_2$ relaxation, quadrupolar driven $T_{1\rho}$ relaxation, coherent quadrupolar interactions on the surface that generate quadrupolar splitting of the observed resonance line in the gas phase or a broadening of the resonance line, higher rank tensor elements of coherence and magnetization or any combination thereof.

In a further aspect, the method is capable of being tuned in a manner to generate events that are within a certain user-selected range. For example, tuning capability is provided by altering the noble gas composition, such as the concentration or partial pressure of the noble gas, thereby generating said event having a value falling within a user-selected range. In an aspect, the quadrupolar-driven relaxation is selected to permit probing over a convenient time scale (e.g., on the order of seconds for in vivo lung imaging) or to permit more accurate probing (e.g., on the order of many minutes for ex vivo, in vitro, or materials science manufacturing applications). In general, for example, diluting $^{83}$Kr leads to prolonged relaxation times and lower magnetic field strengths lead to increased $^{83}$Kr relaxation rates. Furthermore, the relaxation time generally increases with a more hydrophilic surface compared to a hydrophobic surface with similar pore dimension. In an aspect, a gas mixture that is 25% Kr, 70% He, and 5% $N_2$ is optically pumped to yield a polarization enhancement that is up to 4500 times that of thermal equilibrium.

In an aspect, the noble gas is a gas mixture having at least two components, with the mixture having $^{83}$Kr gas as one component and tuning is accomplished by altering the concentration or purity of $^{83}$Kr in the mixture, altering the composition or one or more of the other components, or both.

In an aspect, the surface is a biological material, such as a biological material that is lung tissue. Alternatively, the surface is a non-biological material, or a combination of both biological and non-biological. Any of the methods of the invention, including where the surface is a lung tissue, optionally involves generating and displaying an image from the detection step by magnetic resonance imaging or NMR spectroscopy. Any of the methods of the invention, include displaying or otherwise recording the detected events in a tangible medium for analysis.

Any of the methods of the invention are capable of providing a measure of surface shape (e.g., contour), surface chemical composition, surface hydration, surface porosity, surface orientation, surface temperature distribution, adsorption of chemicals onto said surface, absorption of chemicals into said surface, surface grafting, surface wetting, surface electrochemical treatment, surface plasma treatment, surface chemical vapor deposition, or any combination thereof.

In an aspect, any of the methods use a purified hyperpolarized noble gas that is $^{83}$Kr, $^{21}$Ne and/or $^{131}$Xe and the detection of the purified hyperpolarized noble gas is by nuclear magnetic resonance (NMR) spectroscopy, magnetic resonance imaging (MRI), or both. In an exemplified embodiment, any of the methods use a hyperpolarized noble gas that is $^{83}$Kr and the $^{83}$Kr is detected by nuclear magnetic resonance spectroscopy, magnetic resonance imaging, or both, including for a surface that comprises lung or lung tissue. In magnetic resonance imaging, the purified hyperpolarized noble gas is capable of serving as the detected tracer gas and also as the MRI contrast agent that is sensitive to reactive surfaces in contact with the gas.

In an embodiment, any of the event detection is by methods and related detection means known in the art, such as commercially-available NMR and/or MRI machines and associated methods. This includes low field, table top NMR spectrometer or NMR relaxometer and alternative NMR detection methods such as by the use of superconducting interference devices (SQUIDs) or optical magnetometer, etc. For example, the detection step optionally generates an image by FLASH magnetic resonance imaging of the event generated by hp-noble gas and surface interaction, wherein the image is obtained in a time selected from a range of between 10 ms and 10 s. Optionally, oxygen is added to the purified hyperpolarized noble gas prior to, or simultaneously with, introducing the gas to the surface. In another aspect, more than about 99% of the alkali metal vapor is removed, e.g., between 99% and 99.9%, prior to introducing the hyperpolarized noble gas to the surface. In an aspect, the event is surface-induced relaxation of hp-$^{83}$Kr.

DETAILED DESCRIPTION OF THE INVENTION

Figure 1:
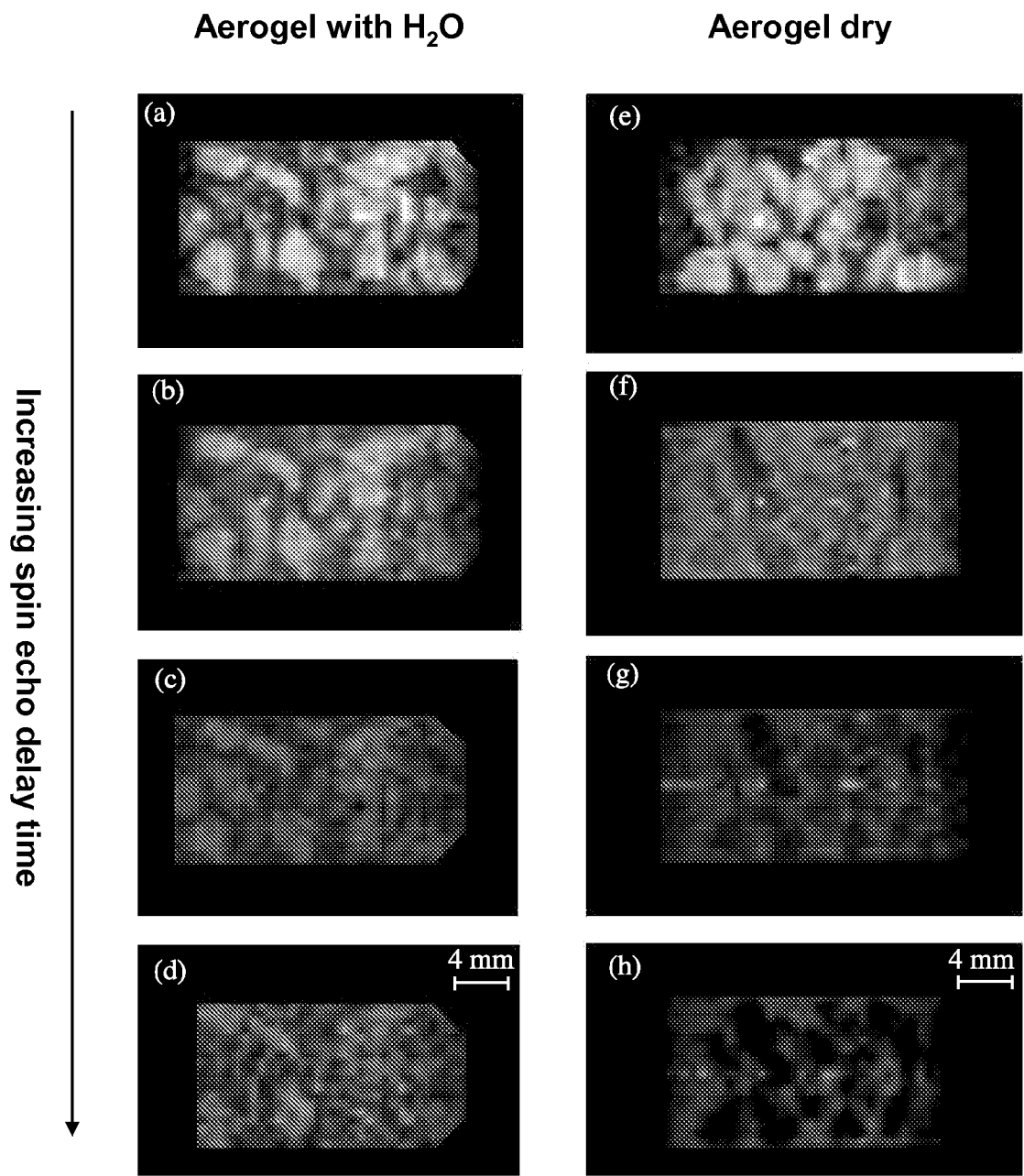
FIGS. 1A-H provides images of thermally polarized liquid $^{131}$Xe used to generate a transverse relaxation weighted MRI contrast in aerogels dependent on the adsorption of water onto the surface.

"Surface" refers to a face of a material that is capable of physical contact with a gas that is introduced to the material. A surface that is capable of reacting with the alkali metal vapor that is used in the optical pumping process for hyperpolarizing the noble gas is referred to as a "reactive surface." Also, a surface that does not itself (chemically) react with the alkali metal but that is rendered reactive by the alkali metal is considered a reactive surface. Furthermore a surface that does not itself (chemically) react with the alkali metal but that is contained in a reactive atmosphere (or environment) is considered a 'reactive surface'. Examples of reactive surfaces include, but are not limited to, at least partially hydrated surfaces, biological tissue, unreactive surfaces that are at least partially covered with a reactive material (e.g., cigarette smoke deposits such as tar). The presence of reactive surfaces makes the NMR detection methods (Butscher, et al., 249 (1996) 444-450; Butscher, et al. J. Chem. Phys., 100 (1994) 6923-6933) ineffective; namely where the nuclear spin evolution of the quadrupolar noble gas is detected indirectly via the alkali metal vapor electron spins. Furthermore, the presence of rubidium may destroy or alter the surfaces chemically. In addition, the presence of alkali metals such as rubidium may change the NMR measured parameters, thus reducing the value of the obtained information.

"Probing" is used broadly to refer to a method and/or a device capable of providing useful information and/or characterization of a surface by interactions (or absence thereof) from the introduced noble gas with the surface. The term encompasses both imaging and/or detecting a physical parameter associated with surface interaction of a hyperpolarized quadrupolar noble gas with the surface being probed. These interactions are evaluated by means that are well known in the art such as nuclear magnetic resonance (NMR) and/or magnetic resonance imaging (MRI) (see, e.g., Rinck et al. (1990) An introduction to Magnetic Resonance in Medicine); Wehrli et al. (1992) Principles of Magnetic Resonance).

"Noble gas" refers to elements in group 18 of the periodic table, and a "quadrupolar noble gas" refers to noble gases that have a nuclear spin I>½, and includes $^{83}$Kr, $^{131}$Xe, and $^{21}$Ne. Spin I greater than ½ ensures these noble gasses possess a nuclear electric quadrupole moment that typically dominates longitudinal (spin-lattice) relaxation. The existence of a nuclear electric quadrupole moment also influences the relaxation, spectral line appearance (i.e. splitting or broadening) or other parameters that can be measured through NMR techniques such as higher rank tensor elements. The quadrupole moment provides imaging and spectroscopic capability that is particularly useful in probing surfaces. The quadrupole moment provides MRI contrast in the gas phase that is sensitive to the surrounding surfaces "Nuclear electric quadrupole moment" specifically refers to those atoms capable of having an interaction between the nuclear electric quadrupole moment of the noble gas (i.e., nucleus) with an electric field gradient that is typically caused by the distortion of the noble gas electron cloud (i.e. the electronic environment surrounding the nucleus). The distortion of the noble gas electron cloud (from spherical symmetry to lower symmetry—or no symmetry) is typically caused by collisions of the noble gas atoms with other gas phase atoms, with surrounding surfaces and in particular during surface adsorption. The methods disclosed herein recognize and rely on the different behavior of a quadrupolar noble gas that interacts with the surface (e.g., adsorbs, absorbs or scatters from) compared to a gas that does not interact (e.g., remains in the bulk gas void space).

One practical constraint on the type of noble gas used in generating information is the relaxation time range (longitudinal—$T_1$; transverse—$T_2$). For example $^{129}$Xe has a $T_1$ of about 3000 s in pure gas phase, and a $T_1$ estimated as long 56 hours at 1 atm (U.S. Pat. No. 5,785,953). For certain applications, those relaxation times are impractical.

Particularly useful noble gases for NMR and MRI applications are hyperpolarized noble gases. "Hyperpolarized"

relates to nuclear spin polarization enhancement of noble gas nuclei having nuclear spin relative to the thermal equilibrium or Boltzmann nuclear spin polarization. Hyperpolarized further refers to orientation of the spins of atomic nuclei or electrons, and involves a magnetic moment. In particular, hyperpolarization refers to high levels of polarization of nuclear spins of noble gases that is achieved by any means as known in the art (see, e.g., U.S. Pat. No. 6,666,047). For example, hyperpolarization of nuclear spins is achieved by optical pumping the noble gas in the presence of alkali metal atoms, such as rubidium or other techniques referenced herein. Hyperpolarized refers to at least a two-fold enhancement or more of the noble gas nuclear spin polarization and/or in the signal intensity arising from the nuclear spins, compared to the thermal equilibrium polarization and/or signal intensity that would be present otherwise (ie. without hyperpolarization) at the temperature and magnetic field strength at which the signal is detected. Hyperpolarization is by any means that provides a polarization level sufficient to provide useful information about a surface by the devices and methods disclosed herein, including by spin exchange with an optically pumped alkali metal vapor, metastability exchange, DNP, brute force or other technique. Useful alkali metals include, but are not limited to, Rubidium.

"Removing substantially all" alkali metal vapor refers to, after the hyperpolarization step, at least 90%, 95%, or 99%, of the alkali metal vapor that was present during the optical pumping procedure in the gas mixture is removed (by mass), thereby ensuring minimal remaining alkali metal vapor is available to degrade signal intensity or hp-gas surface interaction by reacting with the surface and/or noble gas. In an aspect, the invention encompasses any removal amount, so long as the system remains capable of surface probing. Alternatively, as discussed herein, techniques may be employed that allow for hyperpolarization without the presence of alkali metal vapor. Similarly, "substantially free of alkali metal vapor" refers to a hyperpolarized noble gas having less than 1% of the original alkali metal vapor.

"Introducing" refers to application of the hp-noble gas to a to-be-probed surface. In this aspect, the hp-noble gas is capable of contacting at least a portion of the surface. In particular, the introduced hp-noble gas is capable of interacting with the surface, such as by adsorption or absorption, thereby affecting a quadrupolar-driven event, such as relaxation. Accordingly, the hp-noble gas with quadrupolar moment (e.g., $^{83}Kr$) is itself capable of being the contrast agent, providing contrast between hp-noble gas that has interacted with the different surfaces. There are any number of means for introducing the hp-noble gas to a surface, such as by "continuous flow" or "stopped flow", as discussed further herein below.

A "nuclear electric quadrupole interaction" refers to quadrupolar driven $T_1$ relaxation (Pavlovskaya et al. Proc. Natl. Acad. Sci., 102 (2005) 18275-18279; Stupic et al., Solid. State. Nucl. Mag., 29 (2006) 79-84; Cleveland et al., J. Chem. Phys., 124 (2006) 044312; Cleveland et al., J. Am. Chem. Soc., 129 (2007) 1784-1792), quadrupolar driven $T_2$ relaxation (Pavlovskaya et al., J. Magn. Reson., 137 (1999) 258-264), quadrupolar driven $T_{1rho}$ ($T_{1\rho}$) relaxation, coherent quadrupolar interactions on the surface leading to a quadrupolar splitting of the observed resonance line in the gas phase (Meersmann and Haake, Phys. Rev. Lett., 81 (1998) 1211-1214) or leading to a broadening of the line (inhomogeneous broadening) (Horton-Garcia et al., J. Am. Chem. Soc., 127 (2005) 1958-1962). Coherent and relaxation effects may occur at the same time. Furthermore, the effects of nuclear electric quadrupole interactions include the creation of higher rank tensor elements of coherence and magnetization that can be probed for instance by multiple quantum filtered (MQF) NMR spectroscopy and MRI (Meersmann and Haake, Phys. Rev. Lett., 81 (1998) 1211-1214; T. Meersmann et al., Phys. Rev. Lett., 80 (1998) 1398-1401; Meersmann, et al., J. Am. Chem. Soc., 123 (2001) 941-945). The generation of higher rank tensor elements can be caused by coherent processes or relaxation or both (Meersmann and Haake, Phys. Rev. Lett., 81 (1998) 1211-1214; T. Meersmann et al., Phys. Rev. Lett., 80 (1998) 1398-1401; Meersmann, et al., J. Am. Chem. Soc., 123 (2001) 941-945). Each of the references cited herein are specifically incorporated by reference herein for interaction parameters and associated methods for measuring those parameters that arise from quadrupolar nuclear moment interactions. An "event" refers to a "nuclear electric quadrupole interaction" that arises from interaction between the hp-noble gas having a nuclear electric quadrupole moment and the to-be-probed surface, wherein there is a resultant measurable change in the nuclear electric quadrupole interaction. Accordingly, the hp-noble gas having a nuclear electric quadrupole can itself be a contrast agent for providing improved images and measurements.

In an aspect, the present invention provides the capacity to measure any number of surface parameters, depending on the interaction measured. For example, surface hydration affects, among other variables, quadrupolar-driven $T_1$ relaxation and thus measuring $T_1$ provides information about the surface's hydration status. "Hydration" refers to the amount and/or distribution of water bound to the surface. "Wetting" refers to the amount of surface coverage by a liquid (such as water), and provides an indication of a material's hydrophobicity/hydrophilicity as well as mapping surface regions that are hydrophobic or hydrophilic. In addition, the methods and devices disclosed herein are amenable to simultaneous multiparameter measurement by using multiple hp-noble gases, each having unique surface interaction capabilities.

In an aspect, the invention is useful for probing surfaces of porous materials. "Porous" refers to a material having a porosity, such as a porosity of greater than 10%, 25%, or 40%, with an average pore size ranging from on the order of nanometers to centimeters. The material can be "biological" or "non-biological" and can comprise a granular media. Biological refers to a material that is part of, or isolated from, a human, animal, plant, or other organism and includes in vivo, ex vivo or in vitro systems, so long as the material is at least partially comprises of cellular or other biological tissue or tissue components. Non-biological material broadly refers to man-made manufactured material such as materials whose surface properties are important, including components used in semi-conductors, integrated circuits, grafts, biological implants, batteries (e.g., cathode surfaces), membranes, fuel cell membranes, column separation media, etc. The methods and devices disclosed herein, are particularly useful in quality control and system process evaluation to ensure materials used in a manufacturing process meet specification, thereby avoiding wasteful manufacturing and minimizing cost. Non-biological material also broadly refers to natural occurring nonliving materials (whether originally biological in nature or not) such as sand stones and other porous rocks, oil slate, coal, fossils, sediments, minerals, ores, etc "Tuning" refers to the capacity to tailor a process disclosed herein to generate quadrupolar-generated interactions to fall within a certain range of interest. For example, to facilitate in vivo lung imaging, quadrupolar-driven relaxation times preferably fall within a range that falls within the minimum time required for the hp-gas to be transported to the lung tissue and the maximum time a patient can realistically be expected to hold their breathe.

The methods and devices presented herein are particularly useful in providing a measure of information related to surfaces. The information can relate to surface-to-volume ratio, surface shape, surface orientation with respect to the magnetic field, surface chemical composition, surface hydration (i.e., molecular adsorption of liquid), surface porosity, surface temperature distribution, adsorption of chemicals onto said surface, absorption of chemicals into said surface, surface grafting, surface wetting (wherein at least a portion of the surface is covered by a liquid film or layer), surface electrochemical treatment, surface plasma treatment such as plasma-assisted chemical vapor deposition on surfaces, plasma-altered surfaces, or any combination thereof. Each of these surface parameters, depending on the material and surface being studied, can provide useful information about the surface. For example, in lung, an important parameter is the surface-to-volume ratio, as the ability to provide adequate oxygen levels to the body depends on the lung surface area and, therefore, the status of lung surfactant in the alveoli, for example. In acute lung injury and some other pulmonary diseases, alveolar volume (and therefore overall lung surface area) is decreased and at least partially collapsed, so that surface-to-volume ratio increases. Alternatively, in chronic disorders such as emphysema, the surface to volume ratio decreases due to expanded alveolar dimensions "Chemical composition" is used broadly, and refers to changes in the surface as reflected by effective pH, ionic strength, adsorbed water and other chemicals, chemical concentration, or covalent alteration of the molecules comprising the surface. In an aspect, the information provided includes a spatial and/or temporal distribution of the information of interest.

All references cited throughout this application, for example patent documents including issued or granted patents or equivalents; patent application publications; and non-patent literature documents or other source material are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

Every formulation or combination of components described or exemplified herein can be used to practice the invention, unless otherwise stated.

Whenever a range is given in the specification, for example, a temperature range, a size range, a percent range, a conductivity range, a time range, or a composition or concentration range, all intermediate ranges and subranges, as well as all individual values included in the ranges given are intended to be included in the disclosure. It will be understood that any subranges or individual values in a range or subrange that are included in the description herein can be excluded from the claims herein.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element or elements, limitation or limitations which is not specifically disclosed herein.

One of ordinary skill in the art will appreciate that starting materials, materials, reagents, synthetic methods, purification methods, analytical methods, assay methods, and methods other than those specifically exemplified can be employed in the practice of the invention without resort to undue experimentation. All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

Example 1

NMR Spectroscopy of Hyperpolarized $^{83}$Kr

The methods and devices disclosed herein generally relate to surface probing using a hyperpolarized hp I>½ isotope gas, wherein the probing provides information useful in characterizing surfaces and interfaces.

Figure 2:
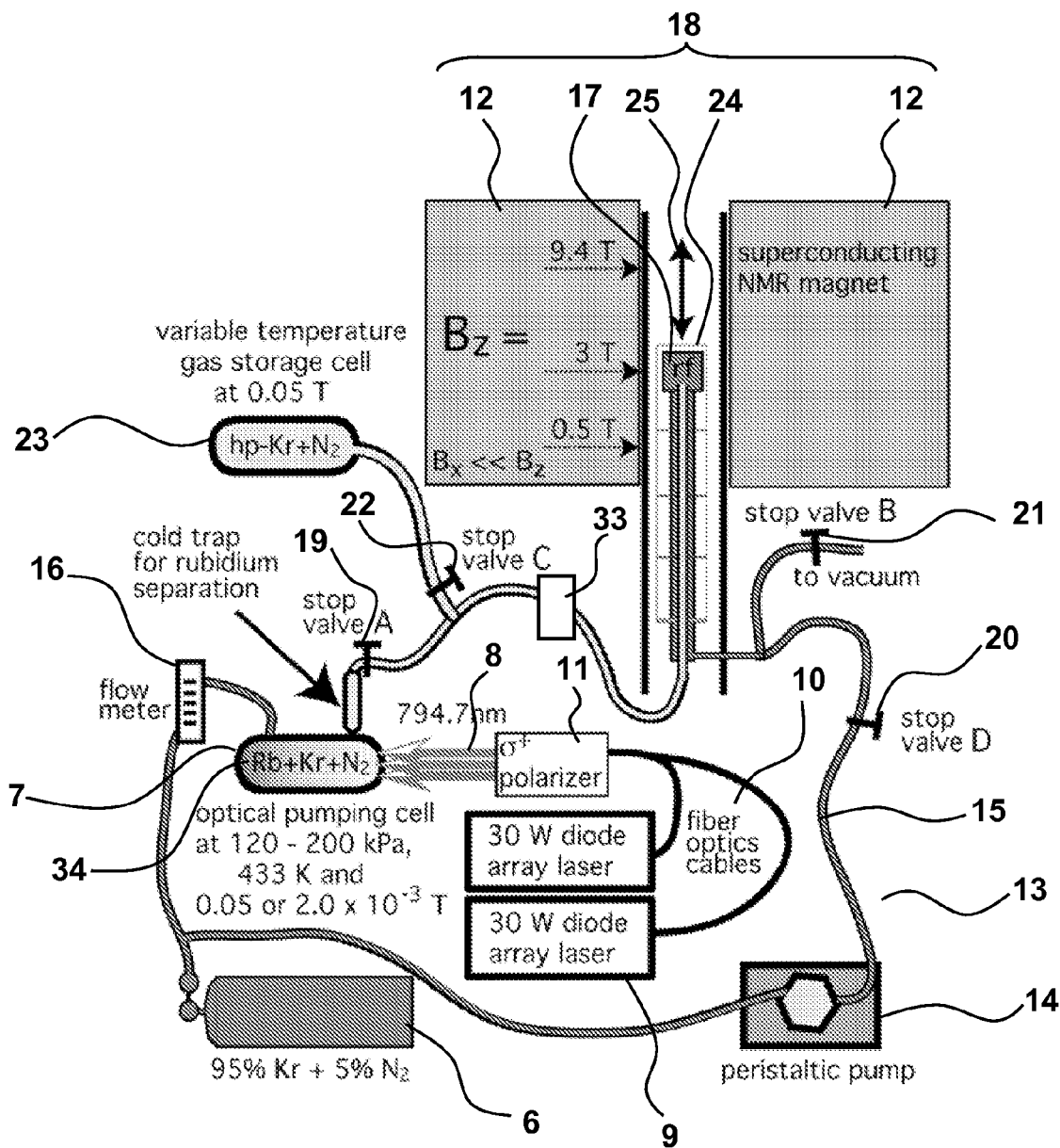
FIG. 2 provides a diagram of an apparatus which can be used for the production of alkali vapor free hp noble gas such as hp $^{83}$Kr.
Figure 18:
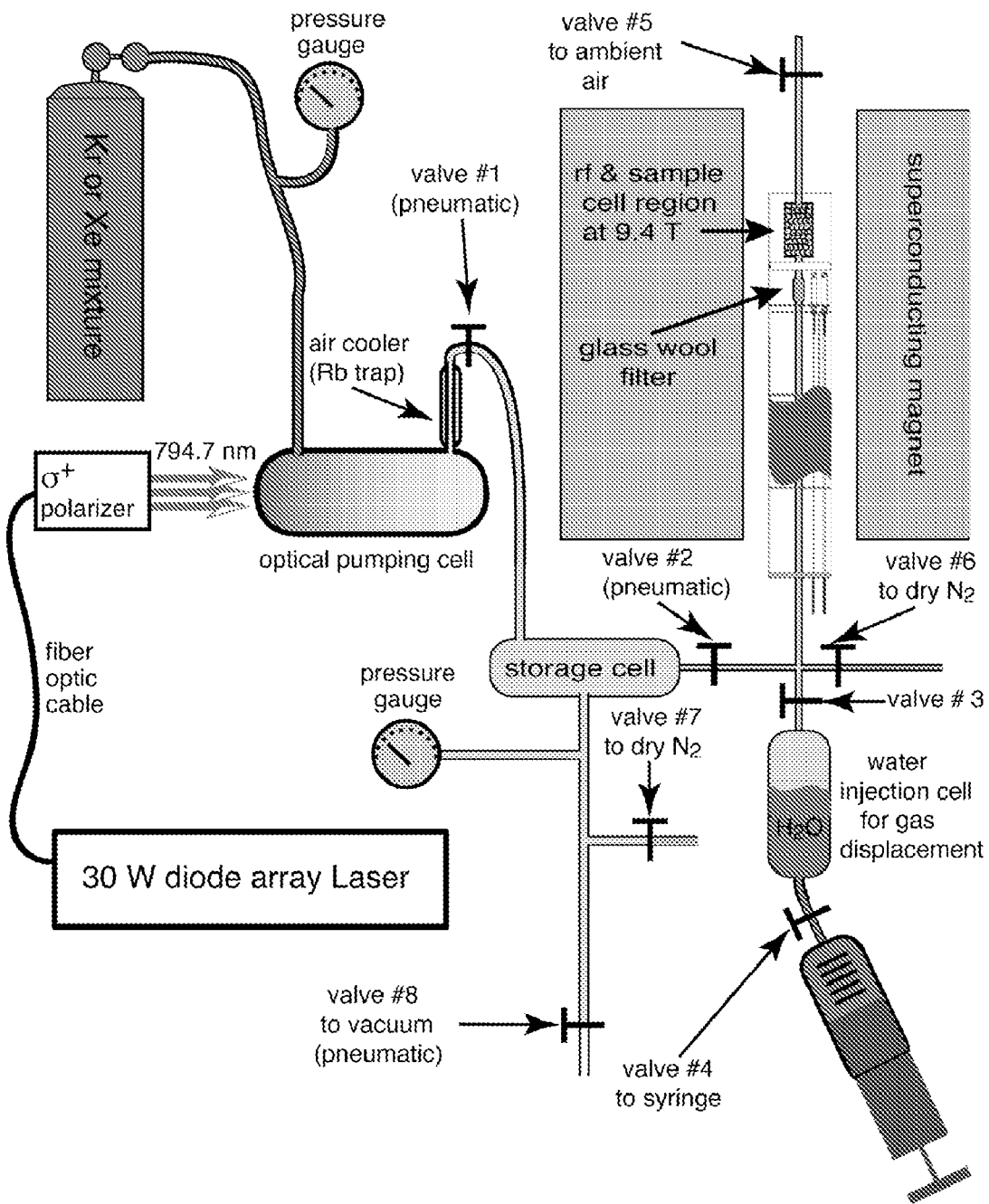
FIG. 18 provides a schematic of an experimental set-up for injection delivery of hp-gasses. Following polarization in the optical pumping cell, hp-gas is transferred by pressure equalization to the storage cell (Valve 1 is open; valves 2, 7, and 8 are closed). Next, hp-gas is transferred to the injection cell by displacing distilled water into the syringe (Valves 2, 3, and 4 are open; valves 1, 5, 6, 7, and 8 are closed). Finally, the hp-gas is injected into the detection region by forcing the distilled water into the injection cell (Valves 3, 4, and 5 are open; valves 2 and 6 are closed). During signal acquisition, valves 2, 3, 5, and 6 are closed to ensure constant pressure in the detection region and prevent contamination by atmospheric $O_2$.

Now referring primarily to FIGS. 2 and 18, a high (noble gas) density optical pumping apparatus is used to hyperpolarize $^{21}$Ne, $^{83}$Kr, or $^{131}$Xe or other noble gases to overcome the problem of loss of spin polarization during the period of time required to remove alkali metal vapor from the gas mixture (see also, Cleveland et al. "Exploring Hyperpolarized $^{83}$Kr by Remotely Detected NMR Relaxometry", J. of Chem. Phys. 124, 044312 (2006); Pavlovskaya et al., "Hyperpolarized Krypton-83 As A Contrast Agent For Magnetic Resonance Imaging", Proc. Nat. Acad. of Sci. 102:51 18275-18279 (2005), each specifically incorporated by reference herein for methods and devices related to NMR and MRI using hp-$^{83}$Kr).

As but one example, the optical pumping of $^{83}$Kr gas (or other noble gases such as $^{21}$e can be $^{131}$Xe) is achieved using a research grade krypton gas (or other noble gas) having a purity of about 99.995%. Suitable research grade krypton gas is provided in cylinders from various commercial suppliers such as Airgas, Radnor, Pa. The research grade krypton gas (natural abundance 11.5% $^{83}$Kr) is mixed with $N_2$ to provide a Kr—$N_2$ gas mixture (95%-5%) (6) (the $N_2$ provides radiation quenching). FIG. 2 shows the Kr—$N_2$ gas mixture (6) is transferred to a pump cell (7) which is optionally housed in an oven (not shown) to maintain constant temperature. In an embodiment using Kr gas, a suitable temperature is about 433 Kelvin (K). A particular embodiment of the pump cell (7) is configured as a cylindrical PYREX® cell having a length of about 125 mm with an internal diameter of about 24 mm. Between about 2.5 grams (g) to about 5.0 g of Rb (34) having a purity of about 99.6% (as supplied by Sigma-Aldrich, Milwaukee, Wis.) is placed within the pump cell (7). Light (8) having a wavelength of about 794.7 nm is generated by any means known in the art, such as a 30 W, a pair of 30 W, or a 60 W diode-array laser (9). Suitable diode array lasers (9) are obtained from Coherent, Inc., 5100 Patrick Henry Drive, Santa Clara, Calif. 95054. A fiber optics cable (10) is coupled to the diode array laser (9) as a conduit to deliver the generated light (8) to a circular polarizer (11). A fiber optics cable (10) is obtained from Coherent, Inc. Laser light having a line width of about 2 nanometers (nm) is directed through the circular polarizer (11) onto the pumping cell (7). A magnetic field sufficient to achieve optical pumping is generated by two Helmholtz coils ($2.0 \times 10^{-3}$ T) (not shown) or alternately is generated by the fringe field of the superconducting magnet (0.05 T). The hp Kr—$N_2$ gas mixture is accumulated and stored in a variable temperature hp gas storage cell (23) at about 0.05T. During transfer the hp Kr—$N_2$ gas mixture passes through a water-cooled glass wool filter (33) (about 289 K) to trap rubidium vapor.

A continuous-flow of hp $^{83}$Kr is achieved by recirculating the Kr—$N_2$ gas mixture (6) through the pump cell (7) in a closed loop (13) as shown by FIG. 2. Recirculation of the Kr—$N_2$ gas mixture (6) in the closed loop (13) is accomplished using a gas recirculation generator (14) such as a peristaltic pump. Any suitable peristaltic pump is used, such as a Watson-Marlow Bredel. A suitable gas transfer conduit (15) for the closed loop (13) is perfluoroalkoxy polymer ("PFA") tube having an internal diameter of about 1.65 millimeters (mm). The gas flow recirculation in the closed loop (13) is monitored with a flow meter (16) such as a Gilmont direct-reading flow meter with flow values converted depending upon the gas mixture applied to the flow meter.

Importantly, to achieve a continuous flow of hp $^{83}$Kr within the closed loop (or at NMR or MRI detection), the flow-rate of the Kr—$N_2$ gas mixture through the pump cell (7) is selected according to the relaxation time of the gas mixture. For example, generally higher flow-rates are selected hp $^{83}$Kr-containing gas than for hp $^{129}$Xe-containing gas. With the embodiment of the pump cell (7) above-described, a gas flow of between about 1.5 and about 2.8 mL/s at a temperature of 433 K is used while a gas flow of between about 1.0 mL/s and about 1.5 mL/s at 395 K is used with $^{129}$Xe. The higher flow rates at least partially offset relaxation in the transfer conduit (15) between the pump cell (7) and the detection cell (17) in the high field region of the superconducting magnet (18). A suitable detection cell (17) can have a cylindrical configuration with a internal diameter of 12.5 mm. Again, referring primarily to FIG. 2, in a continuous-flow mode valve A (19) and valve D (20) are permanently open and valve B (21) and valve C (22) are permanently closed and the peristaltic pump (14) (or other gas mixture recirculation means) is operating.

Figure 3A:
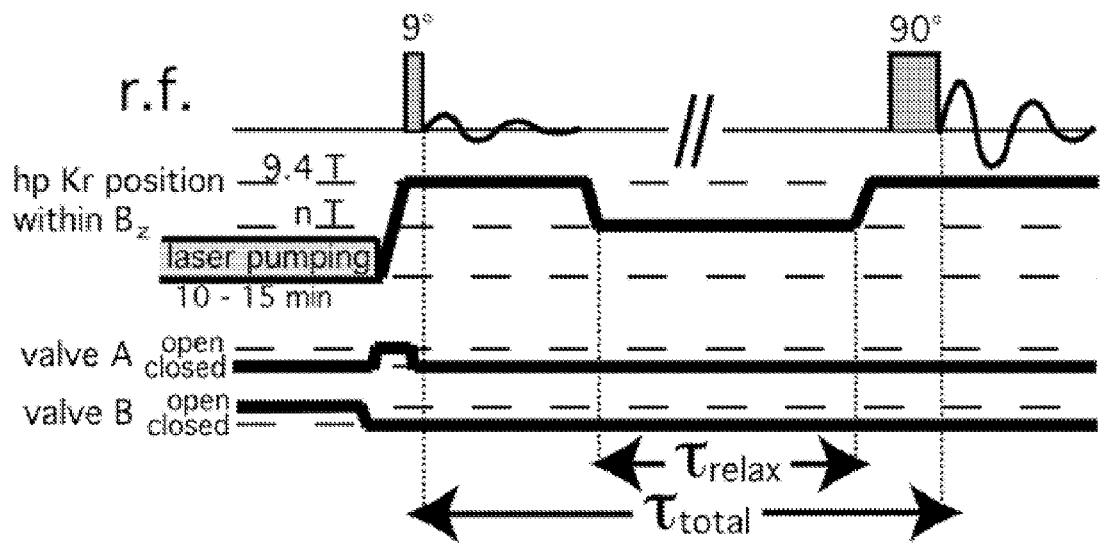
FIG. 3A provides a diagram of the stopped-flow method used to perform remotely detected relaxometry with movable probe head.
Figure 3B:
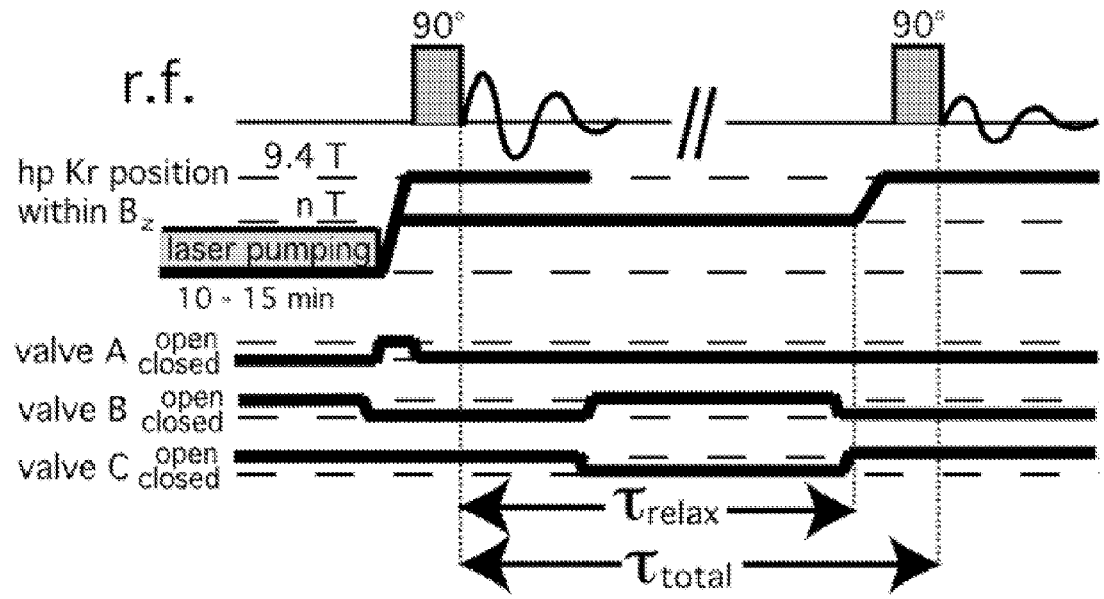
FIG. 3B provides a diagram of the stopped-flow optical pumping method used to perform remotely detected relaxometry with a gas storage cell and with the probe head held static at 9.4T.

The system is capable of stopped-flow surface probing. "Stopped flow" refers to a process wherein noble gas polarization is permitted to build for a selected time period. "Continuous flow", in contrast, refers to methods wherein noble gas is continuously flowing through the system during polarization such that a continuous baseline polarization is provided. A stopped-flow of hp $^{83}$Kr (or other noble gas) is achieved, for example, by allowing the krypton-83 polarization to build for a period of minutes in the pump cell (7). During the polarization period the detection cell (7) can be evacuated to less than 0.1 kPa. Following polarization buildup, the hp $^{83}$Kr can be rapidly transferred from the pump cell (7) to the detection cell (17) of a probe head (24) in the superconducting magnet (18) by pressure equalization. Whether in the continuous-flow mode, or in stopped-flow mode, contamination of the hp $^{83}$Kr is minimized or avoided by maintaining the pressure of the Kr—$N_2$ gas mixture (6) in the transfer conduit (15) above ambient pressure (100-200 kPa). As shown by FIG. 3A, in the stopped-flow mode valve D is permanently closed and valve B is open during evacuation but closed during gas transfer and radiofrequency (r.f.) pulses. The probe head (24) can be moved (25) within the magnetic field to obtain field dependent $T_1$ times. As shown by FIG. 3B, the probe head (24) can be held static at 9.4 T with use of the hp gas storage cell (23) at 0.05T.

Whether in continuous-flow mode or stopped-flow mode, successful probing results are obtained using an NMR spectrometer (not shown in FIG. 2) such as a Chemagnetics CMX II 400 MHz NMR spectrometer in a 9.4 T wide-bore (89 mm) superconducting magnet. In all experiments, the NMR spectrum is obtained using a custom-built flow probe tuned to the $^{83}$Kr frequency of 15.4 megahertz (MHz) at 9.4 T. The magnet can be further equipped with an imaging system consisting of triple axis gradient coils (100 G/cm x,y axes and 720 G/cm z axis) with low noise gradient amplifiers. A suitable imaging system can be obtained from Resonance Research, Billerica, Mass.

Figure 4:
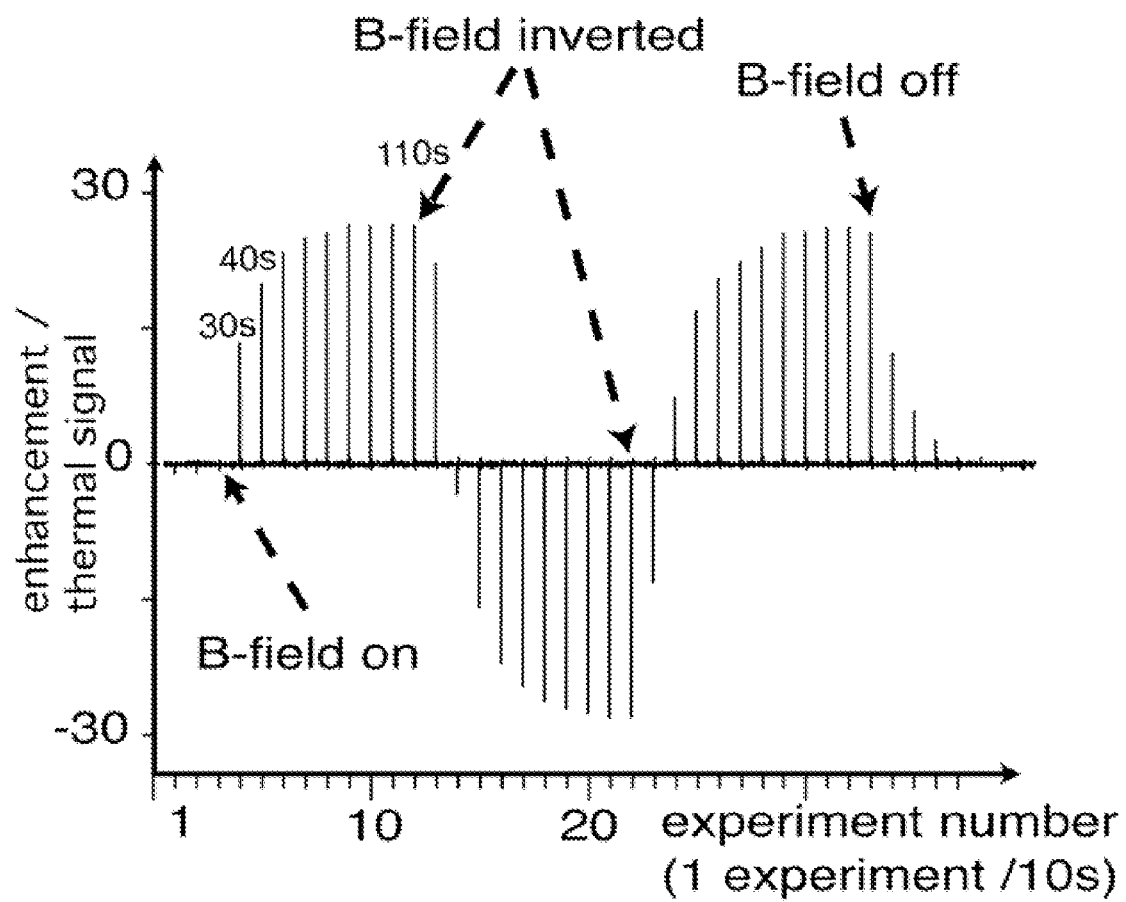
FIG. 4 provides a graph of a hp $^{83}$Kr NMR spectrum recorded under continuous flow optical pumping conditions.

Now referring to FIG. 4, a hp $^{83}$Kr NMR spectrum from the first successful enhancement of a $^{83}$Kr signal by spin exchange optical pumping in the continuous-flow mode. A 27-fold signal enhancement compared to thermally polarized $^{83}$Kr at ambient pressure, room temperature, and 9.4 T is obtained. Laser intensity, pump cell temperature, and gas flow are held constant while the magnetic field generated by a Helmholtz coil pair (not shown in FIG. 2) is varied. As expected, non-equilibrium $^{83}$Kr spin polarization can only be generated in the presence of a magnetic field and inverts when the field is inverted. The NMR detection of processes can be delayed by the duration of gas transport into the detection cell.

Figure 5:
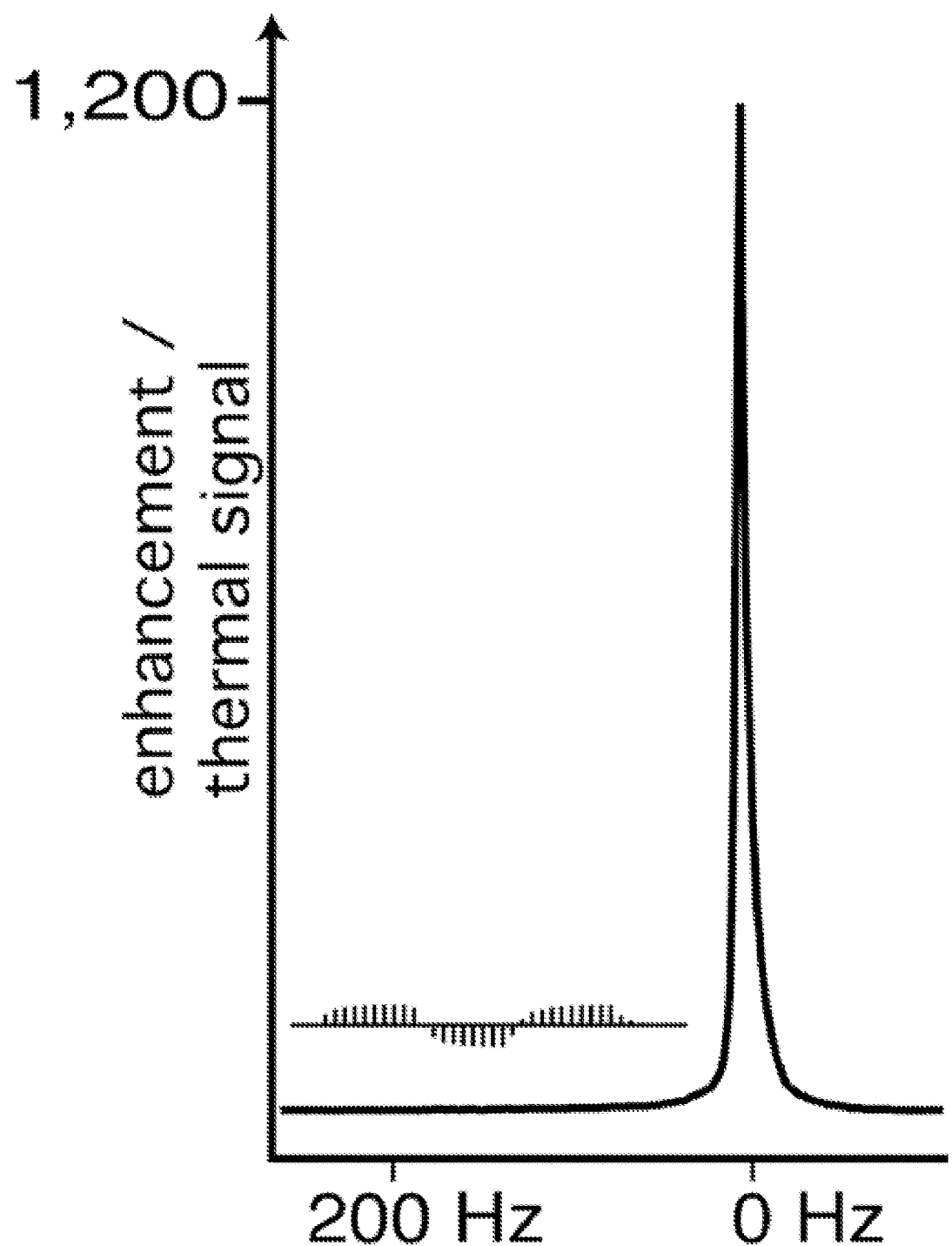
FIG. 5 provides a graph of a hp $^{83}$Kr signal obtained by stopped-flow optical pumping. Spectra from FIG. 4 are inset for comparison FIG. 6 provides a graph which shows enhancement of hp $^{83}$Kr over a thermal signal as a function of polarization time at two different laser powers (30 W open circles and 60 W open squares).

Now referring to FIG. 5, an hp $^{83}$Kr signal obtained from the stopped-flow mode shows signal enhancements that are 1200 times greater than the thermal signal at 9.4 T and 297 K. Following a RbSEOP period of many minutes, the hp $^{83}$Kr is rapidly shuttled into the pre-evacuated detection cell (17) by pressure equalization. Long RbSEOP times may be required for $^{83}$Kr optical pumping, because the relevant cross sections for the rubidium-krypton system are about two order of magnitude smaller than those in the rubidium-xenon system. The 40-fold improvement in stopped-flow experiments over that observed in continuous-flow experiments (shown as the inset spectra in the FIG. 5) results from both increased pumping times and reduced polarization losses during transfer between the optical pumping and detection cells.

Figure 6:
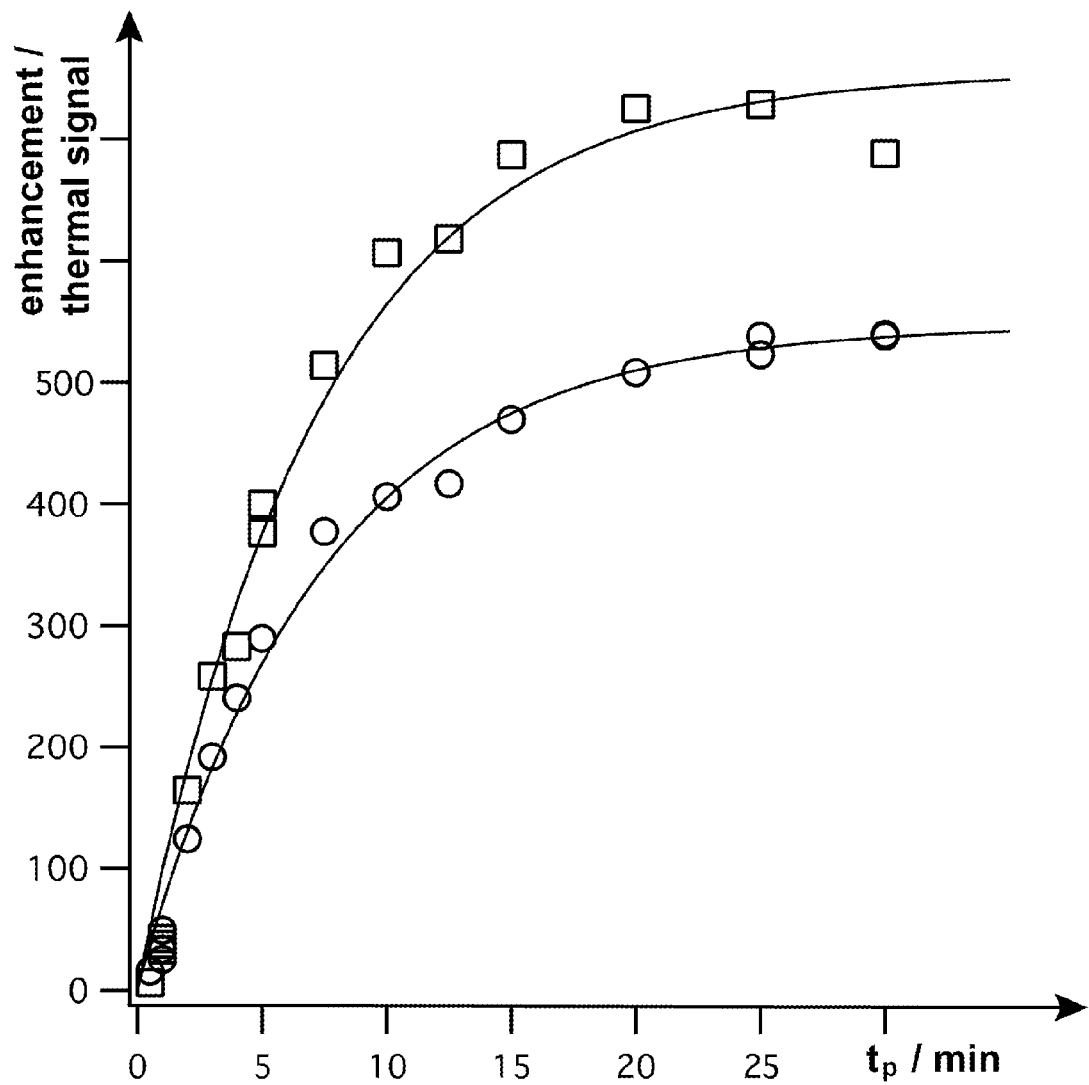

Now referring to FIG. 6, the pumping time dependence of the hp $^{83}$Kr signal enhancement (a direct function of polarization) is shown for two different laser powers (30 and 60 W) stopped-flow mode. The pump cell (7) is maintained at 433 K under constant laser illumination with no magnetic field present (other than the stray field from the superconducting magnet) to obtain consistent initial thermal conditions with little or no spin polarization present. The magnetic field is turned on for an optical pumping period, $t_p$, after which the hp $^{83}$Kr is shuttled into the NMR detection cell.

The dependence of the $^{83}$Kr polarization P(Kr) upon $t_p$ is described by (Dreihuys et al., Appl. Phys. Lett. 69, 1668 (1996)):

$$P(Kr) = \frac{\gamma_{se}}{\gamma_{se} + |\Gamma|} \cdot \frac{\gamma_{op}(z)}{\gamma_{op}(z) + \sum_i \kappa_{sd}^i [M_i]} (1 - e^{-(\gamma_{se} + \Gamma)t_p}). \quad (1)$$

The $^{83}$Kr self-relaxation rate, $\Gamma$, is caused primarily by quadrupolar interactions during collisions with pump cell walls or other gas phase atoms and cannot be treated as negligible as is the case for $^{129}$Xe optical pumping. The Rb—Kr spin exchange rate, $\gamma_{se}$, in high krypton density experiments is caused primarily by Rb—$^{83}$Kr binary collision. Note that $\gamma_{se}$ is positive during optical pumping while $\Gamma$ is negative. The $^{83}$Kr quadrupolar self-relaxation thus limits the overall polarization produced during optical pumping and slows the buildup rate. The destruction of Rb spin polarization by collisions with inert gas atoms is described by the sum of the products of the rate constants, $\kappa_{sd}^i$, with their corresponding gas atom number densities $[M_i]$. The optical pumping rate per Rb atom, $\gamma_{op}(z)$, depends on position in the pump cell, z, due to reduced laser intensity along the optically thick beam path. Because the polarization is performed in a pump cell (7) with fixed dimensions, identical gas mixtures, and constant temperature, all terms except $\gamma_{op}(z)$, which also depends on applied laser power, are assumed constant. The obtained signal enhancements as a function of $t_p$ are fitted to Equation 1 and yield pre-exponential factors (the maximum hp $^{83}$Kr intensities obtained at infinitely long pumping times) that differ by about 40% for the two laser powers. However, virtually identical exponential terms ($\gamma_{se}+\Gamma$) of (2.2±0.1)× 10-3 s$^{-1}$ for 30 W and (2.3±0.2)×10$^{-3}$ s$^{-1}$ for 60 W data are obtained. The highest signal enhancement is about half of that shown in FIG. 5 because a longer gas flow conduit of PFA tube is utilized. Though the PFA transfer tubing's high internal surface to volume ratio (i.d.=1.65 mm) favors quadrupolar relaxation, previous measurements at 9.4 T in materials with similar surface compositions and larger surface to volume ratios suggest that $T_1$ times of tens of seconds are predicted in the tubing. This relaxation is too slow to cause the depolarization observed during the 10 s or less needed for gas transfer under continuous-flow conditions. However, little was previously known about $^{83}$Kr quadrupolar $T_1$ relaxation on surfaces in low magnetic fields, and a significant portion of the transfer tubing and the pump cell itself are in low field regions.

FIG. 3A displays a method used in NMR experiments that probe $^{83}$Kr relaxation at a variety of field strengths. After optical pumping, hp $^{83}$Kr is shuttled into the 12.5 mm i.d. Pyrex type detection cell at 9.4 T. Signal from a small flip angle reference pulse, which destroys a negligible amount of the non-equilibrium spin polarization, is acquired to correct for fluctuations in optical pumping efficiency. The detection cell can then be physically moved into a position at known field strength for a period, $\tau_{relax}$, before returning it to the 9.4 T region where signal is acquired from a final 90° pulse.

Figure 7:
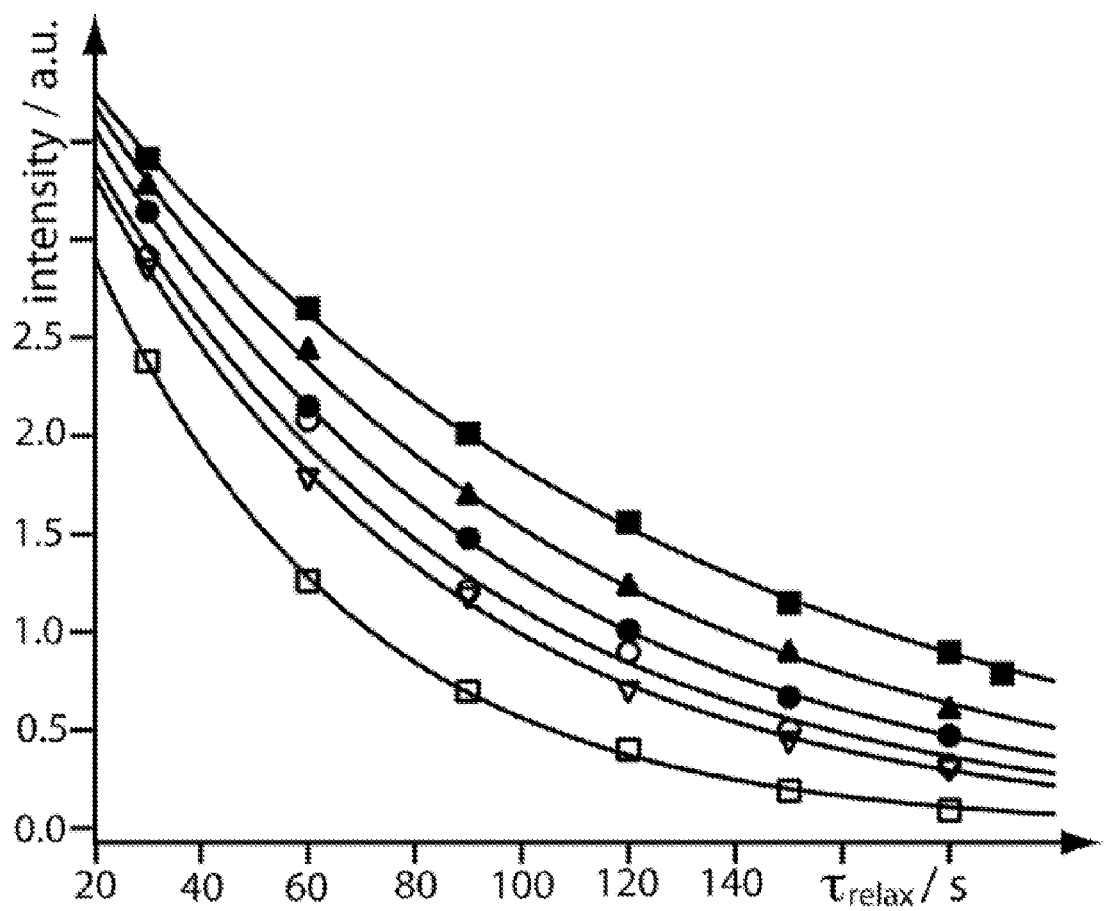
FIG. 7 provides a graph that shows longitudinal relaxation decay curves at six different magnetic field strengths (3.0T closed squares, 1.5T closed triangles, 1.0T closed circles, 0.5T open circles, 0.25T open triangles, and 0.15T open squares).
Figure 8:
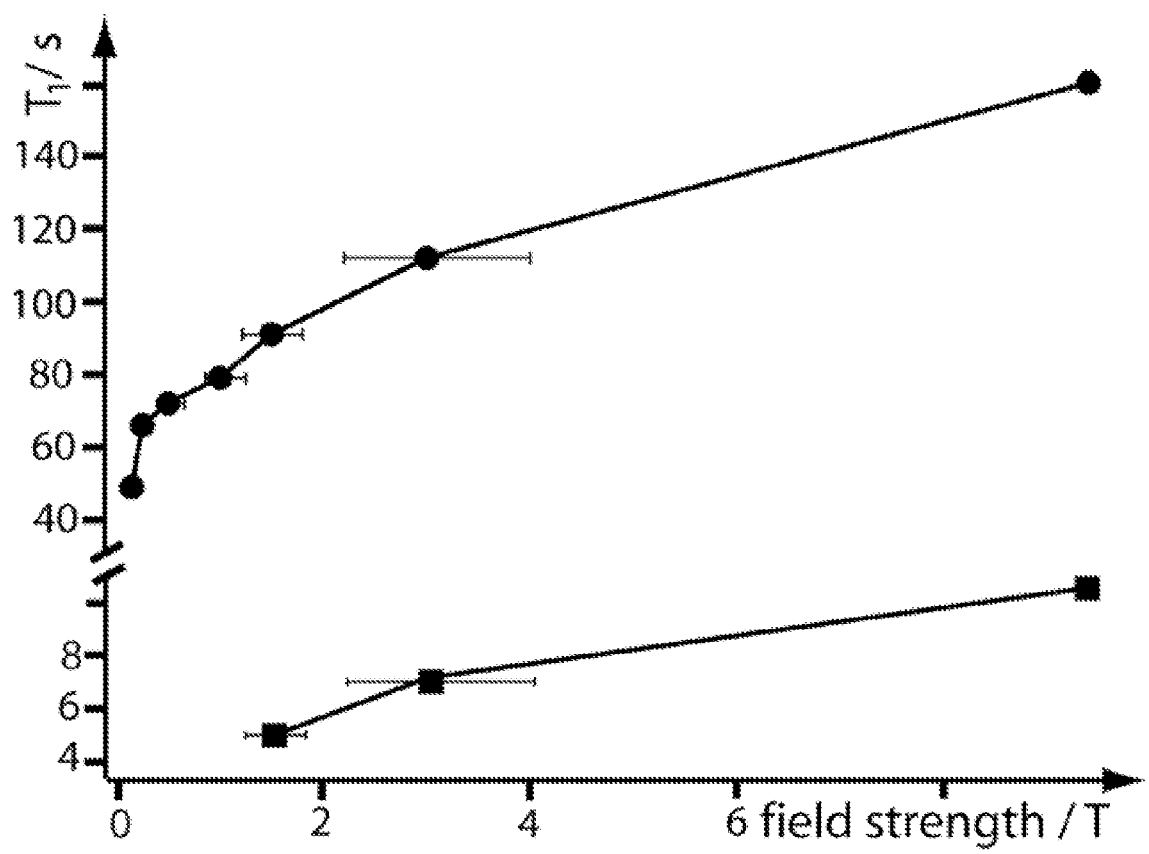
FIG. 8 provides a graph that shows $T_1$ as a function of field strength in the gas phase (closed circles) and desiccated canine lung tissue (closed squares).

FIG. 7 displays the hp $^{83}$Kr signal intensity as a function of $\tau_{relax}$ at various field strengths. The corresponding $T_1$ times obtained from mono-exponential fitting of these decay curves are summarized in FIG. 8. The longitudinal relaxation times decrease by a factor of 2.3 if the field is lowered from 9.4 T to 0.15 T, which is the lowest field strength that is currently studied using the method shown in FIG. 3A. Using standard expressions for quadrupolar relaxation, the relaxation of hp $^{83}$Kr is expected to become magnetic field independent at lower field strengths because the rapid narrowing condition is likely to be fulfilled, i.e. $\tau_{cs}\omega_0 \ll 1$, where $\omega_0$ is the Larmor frequency and $\tau_{cs}$ is the interaction correlation time (i.e. the mean $^{83}$Kr surface adsorption time). If this condition were violated ($\tau_{cs}\omega_0 \approx 1$), higher rank tensor elements or non-Boltzmann population distributions of the magnetization will be created, and the observed relaxation will no longer be mono-exponential. No evidence for multi-exponential $^{83}$Kr $T_1$ relaxation in glass containers at 297 K and high field strengths is found that would explain the observed field dependence in FIGS. 7 and 8. However, an underlying assumption in relevant Redfield relaxation theory is that the interactions are small perturbations compared to the Zeeman Hamiltonian. The quadrupolar coupling of $^{83}$Kr previously found on Duran glass surfaces is 5.6 MHz 21, and the $^{83}$Kr Larmor frequency is 1.64 MHz/T [Butscher et al., Chem. Phys. Lett. 249, 444 (1996)].

A different potential source of the observed $T_1$ field dependence is relaxation caused by diffusion through inhomogeneous magnetic fields. However, as shown below, this source for hp 83Kr relaxation is negligible. The relaxation rate experienced by hp gasses in the presence of field in homogeneities is given by [L. D. Schearer and G. K. Walters, Phys. Rev. 139, 1398 (1965); Cates et al., Phys. Rev. A 37, 2877 (1988)]:

$$\frac{1}{T_1} = D \cdot \frac{|\vec{\nabla}B_x|^2 + |\vec{\nabla}B_y|^2}{B_z^2} \cdot \frac{1}{1 + \omega_0^2 \tau_{cg}^2}, \quad (2)$$

where D is the krypton gas diffusion constant, $B_z$ is the static magnetic field strength, $|\vec{\nabla}B_x|$ and $|\vec{\nabla}B_y|$ are the spatial gradients of the x and y components of the magnetic field respectively, and $\tau_{cg}$ is the time between gas-phase collisions. The expression $(1+\omega_0^2 \tau_{cg}^2)^{-1}$ is negligible, because $\omega_0 \tau_{cg} \ll 1$ (see similar discussion above). Although the field gradient $\vec{\nabla}B_z$ in the stray field of a superconducting magnet is known to be large, the maximum $|\vec{\nabla}B_x|$ and $|\vec{\nabla}B_y|$ gradients examined in this study are found at the lowest magnetic field strength ($B_z$=0.15 T) and are determined to be far less than 0.01 T/cm. Therefore the $^{83}$Kr diffusion in the magnetic field gradient results in spin-lattice relaxation times on the order of hundreds of seconds and should not compete with the substantially faster quadrupolar relaxation found in the investigated systems.

Figure 9:
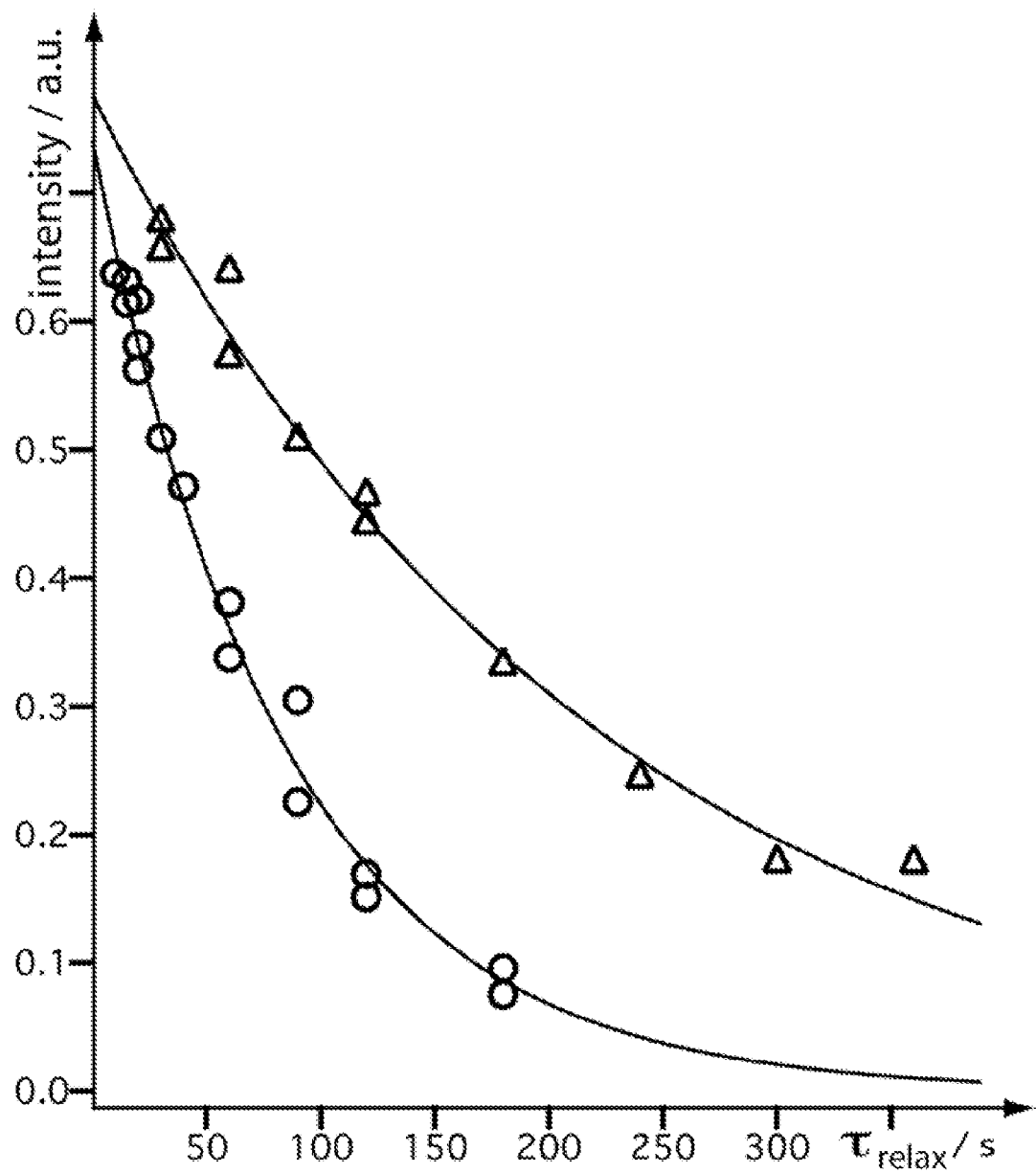
FIG. 9 provides a graph of relaxation decay curves at 0.05T obtained using the procedure shown by FIG. 3B at two different storage cell temperatures (297K open circles and 433K open triangles).

Temperature dependence of longitudinal relaxation investigated by remote detection. Now referring primarily to FIGS. 3B and 9, hp $^{83}$Kr is vacuum shuttled into a storage cell through valve C (22) and substantially simultaneously into the detection cell (17) where a 90° reference pulse is applied. After relaxation in a 24 mm internal diameter (i.d.) and 53 mm long Pyrex storage cell during $\tau_{relax}$ and a second evacuation of the detection cell, the hp $^{83}$Kr is again shuttled into the 9.4 T detection region, and signal is acquired from a second 90° pulse. Data collected using this technique are presented in FIG. 9. The spin-lattice relaxation of $T_1$=85 s measured at 0.05 T and 297 K is relatively long given the general trend shown in FIG. 8. However, the surface to volume ratio is about 2 times lower for the sample data shown in FIG. 9 compared to the sample data shown in FIGS. 7 and 8, and the relaxation is therefore reduced. Except for the length and presence of rubidium, the storage cell (23) and pump cells (7) are identical, and at 433 K and 0.05 T (the operating conditions of the RbSEOP cell (7)), a relaxation time of $T_1$=220 s ($\Gamma$=−4.55×10$^{-3}$ s$^{-1}$) is observed. From this self-relaxation value and the exponential factor ($\gamma_{se}+\Gamma$) obtained from fitting Eq. (1), the spin exchange rate is calculated to be $\gamma_{se} \approx 6.8 \times 10^{-3}$. This high value is possible only from the high rubidium number densities found at elevated temperatures. High temperature is therefore needed for krypton optical pumping, because it reduces the quadrupolar relaxation and increases the Rb—Kr spin exchange rate allowing for $\gamma_{se} > |\Gamma|$. The relaxation rate F will be reduced in pump cells with larger spatial dimensions and should allow for optical pumping at lower spin exchange rates and, hence, to provide the improved optical pumping conditions generally found at lower temperatures. This temperature dependence further argues that field inhomogeneities are not the source of the $T_1$ field dependence, because Eq. (2) predicts a shorter $T_1$ at higher temperatures due to an increased diffusion constant.

Example 2

Hyperpolarized-$^{83}$Kr as a Contrast Agent for MRI

Figure 10:
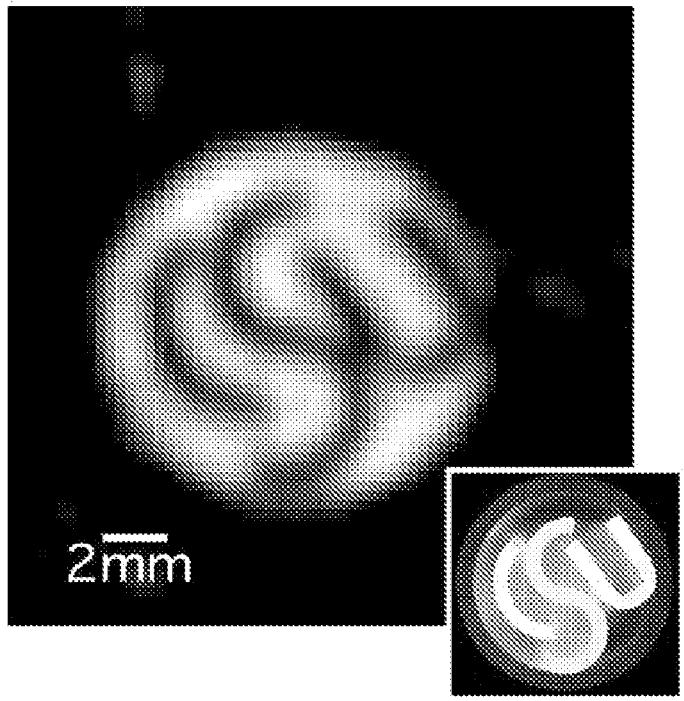
FIG. 10 provides a MR image of hp $^{83}$Kr flowing around glass structures.

Now referring to FIG. 10, a continuous-flow hp $^{83}$Kr MR image of krypton in bulk as phase between glass structures. The hp $^{83}$Kr is generated in continuous flow mode with polarization enhancement factors less than 30, as above described. The obtained resolution is 270×270 µm after zero filling the data size of both dimensions to 64. The overall duration of the MRI imaging is 1.7 hours (h).

Figure 11:
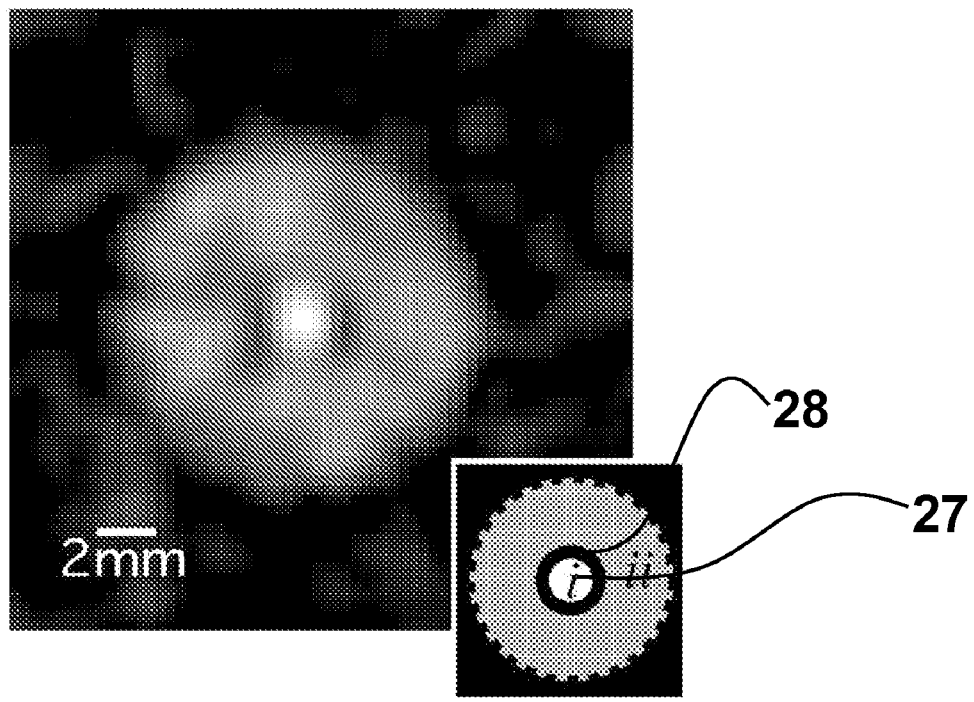
FIG. 11 provides a MR image of hp $^{83}$Kr contained in a porous polyethylene sample.

FIG. 11 shows a continuous flow hp $^{83}$Kr MR image taken of a porous polymer (polyethylene) having a 1.65 mm void space (27) surrounded by a 0.76 mm PFA wall (28) and an 11 mm wide area of porous polymer with 70 µm average pore size. Imaging of porous materials is achieved utilizing the inventive continuous flow method even though there is accelerated surface-induced quadrupolar relaxation in these media. The $^{83}$Kr $T_1$ relaxation time at 175 kPa pressure in a 4-5 cm long glass cylinders maintained at 289 K with 11-12.4 mm inner diameter are determined to be between 90-150 s at 9.4 T. These values are substantially shorter than the theoretical longitudinal relaxation time for $^{83}$Kr of T1=470 s, that one would measure in the absence of a container wall at 300 K, 100 kPa and 2.1 T. The presence of the glass surface greatly accelerates longitudinal relaxation of $^{83}$Kr, and the longitudinal relaxation was found to be a function of the surface to volume ratio. Recently we have found longitudinal relaxation times between 2.5 and 5.9 s in various porous polyethylene samples with average pore sizes ranging from 70 to 250 micrometer (µm) and with different chemical surface compositions (such as hydrophilic or hydrophobic).

Now referring primarily to FIG. 12, the quadrupolar relaxation experienced by hp $^{83}$Kr (or by hp$^{21}$Ne or hp$^{131}$Xe) is a source of contrast that is not available with either hp $^3$He or hp $^{129}$Xe. Hp $^{83}$Kr is generated via the stopped flow optical pumping as above described and used for $T_1$ relaxation measurements to distinguish between surface treatment, surface coat, surface wetting, surface grafting, or the like (see also Example 3; Stupic et al. "Quadrupolar Relaxation of Hyperpolarized Krypton-83 as a Probe for Surfaces", *Solid State NMR Spectr.*, 29, (2006) 79-84).

For example, a first surface sample (31) is made of untreated glass beads having a hydrophilic glass surface, while the glass beads in second surface sample (30) is treated with the siliconizing agent SurfaSil™. In the second surface sample (30) the bead surface has a hydrophobic character because the surface is coated with a molecular layer of siloxane. The two samples are chosen for their simplicity and because void space dimensions, pore symmetry, pore shape, pore connectivity and porosity remain constant while only the chemical composition of the surface is altered. Furthermore, the void space dimensions in 1.0 mm closest packed beads are similar to alveolar dimensions in human lungs (i.e. the octahedral and tetrahedral holes can accommodate spheres with radii up to 414 µm and 223 µm respectively). In the untreated hydrophilic sample a $^{83}$Kr $T_1$=35 s relaxation time is measured, while coating the glass spheres (hydrophobic sample) accelerates the relaxation time to $T_1$=9 s. Siliconizing agents have been used for optical pumping experiments in the past, because the surface coating insulates the noble gas atoms from magnetic sites in the glass surface and therefore prolongs the lifetime of the hp magnetization in $^{129}$Xe and $^3$He. The previously unknown effect of the coating on $^{83}$Kr relaxation is more dramatic, on a completely different time scale, and importantly, is reversed. This effect is caused by the quadrupolar relaxation that becomes more pronounced when the hp $^{83}$Kr atoms interact with the surface than when they are in the bulk gas phase. The hydrophobic coating causes stronger interactions between the non-polar noble gas atoms and the surface and hence faster relaxation, while the hydrophilic surface causes weaker interactions and results in slower relaxation.

Suitable 1.0 mm diameter glass beads can be obtained from Biospec Products, Inc., Bartlesville, Okla. The glass beads were degassed overnight at a pressure of less than 0.1 Pa and stored under dry nitrogen until use. Partially hydrophilic glass beads are used as obtained from the supplier except for the overnight degassing. Hydrophobic glass beads are prepared by first washing untreated beads for 15 min with a 1:1:5 solution of 30% v/v NH$_4$OH, 30% volume to volume (v/v) H$_2$O$_2$, and distilled water while stirring vigorously. Following NH$_4$OH/H$_2$O$_2$ treatment, the beads are washed for 15 min at 358 K with a 1:1:5 solution of 30% v/v HCl, 30% v/v H$_2$O$_2$, and distilled water while stirring vigorously. The beads are then washed five times with distilled water and dried in a vacuum desiccator at 523 K for 1 h. The beads are siliconized with 1:10 mixture of SurfaSil™ (Pierce Biotechnology Inc., Rockford, Ill.) in acetone and washed with distilled water in accordance with the manufacturer's instructions.

Figure 12A:
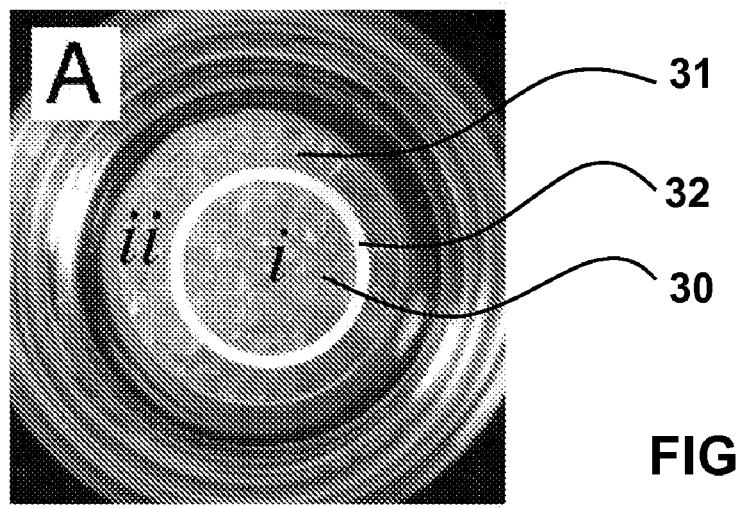
FIG. 12A shows a photograph of a first surface sample and a second surface sample with a different surface chemistry separated by a glass structure.
Figure 12B:
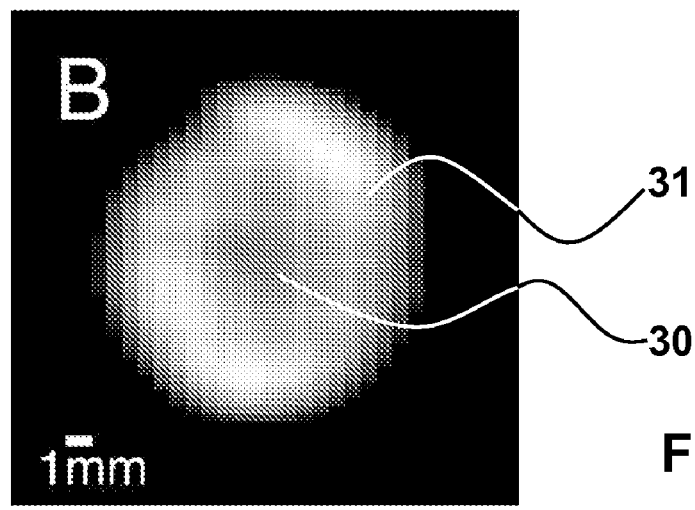
FIG. 12B provides a MR image of hp $^{83}$Kr distinguishing between the first surface sample and the second surface sample from 16 individual stopped flow optical pumping cycles with the MRI sequence applied about three seconds after filling the surface samples with hp $^{83}$Kr gas.
Figure 12C:
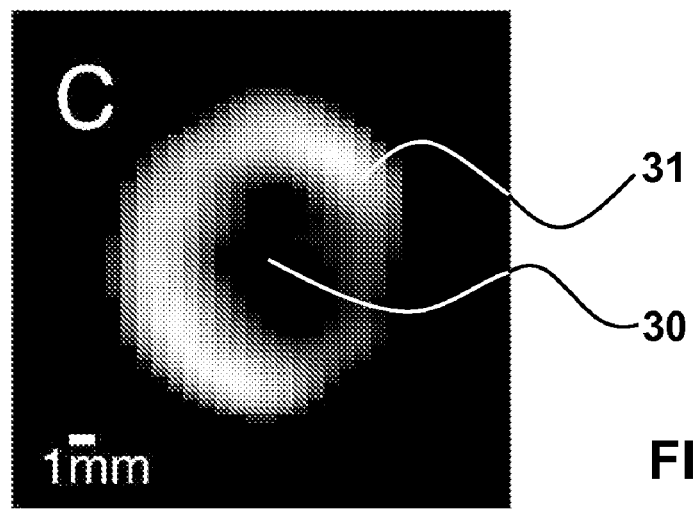
FIG. 12C provides a MR image of hp $^{83}$Kr under the same conditions as described for FIG. 12B except that the MRI sequence is applied about nine seconds after filling the surface samples with hp $^{83}$Kr gas.

Now referring to FIG. 12A, the first surface sample (30) of hydrophobic glass beads have a location at the center and the second surface sample (31) of hydrophilic glass beads have a location in the surrounding outer region separated by a glass structure (32). The samples (30) (31) are evacuated prior to the experiment and the MRI image shown in FIG. 12B is taken about 3 s after the hp 83Kr is transferred to the sample to allow the gas pressure to equilibrate. The image shows a weak contrast because the hp $^{83}$Kr in as to the first surface sample (30) is slightly more relaxed than in the second surface sample (31). The MRI in FIG. 12C is recorded under identical conditions except that a delay period of 9 s between gas transfer and signal recording is added. The contrast is clearly visible and demonstrates how hp $^{83}$Kr MRI is used to obtain information about the surface chemistry in porous media.

Figure 13A:
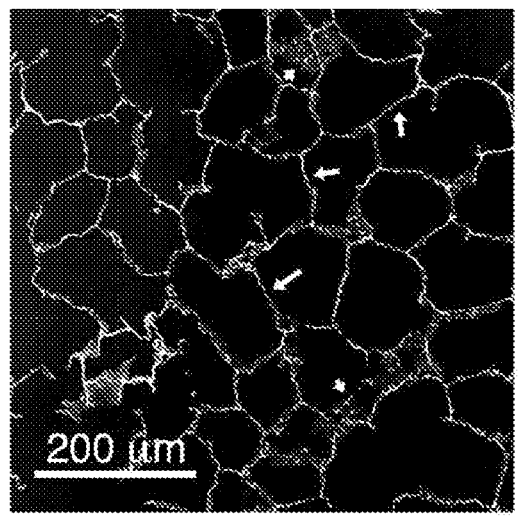
FIG. 13A provides an optical micrograph of desiccated canine lung tissue.

For in vivo MRI studies of airways the $^{83}$Kr relaxation times in the lung tissue cannot be significantly shorter than the timescale of the gas transport into the lung. The image shown by FIGS. 13B and 13C indicates the methods disclosed herein are capable of probing biological tissue. In an embodiment, stopped flow mode RbSEOP is used for in vivo MRI surface probing. In addition, longer transport times are generally required to accommodate breathing cycles of around 10 s. To obtain a first estimate of pulmonary $T_1$ times, a desiccated canine lung tissue sample having structural similarity to in vivo samples is imaged. FIG. 13A shows a micrograph of desiccated canine lung tissue demonstrating that the drying process preserves the alveolar structure. The desiccated lung tissue is prepared by rinsing lung tissue with tap water for 24 h via tracheal infusion and dried by tracheal insufflations with compressed air for 24 h. The tissue samples are cut into cylinders, degassed overnight at less than 0.1 Pa and stored under dry nitrogen until use. For the micrograph, desiccated lung tissue is removed and routinely processed for histopathology. Briefly the sample is rehydrated in 10% neutral buffered formalin, processed through a series of alcohol and xylene solutions, embedded in paraffin, serially sectioned at 4-6 μm and stained with hematoxylin and eosin for histological examination.

The spin-lattice relaxation time of hp $^{83}$Kr at 9.4 T and 289 K in the desiccated lung tissue is determined to be $T_1$=10.5 s. However, molecular oxygen is also present in the hp $^{83}$Kr mixture for in vivo MRI applications. Because quadrupolar interactions dominate the relaxation mechanism, the krypton $T_1$ relaxation time in the canine lung is only partially affected by the presence of 20% oxygen leading to a slightly reduced longitudinal relaxation time of $T_1$=8.6 s. This is in clear contrast to $^3$He and $^{129}$Xe where the longitudinal relaxation times are entirely regulated by the oxygen partial pressure and can be lowered by orders of magnitude ($T_1$=10-20 s) in lungs (Moller, et al. (2002) Mag. Res. Med. 47, 1029-1051).

Although the $^{83}$Kr relaxation times at 9.4 T are sufficiently long for MRI applications, a field dependence of the longitudinal relaxation rates is observed. A remote detection technique is applied to hp $^{83}$Kr in a desiccated canine lung sample to assess the potential problem of increased relaxation at field strengths currently used in commercial MRI scanners. The longitudinal relaxation times are found to be field dependent with $T_1$=5 s at 1.5 T and $T_1$=7 s at 3 T, respectively. In vivo lung samples may display longer relaxation times under the same conditions, since increasing temperature and water content on the surface decelerates the $^{83}$Kr $T_1$ relaxation rates.

Figure 13B:
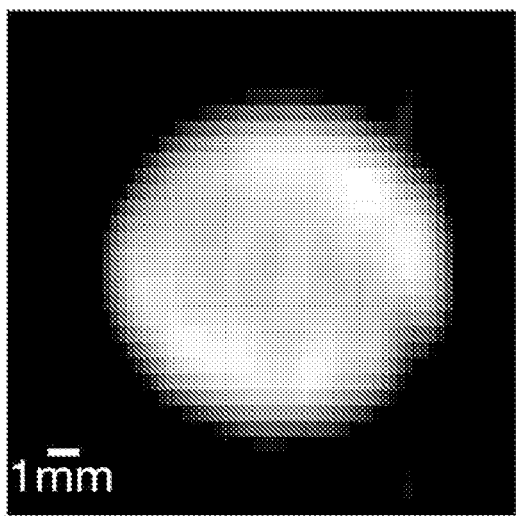
FIG. 13B provides a MR image of hp $^{83}$Kr from 16 individual stopped flow optical pumping cycles with the MRI sequence applied about three seconds after filling the desiccated canine lung tissue with hp $^{83}$Kr gas.
Figure 13C:
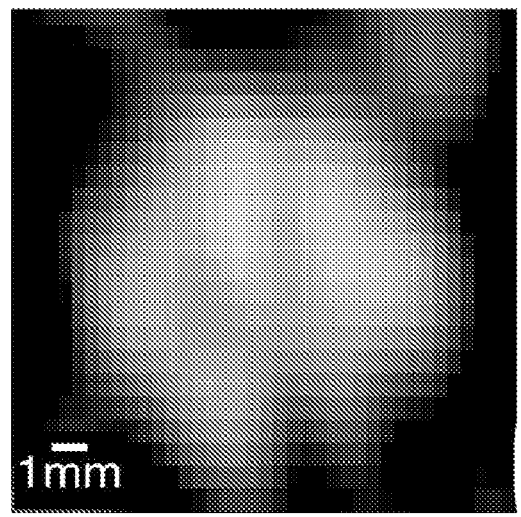
FIG. 13C provides a MR image hp $^{83}$Kr from one individual stopped flow optical pumping cycle with the MRI sequence applied about three seconds after filling the desiccated canine lung tissue with hp $^{83}$Kr gas.

FIG. 13C shows a MRI of hp $^{83}$Kr MRI in a 10 mm diameter and 2 cm long cylindrical sample from a desiccated canine lung specimen using one stopped flow optical pumping cycle above described and small flip angle excitation (FLASH). The image is acquired in 46 ms after 10 min of RbSEOP. FLASH images are possible because of the enormous enhancement obtained from the stopped flow mode and because of the favorable porosity of lung tissue compared to the polymer sample. Note that only about 31% of the generated spin polarization is used in this basic FLASH MRI experiment with krypton gas at natural abundance.

FIG. 13B shows the hp $^{83}$Kr MRI of a canine lung specimen obtained using multiple stopped flow optical pumping cycles. The image is reconstructed from 16 individual stopped flow experiments that correspond to 16 phase encoding field gradients. A comparison of FIGS. 13B and 13C shows the improved signal to noise obtained when a cycle of optical pumping is used for each phase encoding gradient with a 900 flip angle.

The MR images in FIG. 13 are obtained at 9.4 T, a field strength that is higher than the 1.5 T commonly used for medical MRI. The signal intensity decreases linearly with decreasing magnetic field. This dependence is in contrast to thermally polarized samples in conventional MRI that approximately displays an inverse square dependence on the external magnetic field and is a consequence of the non-equilibrium spin polarization generated by RbSEOP. The maximum spatial resolution is affected by the signal intensity and will be reduced by a factor of about 6 at 1.5 T compared to the MRI at 9.4 T in FIGS. 10 and 11. Additional loss may occur because of larger detection coil dimensions in medical MRI. This loss can be at least partially negated by improvement to the polarization process.

Example 3

Quadrupolar Relaxation of hp $^{83}$Kr as a Probe for Surfaces

This example provides a study of relaxation experienced by the hyperpolarized noble gas isotope $^{83}$Kr (I=9/2) in contact with surfaces. The spin-lattice relaxation of $^{83}$Kr is found to depend strongly on the chemical composition of the surfaces in the vicinity of the gas. This effect is caused by quadrupolar interactions during brief periods of surface adsorption that are the dominating source of longitudinal spin relaxation in the $^{83}$Kr atoms. Model systems of closely packed glass beads with uniform but variable bead sizes are used for the relaxation measurements. The observed relaxation rates depend strongly on the chemical treatment of the glass surfaces and on the surface to volume ratio. Hp $^{83}$Kr NMR relaxation measurements of porous polymers with pore sizes of 70-250 μm demonstrate the potential of this new technique for material sciences applications.

The only stable NMR active isotope of the noble gas krypton, Kr, has a natural abundance of 11.5% and a NMR resonance frequency of 15.4 MHz at 9.4 T magnetic field strength. Because of its spin I=9/2, the nucleus of $^{83}$Kr possesses an electric quadrupole moment (Q=0.28×10$^{-28}$ m$^2$). An anisotropic environment will induce an electric field gradient in the electronic cloud of the noble gas atom, and quadrupolar coherence can cause quadrupolar splitting if the anisotropy has a macroscopic net alignment with respect to the magnetic field. This has been observed previously by conventional NMR with krypton dissolved in nematic phase liquid crystals [1-3] and by optically detected magnetic resonance in quadrupole nutation experiments of gaseous krypton within non-spherical macroscopic glass containers [4, 5]. In the absence of unpaired electrons, the quadrupole moment is the dominating factor for relaxation of the $^{83}$Kr nuclear spin in gas, liquid, and solid phases [6-8]. The $^{83}$Kr NMR relaxation in various liquid solutions has been studied [3, 9-13], and the chemical shift in gas and dissolved phases has been investigated [3, 9, 14, 15]. Krypton has also been used to explore nanoporous materials indirectly through $^{129}$Xe NMR chemical shift measurements in xenon-krypton gas mixtures within zeolites [16, 17]. Recently, direct $^{83}$Kr NMR observations of this noble gas inside a number of zeolites have been reported [18]. The $^{83}$Kr lineshape was found to strongly depend on internal cage structure and the charge of the cations inside the nanoporous materials. The field dependence of the lineshape observed in some Ca$^{2+}$ exchanged zeolites has been attributed to long-range disorder. The $^{83}$Kr chemical shift has been studied as a function of krypton loading in these materials but the contributions from the second order quadrupolar interactions to the observed shift remain unexplored thus far. Despite the low sensitivity of natural abundance $^{83}$Kr (i.e. about 3.8% of the sensitivity obtained from thermally spin polarized $^{129}$Xe), meaningful $^{83}$Kr NMR measurements in zeolites can typically be accomplished within a few hours at medium field strength (i.e. 9.4 T) with thermally polarized krypton. This is possible because of the relatively fast longitudinal relaxation of $^{83}$Kr that ranges from milliseconds to tens of milliseconds in these materials.

The usage of thermally polarized $^{83}$Kr as a probe for materials with small surface to volume ratios (for example, ranging from between 10,000 cm$^{-1}$ to 0.001 cm$^{-1}$) is hampered in part by the lower krypton loading compared to those found in zeolites. Even more problematic for $^{83}$Kr NMR are the increased longitudinal relaxation times in large pore materials with typical values ranging from seconds to many tens of seconds. However, experiments with small surface areas have become feasible because of recent developments in optical pumping that lead to the production of hyperpolarized (hp) $^{83}$Kr for NMR and MRI applications [19]. The expected longitudinal relaxation time of $^{83}$Kr in the pure gas phase (i.e. in the absence of a container wall) at 300 K, 100 kPa and 2.1 T can be estimated as $T_1$=470 s [8]. However, longitudinal relaxation times of 90 s-150 s have been measured in 10-11.5 mm diameter and 4-5 cm long glass cylinders at 290 K, 100-200 kPa and 9.4 T (with the relaxation rates also depending on the treatment of the glass surface). The long relaxation time of $^{83}$Kr in the gas phase allows for the production of hyperpolarized (hp) $^{83}$Kr by spin exchange optical pumping with rubidium vapor [20] and for the subsequent separation of the alkali metal from the hyperpolarized $^{83}$Kr gas [19]. Signal enhancements of more than three orders of magnitude compared to thermally polarized $^{83}$Kr NMR signals at ambient temperature and 9.4 T have been achieved. The apparatus and procedure for the production of hp $^{83}$Kr are described throughout the different examples herein.

Krypton optical pumping: A number of researchers have explored alkali metal vapor optical pumping of quadrupolar noble gas isotopes, including $^{83}$Kr [4, 5, 20-27]. The devices described herein have been used for the first successful separation of a hyperpolarized noble gas with a quadrupolar nucleus (e.g., I>½) from an alkali metal vapor, specifically a rubidium vapor. The separation process is similar to those used for production of non-quadrupolar hyperpolarized noble gasses in batch or continuous flow modes [28-34]. The separation of the hyperpolarized gas from the rubidium vapor is crucial for NMR and MRI applications because of the reactivity of alkali metals that adversely impact signal or destroy the to-be-studied sample. The experimental setup is similar to those used for the production of hp $^{129}$Xe (I=½) [31, 33, 34]. The gas mixture used for these experiments have a high concentration of natural abundance krypton (typically 95%) and about 5% of molecular nitrogen added for radiation quenching purposes [35]. The gas pressure in the pumping cell ranged from 110 to 220 kPa. Pumping with high noble gas density has been thoroughly explored for $^{129}$Xe [33, 35-38] and is important for obtaining higher signal intensities with hp $^{83}$Kr. A COHERENT® 60 Watt continuous wave diode array solid-state laser system is applied to the stopped flow type pumping process and leads to a signal enhancement of about 1200 times greater than the thermal signal at 9.4 T and 300 K [19]. Research grade natural abundance krypton (99.995%; Airgas, Radnor, Pa.) is used for the pumping in a cylindrical Pyrex cell (length=125 mm, I.D.=24 mm) that contains 2.5 to 5.0 g of rubidium (99.6%; Sigma-Aldrich, Milwaukee, Wis. & 99.75%; Alfa Aesar, Ward Hill, Mass.). The temperature of the cell is maintained at approximately 433 K, a pumping cell temperature that is about 40 K higher than the temperature typically used for hp $^{129}$Xe. In the stopped flow experiments the sample is evacuated to 0.1 kPa, and the krypton-nitrogen gas mixture is kept under laser radiation for 10 min. Subsequently, the optically pumped krypton is transferred using pressure equalization into the sample cell where a krypton gas pressure range of 100 to 200 kPa is maintained. The rubidium vapor is separated from the krypton by an air-cooled filter located inside the transfer line between the pumping cell and the detection cell.

Figure 14:
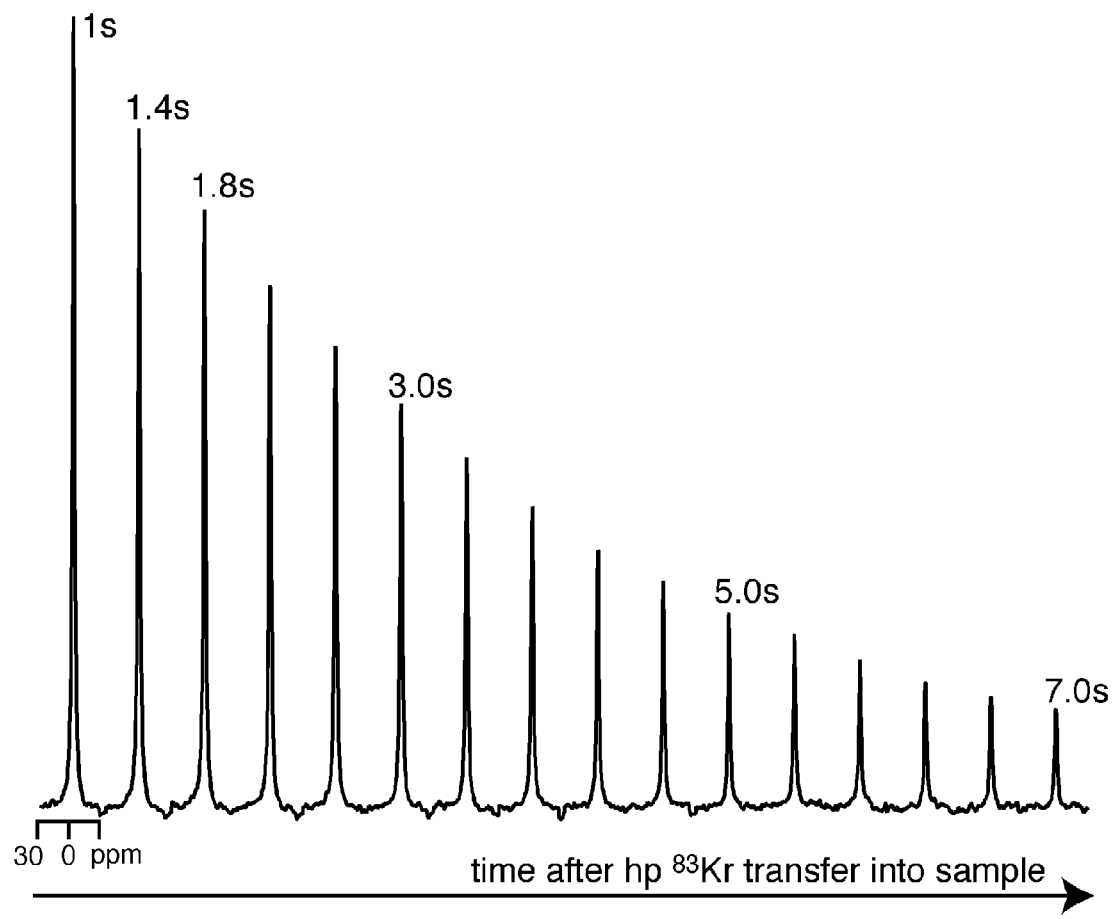
FIG. 14: Signal intensity decay resulting from $T_1$ relaxation and the application of a series of medium flip angle r.f. pulses. Using stopped flow optical pumping, hyperpolarized $^{83}$K is transferred into a sample of porous polyethylene (mean pore size 70 µm). Signal is acquired by applying a series of sixteen 120 r.f. pulses spaced evenly every 0.4 s.

NMR Measurements: Experiments are performed at 15.4 MHz with a Chemagnetics CMX II spectrometer and a 9.4 T wide-bore (89 mm) superconducting magnet. $T_1$ values from optical pumping data are calculated by nonlinear least-squares fitting of the $^{83}$Kr signal intensity as a function of time and number of applied medium flip angle (12.3°) r.f. pulses (FIG. 14).

Sample preparation: The 0.1-2.5 mm diameter glass beads (Biospec Products, Inc., Bartlesville, Okla.) are degassed overnight at a pressure of less than 0.1 Pa and stored under dry nitrogen until use. The beads that are used as obtained from the supplier except for overnight degassing under vacuum conditions are referred to as 'untreated beads'. The 'pre-treated glass beads' are obtained by washing untreated beads for 15 min with a 1:1:5 solution of 30% v/v NH$_4$OH, 30% v/v H$_2$O$_2$, and distilled water while stirring vigorously. Following NH$_4$OH/H$_2$O$_2$ treatment, the beads are washed for 15 min at 358 K with a 1:1:5 solution of 30% v/v HCl, 30% v/v H$_2$O$_2$, and distilled water while stirring vigorously. The beads are then washed five times with distilled water and dried in a vacuum desiccator at 523 K for at least 1 h. 'Siloxane treated beads' are pretreated beads siliconized with a 1:10 mixture of SurfaSil® (Pierce Biotechnology Inc., Rockford, Ill.) in acetone and washed with distilled water in accordance with the manufacturer's instructions. 'Fluorosilane treated beads' are obtained from pretreated beads through reaction with a 1:100 mixture of (3,3,3-Trifluoropropyl) tri-methoxyl silane (Gelest Inc., Morrisville, Pa.) in toluene with occasional stirring for 3 hours and later washed with toluene 4 times followed by drying in a vacuum desiccator at 398 K overnight.

The 70-250 μm porous polyethylene samples (Small Parts, Inc., Miami Lakes, Fla.) are degassed overnight at pressure of less than 0.1 Pa and stored under dry nitrogen until use.

Figure 15:
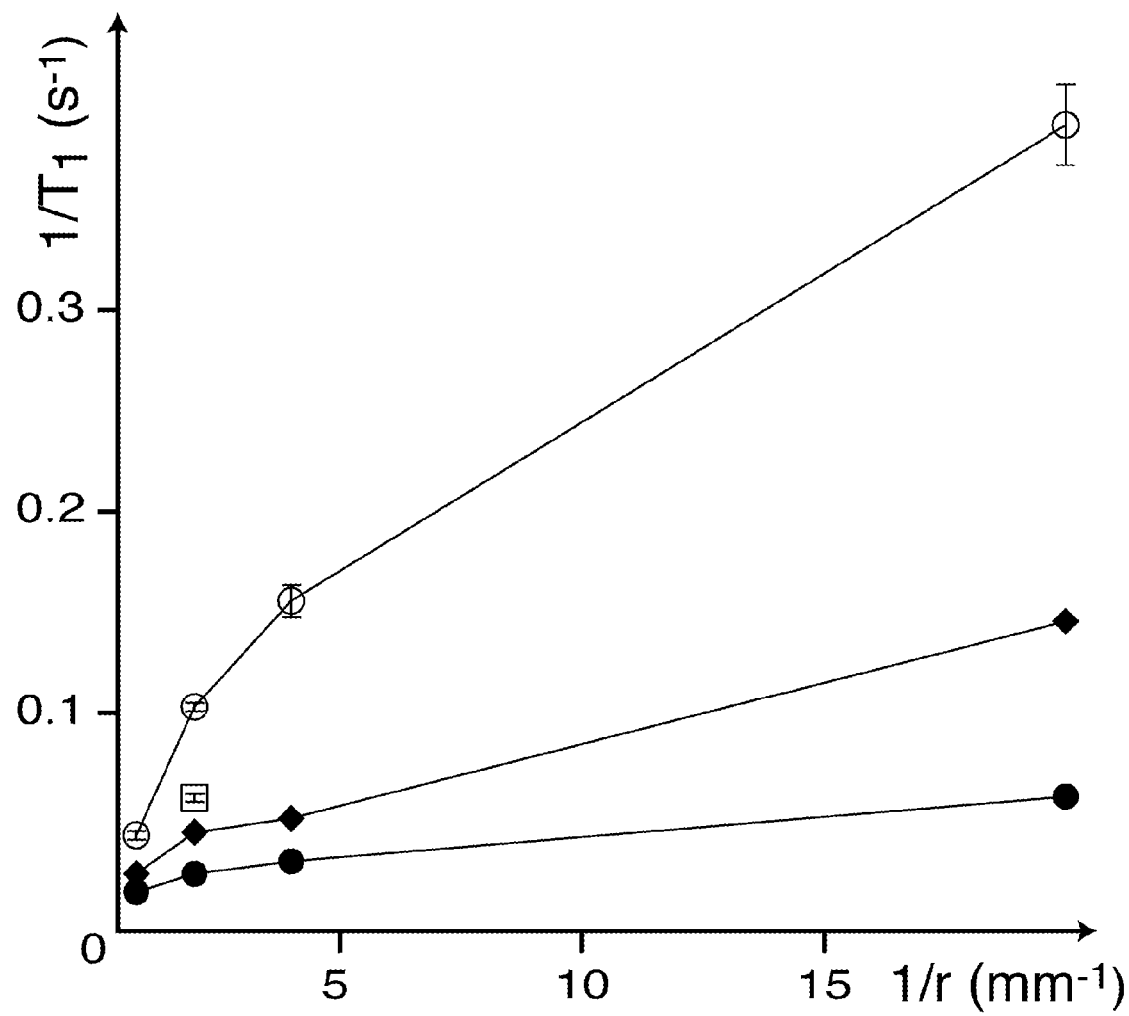
FIG. 15: Relaxation rates versus inverse bead radii from the experimental results summarized in Table 1. The inverse radius is directly proportional to the surface to volume ratio in the porous samples. Relaxation rates for the various bead surfaces are represented by the following symbols: siloxane treated—open circles, pretreated—closed diamonds, and untreated—closed circles. The single data point for a flourosilane treated surface (1.0 mm beads) is represented by an open square. Error bars represent standard deviations resulting from at least four replicate measurements.

Glass beads of four different sizes (i.e. 0.1 mm, 0.5 mm, 1.0 mm and 2.5 mm) are separately placed in a 10.8 mm I.D. sample cell that is connected to the pumping cell through a PFA transfer line. The beads are assumed to be in an arrangement resembling the closest packing of spheres with a constant total pore volume of 26% of the overall sample. The pores are the tetrahedral and octahedral holes expected from the closest packing and can accommodate spherical objects of radii up to r=0.223 and r=0.414 respectively, if the radius of the closest packed beads is r=1. Deviations from the ideal packing will occur because of the finite sample container dimensions and are most pronounced for the beads with the largest diameter (2.5 mm). Nevertheless, the test systems are reasonably well-defined, especially for the smaller beads and can easily be reproduced. Four different types of surfaces have been explored by $^{83}$Kr NMR, namely untreated, pretreated, siloxane treated and fluorosilane treated glass beads as described herein. The results of the $^{83}$Kr NMR relaxation measurements are summarized in Table 1 and FIG. 15. The $^{83}$Kr relaxation rates increase with decreasing pore size for all surfaces studied. The geometry of the pores is unaffected by the bead diameter, thus the effect arises by the surface to volume ratio of the material that is directly proportional to the inverse radius of the spheres (assuming ideal packing). FIG. 15 shows the relaxation rates as a function of inverse bead radius. The observed relaxation that varies with the inverse radius (i.e. surface to volume ratio) is supported based on observations for $^{131}$Xe (I=3/2) that suggest the longitudinal relaxation in quadrupolar noble gasses is caused by surface collisions [26, 39-41]. In the present study, the noble gas is detected in the bulk gas phase, but the major source of relaxation is caused by the particularly pronounced quadrupolar interactions during brief adsorption periods of the atoms on the surrounding surfaces. The longest $^{83}$Kr relaxation times of $T_1$=90-150s are observed in detection cells without beads where the container walls remain as the sole exposed surface. If quadrupolar interactions on the surface are the only source for the observed relaxation, a linear dependence of relaxation rates on the inverse radius is anticipated. A clear deviation from the expected linear behavior is observed in particular for the larger diameter beads likely because of non-ideal packing and a more significant contribution from relaxation at the container glass wall. A more detailed mapping of the relaxation dependence on bead diameter (with bead diameters <0.5 mm) can further quantify the effect. Note that generation of quadrupolar coherence [40-44] is not investigated in this study. In ideal closest packed spheres such coherence is not expected because of the high symmetry of tetrahedral and octahedral pores.

Beyond the surface to volume ratio, another parameter considered is the van der Waals interaction that is a driving force for the hp $^{83}$Kr adsorption on the surface. The non-polar, but highly polarizable, krypton electron cloud leads to more favorable surface adsorption enthalpies with non-polar (i.e. hydrophobic) surfaces than with polar (i.e. hydrophilic) surfaces. The slopes provided by linear fitting of the curves in FIG. 15 are correlated with the strength of the interaction between the surface and the krypton atoms. The stronger the interaction between the surface and krypton atoms, the higher the number of krypton atoms adsorbed on the surface. In turn, this leads to larger slopes for the linear fittings of the curves in FIG. 15. Surface chemical composition influences the longitudinal relaxation of the hyperpolarized noble gas for a number of reasons, including influencing the adsorption time, the number of adsorbed atoms, and because the magnitude of the quadrupolar coupling itself is affected by the gas atom-surface interaction. The relaxation times are therefore shorter in glass beads with siloxane treated (i.e. non-polar) surfaces than in the untreated or pretreated beads. The opposite effect is observed with $^{129}$Xe and $^3$He NMR (I=½) [45, 46], because the surface coating insulates the noble gas atoms from magnetic sites in the glass surface [47] and therefore prolongs the lifetime of the hp magnetization for spin I=½ noble gasses. However, the quadrupolar relaxation of $^{83}$Kr dominates over all other types of relaxation in this study, resulting in the observed trends.

The cause for the difference in the observed krypton relaxation between untreated and pretreated surfaces is less obvious than the source of the effect between untreated and siloxane treated surfaces. In addition to being more fully covered with hydroxyl groups than the untreated surfaces, the pretreated surfaces have activated adsorption sites and may have greater surface corrugation. The tested fluorosilane sample is made of coated 1.0 mm glass beads and results in slower relaxation than the siloxane (hydrophobic) treated surface, but faster relaxation than found in pretreated and untreated 1.0 mm beads.

Little effect on the relaxation rates is observed when the krypton gas pressure is varied by a factor of 2 (from 100 to 200 kPa), indicating the methods and devices disclosed herein are robust. This may appear surprising since the $^{83}$Kr bulk gas phase relaxation rate is directly proportional to the gas density [8] (and therefore directly proportional to the gas pressure, assuming ideal gas behavior). However, any change in the bulk gas phase relaxation has little effect on the observed relaxation because pure gas phase relaxation is about one order of magnitude slower than the observed rates that are dominated by surface processes. The conditions in this study provide surface coverage of krypton atoms that is approximately directly proportional with the gas pressure (i.e. Langmuir isotherm for case with low surface coverage). Therefore, the ratio between atoms in the gas phase and adsorbed on the surfaces should be approximately constant, leading to relaxation rates that are relatively independent of the gas pressure. A more extreme change in pressure is predicted to have a stronger influence on diffusion, surface adsorption and therefore on the relaxation rates.

The measurement of longitudinal relaxation in the 0.1 mm siloxane coated sample with thermally polarized $^{83}$Kr at 100 kPa and 14.1 T field strength did not show significant deviation from the optical pumping data at 9.4 T (Table 1). This indicates there is no dramatic field dependence at these field strengths as is to be expected from quadrupolar relaxation under these conditions [18] (i.e. short mean adsorption times and therefore short correlation times $\tau_c$). Since the thermal measurement for even the fastest relaxing sample took about four days (as opposed to less than 15 min for the optical pumping experiments), only one such measurement is presented herein.

Figure 16:
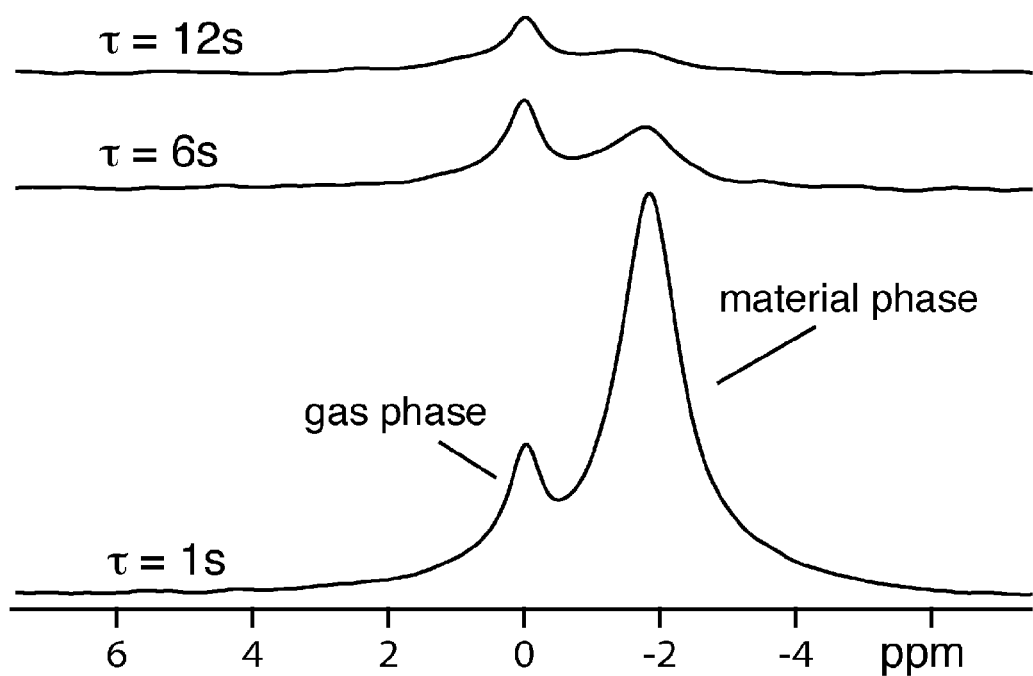
FIG. 16: $^{83}$Kr NMR spectrum of 70 µm hydrophobic porous polymer (−1.8 ppm) and of (bulk) gas phase at 100 kPa (referenced as 0 ppm). The bulk gas phase is contained inside a PFA tube with a 3.0 mm O.D. and a 1.5 mm I.D. located with axial symmetry in a cylindrical polymer sample. The negative (upfield) shift of the krypton inside the material is caused by shielding through the macroscopic magnetic susceptibility of the polymer. The $^{83}$Kr NMR spectrum is shown at different delay times, r, after the transfer of the hyperpolarized gas into the sample. The gas phase peak is clearly identified by its slower relaxation compared to the krypton inside the porous polymer.

The methods presented herein are further explored in systems that are less ideal than the glass beads. FIG. 16 shows the $^{83}$Kr NMR spectrum of krypton inside a porous polymer sample with 70 μm mean pore size and of bulk gas phase krypton at 100 kPa. The gas phase peak is referenced to 0 ppm, and the krypton gas inside the polymer appears upfield shifted at −1.84 ppm. The $^{83}$Kr is observed to resonate between −1 to −2 ppm for the glass beads and the polymers respectively. From previous experience in $^{129}$Xe NMR spectroscopy, it is unexpected to observe a signal from the bulk gas phase that resonates at higher frequency than the noble gas contained in a porous material [48-53]. However, the krypton chemical shift inside the macroscopic pores in the polymers used in this work is very small (the $^{129}$Xe chemical shift on macroscopic polymer surfaces at ambient temperature is only a few ppm [54], and the krypton chemical shift is generally only a fraction of the xenon shift). Most likely, the small downfield krypton chemical shift is not strong enough to offset the shielding effect caused by the magnetic susceptibility of the material. FIG. 16 demonstrates the effect of longitudinal relaxation in this sample, clearly distinguishing the gas phase krypton from the krypton in the polymer void spaces because of the higher relaxation rate in the material. The sample top and bottom allow for some diffusion between the two regions, leading to faster relaxation in the gas phase compared to gas phase without contact with the polymer. For the same reason, the relaxation rate in the material is reduced compared to a sample without bulk gas phase.

Figure 17:
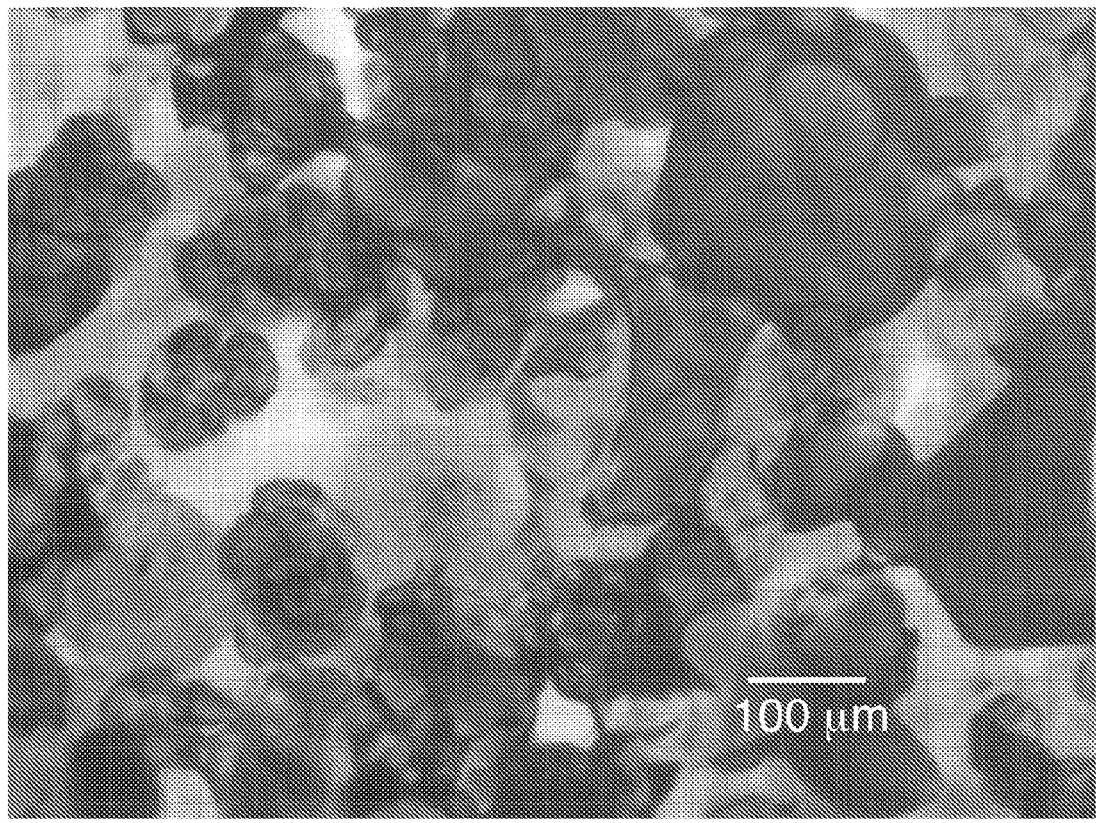
FIG. 17: Micrograph of porous polyethylene obtained from an inverted optical microscope. The sample has a mean pore size of 70 µm as characterized by the supplier. For $^{83}$Kr NMR spectrum of this sample see FIGS. 14 and 16.

Table 2 shows the longitudinal relaxation times of hp $^{83}$Kr in porous polymers recorded in samples without bulk gas phase. The relaxation time increases with a more hydrophilic surface compared to a hydrophobic surface with similar pore dimension (90-130 μm pore range for the hydrophilic and 120 μm mean pore size for the hydrophobic sample). However, the trend in relaxation dependence on pore sizes in the hydrophobic samples seems to contradict the results obtained with the glass beads. The polymer with the largest mean pore size has the shortest relaxation time, and the polymer with the smallest pores has the longest relaxation time. It is important to note however, that the $^{83}$Kr relaxation time does not directly depend on the pore sizes but rather on the surface to volume ratios. In the well defined glass beads both parameters are directly correlated, however the polymer micrograph in FIG. 17 demonstrates a very complex internal structure for the porous polymeric solid that is more difficult to describe explicitly. The surface area could increase with increasing corrugation of the polymer microparticles, even if the average pore size increases. Generally, the $^{83}$Kr relaxation times depend directly on surface to volume ratios and not necessarily on the mean pore size. The mean pore size is determined by the manufacturer using mercury intrusion porosimetry.

Hyperpolarized $^{83}$Kr NMR relaxation measurements are highly sensitive to the chemical composition of surfaces and to the surface to volume ratios in porous materials. In contrast to direct observation of surfaces by traditional solid state NMR, hp $^{83}$Kr NMR does not require the use of any line narrowing techniques. Sensitivity is often a limiting factor in NMR of surfaces but is not an obstacle for hyperpolarized $^{83}$Kr. Furthermore, there is no need to discriminate between signals arising from the sample surface and from the bulk gas phase, since the technique is entirely surface selective. An advantage of hp $^{83}$Kr NMR over optical and other surface techniques is that it can be easily applied to opaque and amorphous materials even under atmospheric or greater pressures. Like the well established $^{129}$Xe NMR spectroscopy, the methods presented herein are an indirect probe for surface structure. However, for the first time a hyperpolarized quadrupolar noble gas is available for materials science studies that provides information highly complementary to that obtained from $^{129}$Xe NMR. The closest packed glass beads are an ideal test system for the exploration of the surface sensitivity of new technique. Hp $^{83}$Kr NMR has uses, for instance, in characterizing the homogeneity of grafting, wetting and other surface treatments in amorphous materials.

[1] P. Ingman, J. Jokisaari, P. Diehl, J. Magn. Reson., 92 (1991) 163-169.
[2] J. Jokisaari, P. Ingman, J. Lounila, O. Pulkkinen, P. Diehl, O. Muenster, Mol. Phys., 78 (1993) 41-54.
[3] J. Jokisaari, Progr. NMR Spectroc., 26 (1994) 1-26.
[4] C. H. Volk, J. G. Mark, B. C. Grover, Phys. Rev. A, 20 (1979) 2381-2388.
[5] R. Butscher, G. Wackerle, M. Mehring, Chem. Phys. Lett., 249 (1996) 444-450.
[6] D. F. Cowgill, R. E. Norberg, Phys. Rev. B, 8 (1973) 4966-4974.
[7] D. F. Cowgill, R. E. Norberg, Phys. Rev. B, 13 (1976) 2773-2781.
[8] D. Brinkmann, D. Kuhn, Phys. Rev. A, 21 (1980) 163-167.
[9] R. K. Mazitov, K. M. Enikeev, A. V. Ilyasov, Z. Phys. Chem. Neue Fol., 155 (1987) 55-68.
[10] P. Diehl, J. Jokisaari, J. Magn. Reson., 88 (1990) 660-665.
[11] J. Vaara, J. Jokisaari, T. T. Rantala, J. Lounila, Mol. Phys., 82 (1994) 13-27.
[12] M. Holz, R. Haselmeier, A. Klein, R. K. Mazitov, Appl. Magn. Reson., 8 (1995) 501-519.
[13] M. Luhmer, J. Reisse, Progr. NMR Spectroc., 33 (1998) 57-76.
[14] J. Lurie, J. L. Feldman, G. K. Horton, Phys. Rev., 150 (1966) 180-185.
[15] D. Brinkmann, Physics Letters A, A 25 (1967) 520.
[16] A. K. Jameson, C. J. Jameson, A. C. Dedios, E. Oldfield, R. E. Gerald, G. L. Turner, Solid. State. Nucl. Mag., 4 (1995) 1-12.
[17] C. J. Jameson, A. K. Jameson, H. M. Lim, J. Chem. Phys., 107 (1997) 4364-4372.
[18] C. F. Horton-Garcia, G. E. Pavlovskaya, T. Meersmann, J. Am. Chem. Soc., 127 (2005) 1958-1962.
[19] Z. I. Cleveland, G. E. Pavlovskaya, K. F. Stupic, C. F. LeNoir, T. Meersmann, J. Chem. Phys., 124 (2006) 044312.
[20] S. R. Schaefer, G. D. Cates, W. Happer, Phys. Rev. A, 41 (1990) 6063-6070.
[21] B. C. Grover, Phys. Rev. Lett., 40 (1978) 391-392.
[22] C. H. Volk, T. M. Kwon, J. G. Mark, Y. B. Kim, J. C. Woo, Phys. Rev. Lett., 44 (1980) 136-139.
[23] T. E. Chupp, K. P. Coulter, Phys. Rev. Lett., 55 (1985) 1074-1077.
[24] Z. Wu, W. Happer, J. M. Daniels, Phys. Rev. Lett., 59 (1987) 1480-1483.
[25] D. Raftery, H. W. Long, D. Shykind, P. J. Grandinetti, A. Pines, Phys. Rev. A, 50 (1994) 567-574.
[26] R. Butscher, G. Wackerle, M. Mehring, J. Chem. Phys., 100 (1994) 6923-6933.
[27] T. G. Walker, W. Happer, Rev. Mod. Phys., 69 (1997) 629-642.
[28] D. Raftery, H. Long, T. Meersmann, P. J. Grandinetti, L. Reven, A. Pines, Phys. Rev. Lett., 66 (1991) 584-587.
[29] M. S. Rosen, T. E. Chupp, K. P. Coulter, R. C. Welsh, S. D. Swanson, Rev. Sci. Instrum., 70 (1999) 1546-1552.
[30] R. Seydoux, A. Pines, M. Haake, J. A. Reimer, J. Phys. Chem. B., 103 (1999) 4629-4637.
[31] J. M. Kneller, R. J. Soto, S. E. Surber, J. F. Colomer, A. Fonseca, J. B. Nagy, T. Pietrass, J. Magn. Reson., 147 (2000) 261-265.
[32] A. L. Zook, B. B. Adhyaru, C. R. Bowers, J. Magn. Reson., 159 (2002) 175-182.
[33] S. Anala, G. E. Pavlovskaya, P. Pichumani, T. J. Dieken, M. D. Olsen, T. Meersmann, J. Am. Chem. Soc., 125 (2003) 13298-13302.
[34] K. Knagge, J. Prange, D. Raftery, Chem. Phys. Lett., 397 (2004) 11-16.
[35] M. G. Mortuza, S. Anala, G. E. Pavlovskaya, T. J. Dieken, T. Meersmann, J. Chem. Phys., 118 (2003) 1581-1584.
[36] L. G. Kaiser, T. Meersmann, J. W. Logan, A. Pines, Proc. Natl. Acad. Sci., 97 (2000) 2414-2418.
[37] T. Meersmann, J. W. Logan, R. Simonutti, S. Caldarelli, A. Comotti, P. Sozzani, L. G. Kaiser, A. Pines, J. Phys. Chem. A., 104 (2000) 11665-11670.
[38] L. G. Kaiser, J. W. Logan, T. Meersmann, A. Pines, J. Magn. Reson., 149 (2001) 144-148.
[39] G. Pavlovskaya, A. K. Blue, S. J. Gibbs, M. Haake, F. Cros, L. Malier, T. Meersmann, J. Magn. Reson., 137 (1999) 258-264.
[40] T. Meersmann, M. Deschamps, G. Bodenhausen, J. Am. Chem. Soc., 123 (2001) 941-945.
[41] Y. Millot, P. P. Man, M. A. Springuel-Huet, J. Fraissard, Studies in Surface Sciences and Catalysis, 135 (2001).
[42] T. Meersmann, S. A. Smith, G. Bodenhausen, Phys. Rev. Lett., 80 (1998) 1398-1401.
[43] I. L. Moudrakovski, C. I. Ratcliffe, J. A. Ripmeester, J. Am. Chem. Soc., 123 (2001) 2066-2067.
[44] H. W. Long, M. Luzar, H. C. Gaede, R. G. Larsen, J. Kritzenberger, A. Pines, G. P. Crawford, J. Phys. Chem., 99 (1995) 11989-11993.
[45] B. Driehuys, G. D. Cates, W. Happer, Phys. Rev. Lett., 74 (1995) 4943-4946.
[46] S. R. Breeze, S. Lang, I. Moudrakovski, C. I. Ratcliffe, J. A. Ripmeester, G. Santyr, B. Simard, I. Zuger, Journal of Applied Physics, 87 (2000) 8013-8017.
[47] R. E. Jacob, B. Driehuys, B. Saam, Chem. Phys. Lett., 370 (2003) 261-267.
[48] M. A. Springuel-Huet, J. L. Bonardet, A. Gedeon, J. Fraissard, Magnetic Resonance in Chemistry, 37 (1999) S1-S13.
[49] C. I. Ratcliffe, Annual Reports on NMR Spectroscopy, 36 (1998) 123-221.
[50] C. J. Jameson, A. K. Jameson, R. E. Gerald, H. M. Lim, J. Phys. Chem. B., 101 (1997) 8418-8437.
[51] D. Raftery, B. F. Chmelka, NMR Basic Principles and Progress, 30 (1994) 111-158.
[52] P. J. Barrie, J. Klinowski, Prog. NMR Spectrosc., 24 (1992) 91-108.
[53] C. Dybowski, N. Bansal, T. M. Duncan, Annual Review of Physical Chemistry, 42 (1991) 433-464.

[54] D. Raftery, L. Reven, H. Long, A. Pines, P. Tang, J. A. Reimer, J. Phys. Chem., 97 (1993) 1649-1655.

TABLE 1

$^{83}$Kr $T_1$ relaxation times in the void spaces of surface treated glass beads.

| Bead Dia. (mm) | Untreated Beads $T_1$ (s) | Pretreated Beads $T_1$ (s) | Fluorosilane Beads $T_1$ (s) | Siloxane Treated Beads $T_1$ (s) |
|---|---|---|---|---|
| 2.5 | 53 ± 1 | 35.2 | — | 21.1 ± 0.9 |
| 1.0 | 35.3 | 20.5 | 15.2 ± 0.5 | 9.0 ± 0.2 |
|  | 34.3 (200 kPa)$^a$ |  |  | 9.0 (200 kPa)$^a$ |
| 0.5 | 29.0 | 17.9 | — | 6.1 ± 0.3 |
| 0.1 | 15.0 | 6.5 | — | 2.5 ± 0.1 |
|  |  |  |  | 2.6 (thermal)$^b$ |

$T_1$ values are measured using hyperpolarized $^{83}$Kr at 100 kPa and 9.4 T unless otherwise specified. The uncertainties are the standard deviation in $T_1$ measurements and are reported only when at least four measurements were performed.
$^a$The value was obtained from hyperpolarized $^{83}$Kr at 200 kPa.
$^b$The reported value was obtained from thermally polarized $^{83}$Kr at 100 kPa and a magnetic field strength of 14.1 T. The saturation experiment used to measure the $T_1$ value comprises 6000 signal acquisitions at each time delay. The total experimental time for this data point was approximately 4 days.

TABLE 2

$^{83}$Kr $T_1$ relaxation times in porous polyethylene samples.

| Porous Polymer | $T_1$ (s) |
|---|---|
| Hydrophobic: 70 μm pores$^a$ | 3.6 ± 0.1 |
| Hydrophobic: 120 μm pores$^a$ | 2.7 ± 0.1 |
| Hydrophilic: 90-130 μm pores$^b$ | 7.1 ± 0.2 |
| Hydrophobic: 250 μm pores$^a$ | 2.1 ± 0.1 |

The reported uncertainty is the standard deviation resulting from four replicate $T_1$ measurements.
$^a$Mean pore size as stated by the supplier.
$^b$Pore range as stated by the supplier.

Example 4

Hyperpolarized $^{83}$Kr and $^{129}$Xe NMR Relaxation Measurements of Hydrated Surfaces: Implications for Materials Science and Pulmonary Diagnostics This example examines hydrated surfaces using hp $^{83}$Kr NMR spectroscopy. The longitudinal ($T_1$) relaxation of hp-$^{83}$Kr is sensitive to the presence of adsorbed water on hydrophilic borosilicate and hydrophobic siliconized glass surfaces. The krypton surface relaxation is largely independent of the total gas pressure applied to the materials, and the presented technique is therefore fairly robust. In addition, the relaxational properties of hp-$^{83}$Kr can be 'tuned' by adjusting the composition of the optical pumping gas mixture, further expanding the capabilities of the methods provided herein. This effect may be important for practical applications such as hp-$^{83}$Kr MR imaging and can be achieved without sacrificing signal intensity. Complementary information to that of hp-$^{83}$Kr surface relaxation data can be obtained from hp-$^{129}$Xe relaxation measurements that are sensitive to the presence of paramagnetic surface sites. In contrast to the signal decay of hp-$^{129}$Xe, the longitudinal relaxation of $^{83}$Kr is largely unaffected by paramagnetic impurities, and, in some materials, $^{83}$Kr and $^{129}$Xe show comparable $T_1$ times that are caused by two completely different relaxation mechanisms. Finally, the relaxation times of $^{83}$Kr in contact with bovine lung surfactant coated glass pores that are similar in size to mammalian alveoli are presented. The results indicate that in vivo MR studies are feasible and are capable of providing information about changes in pulmonary surface chemistry that are not currently available by methods known in the art.

In situ and in vivo measurements of surface properties under ambient conditions impose serious experimental challenges, particularly when porous materials and surfaces within opaque media are of interest. Nuclear magnetic resonance (NMR) spectroscopy and magnetic resonance imaging (MRI) require transparence only within the radio frequency regime and can therefore probe surfaces that are obstructed from direct optical or other types of examination. This example combines hyperpolarized (hp) $^{83}$Kr (11.5% natural abundance) and hp-$^{129}$Xe (26.4% natural abundance) NMR longitudinal relaxation ($T_1$) measurements to probe hydrated surfaces under near atmospheric conditions.

Several NMR studies of thermally polarized krypton in materials have made use of the high nuclear spin (I=9/2) and the nuclear quadrupole moment (Q=0.26×10$^{-28}$ m$^2$) of the $^{83}$Kr isotope. The $^{83}$Kr NMR spectrum shows distinct splitting in liquid crystalline phase caused by anisotropy in the environment of the dissolved krypton atoms[1,2]. The NMR line shape of $^{83}$Kr obtained in zeolites is sensitive to pore dimensions, pore geometry, counter-cation charge and, potentially, to long range disorder in the nanoporous materials[3]. The coherent evolution and relaxation behavior of $^{83}$Kr (15.4 MHz resonance frequency at 9.4 T) in these materials are dominated by quadrupolar interactions and can therefore provide valuable information that is complementary to that obtained from the chemical shift observed in NMR spectroscopy with $^{129}$Xe (110.6 MHz resonance frequency at 9.4 T and spin I=1/2)[4-6].

The nuclear spin polarization of $^{129}$Xe can be increased (i.e. hyperpolarized) through rubidium vapor spin exchange optical pumping (RbSEOP)[7] by many orders of magnitude over the Boltzmann equilibrium value of thermally polarized $^{129}$Xe at ambient temperature and high magnetic field strengths. Since its introduction[8], hp-$^{129}$Xe NMR has proved to be a powerful spectroscopic tool and is increasingly used to study porous materials, gas-surface interactions, surface chemistry, biomolecules, chemical reactors, and gas dynamics. Hp-$^{129}$Xe and hp-$^3$He have also led to exciting advances in the MR imaging of airways and materials (see[9-11] for reviews).

The hyperpolarization of the $^{83}$Kr nuclear spin is also possible through RbSEOP[12-14], but the importance of separation of hp-$^{83}$Kr from paramagnetic and highly reactive rubidium vapor was not recognized until the present invention (e.g., hp-$^{83}$Kr NMR spectroscopy see examples 1, 2, 3)[15,16] and MRI[17]). The $T_1$ time of hp-$^{83}$Kr is sensitive to the surfaces of materials in contact with the hp-gas and yields information about the surface-to-volume ratio, chemical composition[16], and temperature[15] of the material-gas interface. The potential of hp-$^{83}$Kr to serve as a surface chemistry sensitive MRI contrast agent is also been demonstrated using siliconized (hydrophobic) and untreated (hydrophilic) glass surfaces.[17]

This example demonstrates that water adsorption on surfaces significantly alters $^{83}$Kr relaxation times. This effect is reversible with water desorption and is observed even for hydrophobic surfaces, suggesting that hp-$^{83}$Kr longitudinal relaxation is capable of probing surface hydration in systems with a wide range of surface chemistries. The methods are applicable for in vivo applications, as reflected by experiments conducted with a commercially available pulmonary surfactant extract (SURVANTA®) applied to hydrated surfaces, and its attendant influence on the $^{83}$Kr $T_1$ time. We demonstrate that the range of relaxation rates can to some extent be 'tuned' by adjusting krypton concentration in the krypton-helium-nitrogen optical pumping gas mixtures. Additionally, information about the presence of paramagnetic surface sites is obtained by comparing hp-$^{83}$Kr and hp-$^{129}$Xe NMR relaxation times.

Probing Surfaces under Near Atmospheric Conditions. Previously, a $^{83}$Kr signal enhancement of more than three orders of magnitude at 9.4 T field strength was obtained through RbSEOP using stopped-flow delivery. After optical pumping, the hp-gas is shuttled from the optical pumping cell to the sample contained within a pre-evacuated detection cell. Vacuum shuttling rather than the relatively slow-flow often used to deliver hp-$^{129}$Xe is necessary because of fast quadrupolar relaxation during gas transfer 15. However, an evacuation of the sample region may alter surface hydration and is obviously ill suited for in situ and in vivo biomedical applications. Additionally, surface hydration changes may be introduced by the hp-noble gas mixtures themselves, which are devoid of water vapor due to reaction with rubidium during the optical pumping process.

FIG. 18 shows an experimental apparatus that simultaneously solves both problems. The hp-gas is vacuum shuttled through pneumatic valves from the pump cell to a storage cell. Subsequently, the gas at 150-200 kPa is released into a water-filled glass container where it displaces water into an attached syringe. The gas, now at least partially saturated with water vapor, loses trace amounts of rubidium carried over from RbSEOP. Finally, the hp-gas is injected into the sample cell through operation of the syringe. Using this procedure, the sample region is only gently ventilated by the gas flow with minimal influence on surface hydration. Further, this procedure produces an acceptable hp-$^{83}$Kr polarization loss of at most 50% compared to one-step vacuum shuttling.

Figure 19:
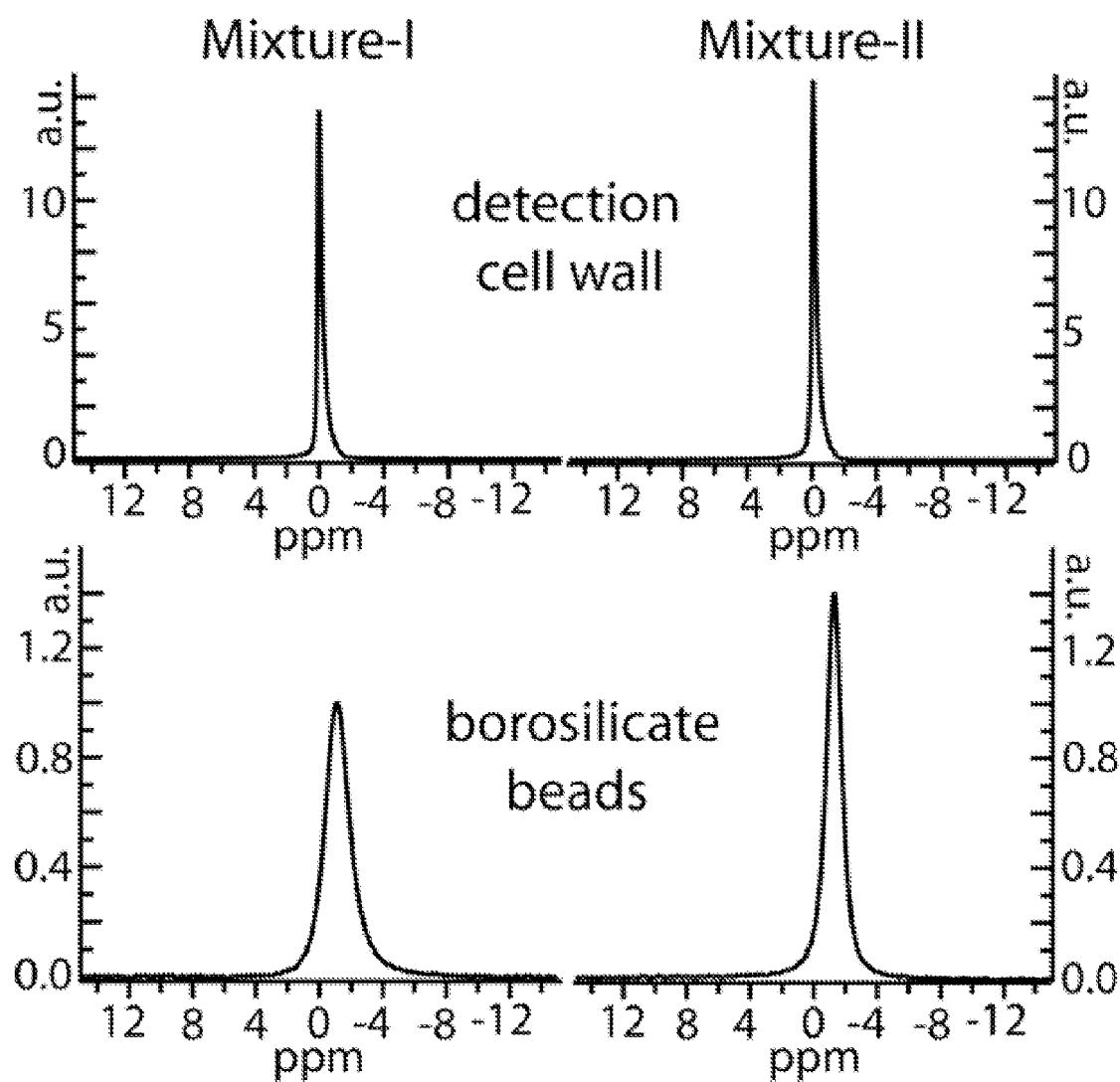
FIG. 19 Hp-$^{83}$Kr spectra at ambient pressure (0.85 kPa). The upper two spectra are obtained from hp-$^{83}$Kr in contact with the detection cell wall only (without beads), and the lower spectra are obtained from hp-$^{83}$Kr in the cell filled with 1 mm diameter, dehydrated borosilicate glass beads. The two spectra on the left hand side of the figure are of hp-$^{83}$Kr from gas mixture-I (95% Kr), and the two on the right are from gas mixture-II (25% Kr). All four spectra are plotted on the same arbitrary scale (a.u.) of peak height. The peak position of mixture-I in the absence of borosilicate beads is used as the zero ppm reference.

The magnitude of the signal intensity resulting from RbSEOP is of great importance for practical MR studies using hp-$^{83}$Kr. For gas mixture-I (95% Kr and 5% N$_2$), the $^{83}$Kr polarization is typically enhanced by a factor of 1000 times that of thermal equilibrium at 9.4 T field strength, a value consistent with prior work using this gas composition[15,17,18]. Optical pumping of mixture-II (25% Kr, 70% He, and 5% N$_2$) yields polarization enhancements up to 4500 times that of thermal equilibrium, which is the highest $^{83}$Kr polarization enhancement yet reported in the literature. The higher polarization achieved using mixture-II is probably due to reduced Rb electron spin relaxation and slower $^{83}$Kr self-relaxation during the RbSEOP process. The improved spin polarization offsets the reduced spin density in the lower krypton concentration mixture. Consequently, the krypton concentration can be varied over a fairly broad range to optimized relaxational properties while maintaining comparably high signal intensities. This is demonstrated in FIG. 19 where the hp-$^{83}$Kr NMR spectra obtained from gas mixture-I and II at constant overall gas pressure yield similar integrated signal intensities.

The integrated signal intensity changes with the sample porosity and is reduced in a glass bead sample by approximately 70% compared to the detection cell without glass beads. This value corresponds well to the 74% filling factor expected for closest packed solid spheres. Bulk magnetic susceptibility is responsible for the −1.1 ppm peak shift observed for the materials-phase (borosilicate beads) peaks compared to the peaks observed from hp-$^{83}$Kr in contact with the detection cell walls only. The line width is broadened from 4.5 Hz for the bulk gas-phase in the cell lacking any bead sample to 24 Hz (gas mixture-I) or 16 Hz (gas mixture-II) in the void spaces of the glass bead sample. The mixture dependent line width can be caused by transverse relaxational processes or coherent quadrupolar interactions on the surface[12,14,19-25], and the magnetic susceptibility of the material may lead to additional line broadening.

Hydrated and Dehydrated Surfaces. In hp-$^{83}$Kr magnetic resonance, the detected signal originates from gas-phase krypton but not from the adsorbed phase. However, a significant and often dominating contribution to the longitudinal relaxation of $^{83}$Kr is caused by quadrupolar interactions during brief periods of surface adsorption. The more negative the krypton surface adsorption enthalpy, the more rapid the resulting surface induced relaxation. As a system where gas-phase relaxation plays an insignificant role due to high surface-to-volume ratio, sample tubes are filled with 1 mm diameter borosilicate glass beads that allow for the study of both surface treatment 16 and hydration levels.

Figure 20:
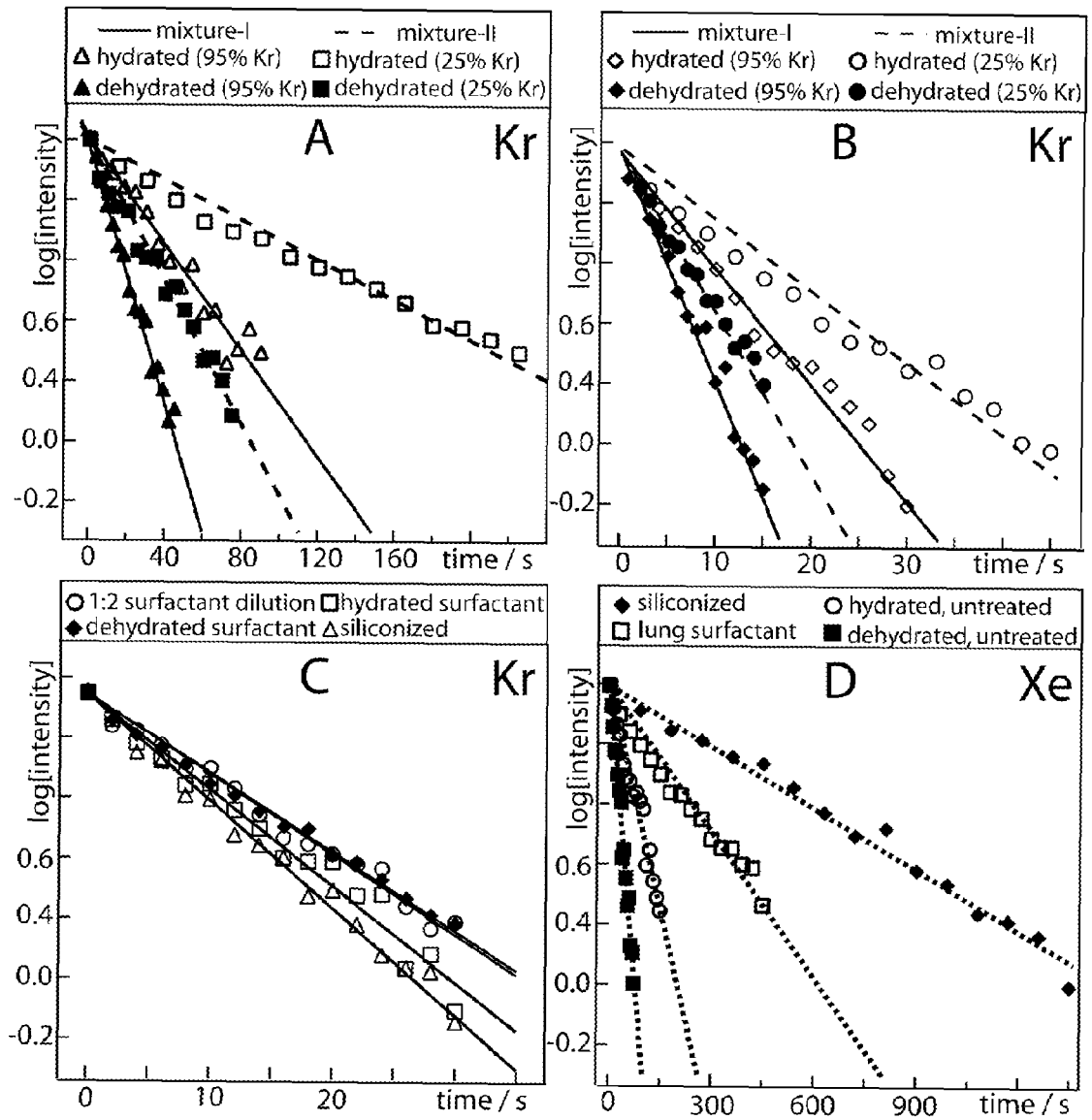
FIG. 20. Signal decay of hp-$^{83}$Kr and hp-$^{129}$Xe in 1 mm borosilicate glass beads. The y-axes represent the $\log_{10}$ of signal intensities measured from medium angle (12°) r.f. pulses applied to single batches of hp-gas. The intensity of the first data point on each curve is scaled to the same value. The x-axes represent the signal acquisition times. Lines are linear fits of the data. (A) Signal decay of hp-$^{83}$Kr in untreated glass beads. (B) Signal decay of hp-$^{83}$Kr signal in siliconized glass beads. (C) Signal decay of hp-$^{83}$Kr (mixture-I only) in bovine lung surfactant coated beads. Here label 'hydrated' refers to surfactant used as supplied by the manufacturer, 'dehydrated' refers to room temperature vacuum dehydration of the surfactant, and 'siliconized' refers to chemical alteration of the support surface. (D) Signal decay of hp-$^{129}$Xe (20% Xe) in glass beads.

FIG. 20 and Table 3 show how strongly the water adsorption on glass surfaces influences krypton relaxation times. At ambient pressure (85.0 kPa) and 289 K, the $^{83}$Kr relaxation from gas mixture-I in untreated borosilicate glass beads is prolonged by 184% from $T_1$=22.1 s for the dehydrated surface to $T_1$=62.8 s when the glass is hydrated by overnight exposure to a saturated water vapor. Similarly, a $T_1$ increase of 173% is observed upon hydration is with mixture-II. Amazingly, a dramatic increase in the longitudinal relaxation time also occurs upon hydration of a highly hydrophobic siliconized glass surface. After overnight hydration of the siliconized beads, the krypton longitudinal relaxation times experience 102% or 114% increases for mixture-I and II respectively.

The hp-$^{83}$Kr relaxation times in both the untreated and siliconized beads show little variation between identically treated replicate samples[26]. In fact, bead samples (both untreated and siliconized) can be thoroughly dehydrated, subsequently placed overnight in a saturated water vapor, and then dehydrated a second time. At each stage, the resulting $T_1$ values are identical within experimental error to those reported Table 5. Note that some of the data in FIG. 20 do not appear to follow mono-exponential behavior exactly (see for instance FIG. 20A, open squares). A possible explanation is multi-exponential $T_1$ relaxational behavior for half-integer spins with I>½. This effect has been investigated previously by multiple quantum filtered NMR spectroscopy of dissolved metal cations such as $^{23}$Na$^+$ in the presence of macromolecules 27 and of $^{131}$Xe in the presence of solid surfaces[21,25].

TABLE 3

$T_1$ values for hp-$^{83}$Kr in contact with hydrated and dehydrated surfaces.

| | Dehydrated Detection Cell[a,b] | Hydrated Detection Cell[a,c] | Dehydrated Untreated Beads[b] | Hydrated Untreated Beads[c] | Dehydrated Siliconized Beads[b] | Hydrated Siliconized Beads[c] |
|---|---|---|---|---|---|---|
| mixture-I: 95% Kr | 104.3 ± 3.3 s | 129.3 ± 2.8 s | 22.1 ± 1.3 s | 62.8 ± 3.3 s | 6.1 ± 0.4 s | 12.3 ± 0.5 s |

TABLE 3-continued

T$_1$ values for hp-$^{83}$Kr in contact with hydrated and dehydrated surfaces.

| | Dehydrated Detection Cell[a,b] | Hydrated Detection Cell[a,c] | Dehydrated Untreated Beads[b] | Hydrated Untreated Beads[c] | Dehydrated Siliconized Beads[b] | Hydrated Siliconized Beads[c] |
|---|---|---|---|---|---|---|
| mixture-I: 95% Kr (P = 0)[d] | 124.0 ± 3.6 s | 161.1 ± 3.2 s | 22.9 ± 1.3 s | 69.5 ± 3.4 s | 6.2 ± 0.4 s | 12.5 ± 0.5 s |
| mixture-II: 25% Kr | 165.5 ± 3.7 s | 202.3 ± 9.0 s | 36.0 ± 5.5 s | 98.4 ± 9.3 s | 8.3 ± 0.8 s | 17.8 ± 0.3 s |
| mixture-II: 25% Kr (P = 0)[d] | 223.4 ± 5.0 s | 296.1 ± 13.5 s | 38.2 ± 5.8 s | 116.3 ± 10.1 s | 8.4 ± 0.8 s | 18.3 ± 0.3 s |

[a]No bead sample present.
[b]Stopped-flow delivery.
[c]Injection delivery (as described in FIG. 18).
[d]T$_1$ extrapolated to zero pressure (See 'Gas-phase and Surface Contributions to $^{83}$Kr Relaxation').

Bovine Lung Surfactant Experiments. The $^{83}$Kr longitudinal relaxation times shown in Table 4 range between approximately T$_1$=13 s and T$_1$=22 s depending on two parameters: the type of support surface used for the Survanta® and the amount of water present. The label 'hydrated surfactant' describes glass beads coated with undiluted Survanta® without subsequent dehydration. To examine the reproducibility of the data, two trials comprising four replicate T$_1$ measurements are performed and yield essentially identical results of T$_1$≈16 s. Dilution, 1:2 of Survanta® with distilled water prolongs the T$_1$ to 21 s. Dehydration of the Survanta® coated beads under vacuum conditions prolongs the T$_1$ to 19 s compared to the hydrated surfactant. An accelerated relaxation, insignificantly different from hp-$^{83}$Kr in contact with the siliconized support surface without surfactant, occurs when using a siliconized support surface.

TABLE 4

T$_1$ values for hp-$^{83}$Kr in contact with bovine lung surfactant.

| | Hydrated (Trial 1)[a] | Hydrated (Trail 2)[a] | 1:2 Dilution (Surfactant: Water)[a] | Dehydrated[b] | Hydrated (Siliconized Support)[a] |
|---|---|---|---|---|---|
| 95% Kr | 15.7 ± 0.5 s | 16.2 ± 1.1 s | 20.8 ± 2.1 s | 19.3 ± 0.2 s | 12.9 ± 0.9 s |
| 95% Kr (P = 0)[c] | 16.1 ± 0.5 s | 16.4 ± 1.1 s | 21.7 ± 2.1 s | 19.9 ± 0.3 s | 13.2 ± 0.9 s |

[a]Injection delivery.
[b]Stopped-flow delivery.
[c]T$_1$ extrapolated to zero pressure Hyperpolarized $^{129}$Xe Relaxation Measurements. When $^{129}$Xe is exposed to a glass surface, its longitudinal relaxation rate can be accelerated due to the presence of paramagnetic impurities close to the surface. This is seen in Table 5 for dehydrated glass beads with T$_1$=43 s, a relaxation time that is quite short for gas-phase $^{129}$Xe, which in macroscopic glass containers, at near ambient pressures, and 1.5 T can be as long as 13,200 s[28]. Hydrating the beads either obstructs xenon contact with the paramagnetic sites or reduces the overall xenon surface coverage, thus prolonging the relaxation time to T$_1$=103 s. Siliconizing the surface[29-31] dramatically increases the $^{129}$Xe T$_1$ in sharp contrast to the effect seen with krypton[17]. A similar effect is seen for the beads coated with lung surfactant, indicating that this treatment too obstructs a significant fraction of the paramagnetic surface sites.

TABLE 5

T$_1$ values for hp-$^{129}$Xe[a] in contact with borosilicate glass beads.

| Dehydrated Untreated Beads[b] | Hydrated Untreated Beads[c] | Surfactant Coated Beads[c] | Dehydrated Siliconized Beads[b] |
|---|---|---|---|
| 43 ± 3 s | 103 ± 8 s | 420 ± 27 s | 773 ± 9 s |

[a]20% Xe, 5% N$_2$, and 70% He.
[b]Stopped-flow delivery.
[c]Injection delivery.

Gas-phase and Surface Contributions to $^{83}$Kr Relaxation. In addition to the observed T$_1$ times, Tables 3 and 4 list the expected relaxation times for krypton gas mixtures extrapolated to zero pressure. In early work on gas-phase $^{83}$Kr longitudinal relaxation, Brinkmann and Kuhn[32] found that the relaxation rate of krypton is linearly dependent on the krypton density. This linear dependence is due to spin-rotation interactions caused by binary krypton-krypton collisions, the frequency of which increases linearly with gas density. Their experiments were conducted at gas densities high enough to exclude surface relaxation on sample cell walls. The resulting empirical expression for the relaxation rate as a function of density is:

$$\frac{1}{T_1} = [(2.13 \pm 0.05) \times 10^{-3} \text{cm}^3/\text{mol} \cdot s] \times \rho \quad (3)$$

where ρ is the gas density in amagat (1 amagat=4.4×10$^{-5}$ mol/cm$^3$).

At densities low enough for the Ideal Gas Law to apply, a linear dependence of relaxation rate upon gas pressure is expected, and it can be assumed that 1 amagat yields a pressure of approximately 100 kPa. However, in these low density and pressure regimes, wall relaxation becomes significant, and the relaxation rate takes the form $$\frac{1}{T_1} = R_w + R_g(P) \quad (4)$$

where $R_w$ is the wall-induced relaxation rate, which is expected to be pressure independent, and $R_g(P)$ is the pressure dependent gas-phase relaxation rate. (Note that this equation neglects a potential small pressure independent contribution due to spin-rotation coupling in bound, gas-phase $^{83}$Kr—Kr van der Waals molecules[33]

Figure 21:
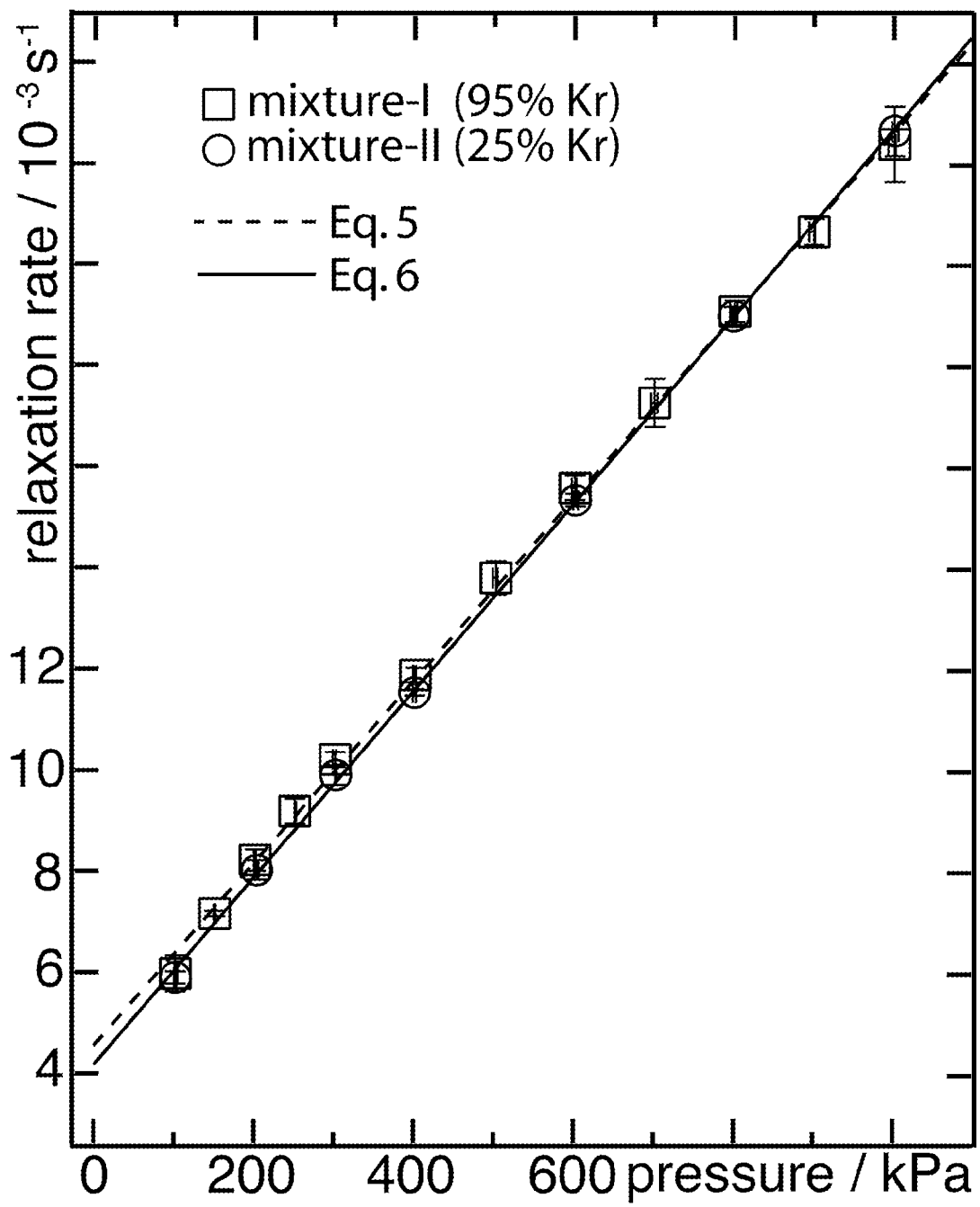
FIG. 21. Pressure dependence of hp-$^{83}$Kr longitudinal relaxation rates. X-axis error bars represent the total pressure range contributing to each data point. The linear fits of the data and the accompanying fitting errors are presented as Eq. 3 (mixture-I) and Eq. 6 (mixture-II) in the text.

FIG. 21 shows the pressure dependence of the $^{83}$Kr longitudinal relaxation rate when in contact with detection cell walls only. Both mixtures display the expected linear pressure dependence and non-zero y-intercepts corresponding to $R_w$. Eqs. 5 and 6 represent linear least square fits of the relaxation rates as a function of pressure, P, (in kPa) for gas mixture-I (95% Kr) and mixture-II (25% Kr) respectively.

$$\frac{1}{T_1} = [(1.79 \pm 0.02) \times 10^{-5} s^{-1} kPa^{-1}] \times P + (4.5 \pm 0.1) \times 10^{-3} s^{-1} \quad (5)$$

$$\frac{1}{T_1} = [(1.84 \pm 0.01) \times 10^{-5} s^{-1} kPa^{-1}] \times P + (4.17 \pm 0.08) \times 10^{-3} s^{-1} \quad (6)$$

Within the approximation that 1 amagat produces a pressure of 100 kPa, the slopes of these lines are in reasonably good agreement with the results of Brinkmann and Kuhn.

Although the surface area and composition of the samples determine the y-intercepts, the slopes of the lines depend only on the gas composition and are therefore expected to be sample independent. Thus, the value of $R_g(P)$ can be calculated and then subtracted from the observed relaxation rate. The pressure independent (P=0) $T_1$ values in Tables 3 and 4 are calculated using the slopes from Eqs. 5 and 6 and exclude contributions originating from gas-phase collisions. In the hydrated samples a small amount of water vapor is also present in the gas mixture, but its influence on the pressure dependent component of the relaxation is negligible.

Because the surface coverage of noble gasses at room temperature and near atmospheric pressure is low, gas adsorption is described by the linear portion of the Langmuir isotherm. Hence, the ratio of surface adsorbed to gas-phase krypton atoms stays constant as the pressure is moderately altered. The contribution to the relaxation arising from the surface is therefore also constant. For the surface-to-volume ratios in the studied borosilicate bead samples, the $^{83}$Kr relaxation is entirely dominated by surface processes, and the data do not deviate significantly from the extrapolated zero pressure values.

Figure 22:
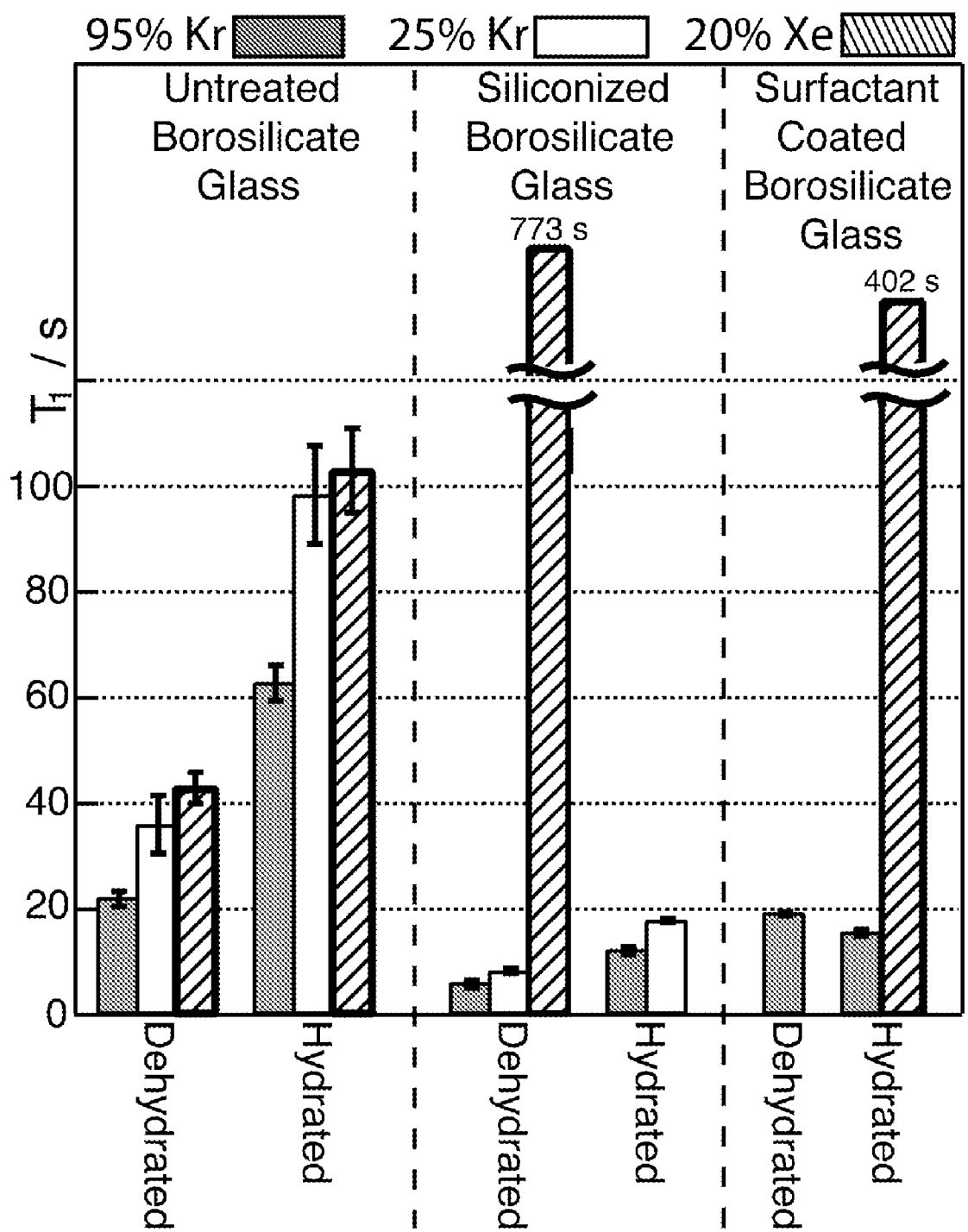
FIG. 22. $T_1$ values of hp-$^{83}$Kr and $^{129}$Xe in contact with 1 mm diameter borosilicate glass bead samples. The error bars are omitted from data for hp-$^{129}$Xe in contact with siliconized and surfactant coated surfaces but are reported in Table 3.

Paramagnetic Relaxation of $^{83}$Kr: Comparison with Hp-$^{129}$Xe. FIG. 22 provides a comparison of the experimental $T_1$ data for hp-$^{83}$Kr (Tables 3 and 4) and hp-$^{129}$Xe (Table 5). Interestingly, the $^{83}$Kr relaxation times from the 25% krypton gas mixture in contact with untreated bead samples are identical within experimental error to those obtained from hp-$^{129}$Xe for both the dehydrated and hydrated glass surfaces. The similarity of these values is coincidental and results from a combined effect of the surface chemistry and void-space geometry. In the presence of paramagnetic surface sites, the $^{129}$Xe relaxation is dominated by paramagnetic relaxation, and shielding the $^{129}$Xe from these sites by siliconizing the surface increases the $T_1$. In contrast, the $^{83}$Kr relaxation is dominated by quadrupolar contributions that increase in the presence of the nonpolar siliconized surface. Further, the $^{83}$Kr relaxation is much less affected by paramagnetic sites than the $^{129}$Xe relaxation due to the 7.2 times smaller gyro-magnetic ratio, $\gamma_{Nuc}$, of the $^3$Kr nucleus, because paramagnetic relaxation follows a $T_1 \propto \gamma_{Nuc}^{-2}$ dependence[34]. The 1.9 Å van der Waals radius of krypton is only slightly smaller than the 2.2 Å radius of xenon and cannot offset the effect caused by the small $\gamma_{Nuc}$ despite the $T_1 \propto r^6$ dependence on distance, r, for paramagnetic driven relaxation. In addition, the smaller krypton electron cloud will lead to decreased surface affinity and, therefore, to reduced contact time with the paramagnetic sites. Similar arguments explain why the presence of 20% paramagnetic gas-phase oxygen reduced the $^{83}$Kr $T_1$ time in a desiccated canine lung specimen by only 20%[17]. The low $^{83}$Kr gyromagnetic ratio, because of its inherent insensitivity to paramagnetic relaxation, can actually be advantageous for some applications of this gas, provided sufficiently high signal intensity is generated through the RbSEOP process.

Effects of Krypton Concentration on $T_1$ Relaxation. An important point for practical MR studies with hp-$^{83}$Kr is that the relaxation time in porous structures can be adjusted by changing the composition of the krypton gas mixture. Diluting the krypton leads to prolonged relaxation times, most likely because of competitive surface adsorption of the other gasses in the mixture. The $^{83}$Kr relaxation in porous materials is, however, relatively insensitive to changes in the total gas pressure if the surface-to-volume ratio is large enough to be the dominant source of relaxation (see 'Hydrated and Dehydrated Surfaces'). In addition to the influence of the krypton concentration on relaxation reported here, we show that lower magnetic field strengths lead to increased $^{83}$Kr relaxation rates[15]. The capability to adjust the relaxation rate by manipulating various physical interactions provides experimental adaptability for practical requirements such as in vivo hp-$^{83}$Kr MRI for pulmonary diagnostics, where $T_1$ values on the order of seconds to tens of seconds are preferred. Relaxation times substantially below 3 s are problematic because of the duration of the inhaling process. Relaxation times in excess of 30 s would probably not allow for sufficient contrast because of limitations in breath holding by patients and because of competing relaxation caused by paramagnetic oxygen at prolonged timescales.

The effect of surface hydration on the $^{83}$Kr longitudinal relaxation time is reminiscent of previous work with liquefied, thermally polarized $^{131}$Xe (spin I=3/2) in aerogels where the observed relaxation times were $T_1$=11.2 ms (hydrated) and 3.6 ms (dehydrated)[25,35]. Due to the fractal geometry of the aerogels in the 10 to 50 nm regime and the large water uptake (up to 30% of the aerogel dry weight) a substantial change in the surface morphology is the likely cause for the observed changes that also included alterations in the NMR line width and multiple quantum filtered $^{131}$Xe NMR spectra.

The effect reported in this contribution is observed with gas-phase hp-$^{83}$Kr on glass bead surfaces with surface-to-volume ratios that are orders of magnitude smaller than that of aerogels. Typically one can apply this technique to surface to volume ratios approximately between A/V=10000 cm$^{-1}$ to 0.001 cm$^{-1}$. The $^{83}$Kr relaxation time is even sensitive to water uptake on the surface of detection cell wall (13.5 mm i.d.) in the absence of a glass beads sample (see Table 3), which has a surface-to-volume ratio approximately two orders of magnitude lower than the bead sample. Owing to this much smaller surface-to-volume ratio, gas-phase relaxation noticeably contributes to the overall relaxation time. A $^{83}$Kr $T_1$ of 165.5 s is observed for gas mixture-II at ambient pressure when in contact with a dehydrated cell wall and is prolonged by 22% to 202.3 s in contact with a hydrated cell wall. Interpolated to zero pressure, the relaxation times are $T_1$=223.4 s and $T_1$=269.1 s for the dehydrated and hydrated container walls respectively. A similar trend is also observed for gas mixture-I.

The sensitivity of hp-$^{83}$Kr relaxation to adsorbed surface water allows for measurements of surface hydration in dilute gas-phase at various concentrations. It also allows for measurements in systems with a wide range of low surface-to-volume ratios and small overall surface areas. A crucial result is the strong effect of water vapor on $^{83}$Kr relaxation caused by siliconized (hydrophobic) surfaces. It is possible that the siliconizing of the surface is incomplete and that some untreated glass is still exposed to the gas-phase. However, the long $^{129}$Xe $T_1$ in the siliconized beads indicates that the overall glass surface exposed to the noble gasses is small and that the adsorption affinity of the surface upon hydration plays an important role in extending the $^{83}$Kr relaxation time.

Lung Surfactant Studies. In vivo NMR spectroscopy and MR imaging for pulmonary diagnostics are potential applications for hp-$^{83}$Kr because of the sensitivity of $^{83}$Kr relaxation to surface chemistry in porous materials. As a model in vitro system that is chemically similar to the interior of the mammalian pulmonary system, the commercially available bovine pulmonary extract Survanta® is used to coat probed surfaces. Survanta® is used to treat premature infants with Respiratory Distress Syndrome (RDS) by lowering the surface tension on alveolar surfaces and, thus, stabilizing the alveoli against collapse. A parameter of potential importance for in vivo and in situ lung studies is the relative humidity of the gas mixture introduced. Under normal circumstances, the relative humidity inside the mammalian lung approaches 100%[36]. Even for in vitro experiments, the relative humidity is potentially important as it has been shown to influence lung surfactant adsorption kinetics at the air-water interface[37]. To minimize perturbations caused by the addition of the hp-gas mixtures, an injection delivery method is used for all relaxation measurements involving hydrated lung surfactant.

As a support for the bovine lung extract, 1 mm untreated and siliconized borosilicate glass beads are selected because the void spaces formed by tightly packing the beads are similar in size to mammalian alveoli (i.e. around 200 microns in human lungs 38). Hydrated surfactant (i.e. Survanta® used as supplied by the manufacturer) appears to completely coat the glass beads and therefore strongly prolongs $^{129}$Xe relaxation times (see FIG. 22 and Table 5). The $^{83}$Kr longitudinal relaxation time of $T_1$=16 s observed for krypton in the surfactant coated beads is significantly shorter than the $T_1$=62.8 s (mixture-I) observed in untreated, hydrated glass beads. The observation of relaxation times on the order of 15 s is an important result because it suggests that similar relaxation times may be observed in vivo. Diluting the surfactant with distilled water (1:2) produces prolonged relaxation times of around $T_1$=20 s, perhaps due to a decreased concentration of the non-polar surfactant components. (Note that dehydration produces a similar effect as is shown in Table 4). The $^{83}$Kr relaxation in in vivo pulmonary studies will also depend on changes in the surface-to-volume ratios since the surfactant concentration also determines the alveolar dimensions. This sensitivity to surface chemistry could be valuable for understanding certain pulmonary diseases, particularly if used in conjunction with techniques such as apparent diffusion contrast (ADC) in hp-$^3$He MRI that provide independent information about alveolar size.[39]

This example provides a direct comparison of $^{129}$Xe and $^{83}$Kr longitudinal relaxation in porous materials. In stark contrast to $^{129}$Xe, the relaxation of $^{83}$Kr is largely unaffected by small amounts of paramagnetic impurities. The longitudinal nuclear spin relaxation of hyperpolarized $^{83}$Kr provides the capability to sense water adsorption on untreated, hydrophilic and siliconized, strongly hydrophobic glass surfaces. The method does not require vacuum conditions or optical transparency and allows for measurements under near atmospheric conditions in systems with low surface-to-volume ratios. The ability to probe surfaces and sense water adsorption has numerous applications, encompassing biological tissues and non-biological surfaces such as evaluation or quality control of porous surfaces where water distribution or isolation is important (e.g., batteries, wafer manufacturing, pharmaceutical products, food products etc.).

Surfaces coated with bovine pulmonary extract produce $^{83}$Kr$T_1$ times that are of reasonable lengths for medical applications and sensitive to changes in the chemical composition of the surfactant. The results indicate the methods and devices provided herein are applicable for in vivo hp-$^{83}$Kr MRI diagnosis of various forms of acute lung injury (ALI), including the most severe form, acute respiratory distress syndrome (ARDS)[40], which are characterized by alteration in the lipid and protein composition of the pulmonary surfactant system[41,42], alveolar fluid levels[43], and alveolar size[44]. The longitudinal relaxation of hp-$^{83}$Kr is sensitive to all of these changes and, in concert with biochemical and biophysical markers[45], provides a powerful tool for early diagnosis of ALI in at risk individuals, monitoring the effectiveness of ALI therapies, and developing improved surfactant therapies.[46]

Examples for hp-$^{83}$Kr to detect further chemical changes in the adsorbed surface water include sensing, for example, effective pH and ionic strength. Additionally, materials science applications often require an analysis and understanding with respect to a quantification of water uptake by various materials and their surfaces. Accordingly, comparing krypton relaxation data with more traditional measures of macroscopic surface wettability[47,48] such as contact angle measurements with sessile water droplets, and examining the influence of alternate adsorbing molecules (e.g. short chain alcohols) on relaxation provides further surface probing capability. Potential applications of this technique are the water content analysis of solid chemicals, pharmaceutical products, and food materials that otherwise rely on Karl Fischer water titrations that can be complicated by side reactions and reagent instability[49]. In situ hp-$^{83}$Kr MR imaging could also potentially monitor the water distribution in porous fuel cell cathodes that require careful engineering of composite hydrophobic and hydrophilic surface sites to allow optimized water transport without flooding.[50] and has a variety of uses in quality control and process management.

We also demonstrate that the hp-$^{83}$Kr relaxation is dependent on the krypton concentration in the gas mixtures used. This permits tuning and optimizing the range of the relaxation times for particular applications. For a reasonably broad range of gas compositions, the ability to tune the relaxational properties of the gas mixture is achieved without sacrificing signal intensity.

Methods: NMR Measurements and Instrumentation. Experiments are performed on a Chemagnetics CMX II 400 MHz NMR spectrometer in a 9.4 T wide-bore (89 mm) superconducting magnet. All NMR data are obtained using custom-built, gas-flow probes tuned to the frequency of either $^{83}$Kr (15.4 MHz) or $^{129}$Xe (110.6 MHz). $T_1$ values from hp-gasses are calculated by nonlinear least squares fitting of the NMR signal as a function of time and number of applied medium flip angle (~12°) r.f. pulses. The 90° pulses for $^{83}$Kr (63 μs) and $^{129}$Xe (47 μs) are determined under continuous-flow optical pumping conditions similar to those used in earlier work[15,51]. All $T_1$ values reported are the averages of four to eight replicate measurements and, unless otherwise indicated, are conducted at 85.0±0.5 kPa (i.e. ambient pressure at the laboratory elevation of 1500 m). The errors reported are the standard deviations resulting from those replicate measurements. The signal enhancements reported for hp-$^{83}$Kr are referenced to the thermal signal obtained from a sample containing 500 kPa natural abundance Kr and 100 kPa $O_2$.

Optical Pumping of $^{83}$Kr and $^{129}$Xe. All gas mixtures in this work are produced from research grade krypton (99.995%, natural abundance), xenon (99.995%, natural abundance), nitrogen (99.9997%), and helium (99.9999%) (Airgas, Radnor, Pa.). Optical pumping is performed in a cylindrical Pyrex cell (length=125 mm, i.d.=24 mm). The gas mixtures consist of 95% Kr and 5% $N_2$ (mixture-I); 25% Kr, 5% $N_2$, and 70% He (mixture-II); or 20% Xe, 5% $N_2$, and 75% He. $N_2$ is added to the mixtures for radiation quenching purposes[51]. The pump cell, containing approximately 1 g of rubidium (99.75%; Alfa Aesar, Ward Hill, Mass.), is housed in a quartz and aluminum oven to maintain even heating (438±5 K for $^{83}$Kr and 393±5 K for $^{129}$Xe). The pump cell is maintained above ambient pressure (150-200 kPa) to avoid pump cell contamination. Light (794.7 nm) from a 30 W Coherent FAP diode-array laser system (line width 2 nm) is directed via fiber optic coupling cables through a circular polarizer onto the pumping cell. After the light passes through the fiber optics and the polarizer, the power is reduced to approximately 20 W. The magnetic field needed for RbSEOP is provided by the fringe field of the superconducting magnet (0.05 T). Rb vapor is separated from the hp-gas mixtures by an air-cooled trap at the outlet to the pump cell and a glass wool filter placed directly before the sample region.

Delivery of Optically Pumped Gasses. In the stopped-flow experiments $^{83}$Kr used to measure $T_1$ values in the dehydrated samples, polarization is allowed to build several minutes in the pump cell. During this time the detection cell (length=50 mm, i.d 12=mm) is evacuated to less than 0.1 kPa. Following polarization, the hp-gas is rapidly transferred from the pump cell to the detection cell by pressure equalization. In the injection delivery method (see FIG. 18), polarizations builds for several minutes and then the hp-gas mixture is transferred by pressure equalization into an evacuated Pyrex storage cell (length=80 mm, i.d.=24 mm). From the storage cell, the hp-gas mixture is transferred to a Pyrex injection cell (length=150 mm, i.d.=24 mm) containing distilled water and a thermally polarized gas mixture having the same composition as the hp-gas mixture. During this transfer from the storage cell, approximately 50 mL of distilled water is displaced into the attached syringe. The syringe then forces the distilled water back into the injection cell and, thus, the hp-gas mixture into the sample region for detection. To limit the exposure of hp-gasses to $O_2$, He gas is bubbled through the water in the injection cell for several minutes prior to conducting injection delivery experiments. The apparatus is then thoroughly flushed with nitrogen gas prior to filling the injection and detection cells with the thermally polarized noble gas mixture. Between experiments, the storage cell is repeatedly filled with dry $N_2$ and evacuated to reduce pump cell contamination by water vapor.

Preparation of Borosilicate Glass Beads. Untreated, 1.0 mm diameter, borosilicate glass beads (Biospec Products, Inc., Bartlesville, Okla.) are degassed overnight at a temperature of 473 K and a pressure of less than 0.1 Pa and then stored under dry nitrogen until use (stopped-flow delivery) or stored overnight in a saturated water vapor (injection delivery). Siliconized beads are prepared as described elsewhere[16,17]. Following surface treatment, the siliconized beads are hydrated or dehydrated using the same procedure as is used for the untreated beads.

Storage and Application of Lung Surfactant. A 4 mL vial of SURVANTA® (Ross Products Division, Abbott Laboratories, Columbus, Ohio), a suspension of bovine pulmonary surfactant extract, is stored under refrigerated conditions in accordance with the manufactures instructions prior to use. The chemical composition of Survanta® (as stated by the manufacturer) is primarily that of natural bovine lung extract and comprises phospholipids (25 mg/mL), triglycerides (0.5-1.75 mg/mL), free fatty acids (1.4-3.5 mg/mL), and surfactant associated proteins (>1 mg/mL) suspended in a 0.9% aqueous NaCl solution. Before applying the suspension to the various bead samples, SURVANTA® is removed from refrigeration and warmed to room temperature. A sterile syringe is then used to remove a portion of the suspension through a rubber septum. The beads are coated with approximately 0.3 mL SURVANTA® by gently rolling the beads in a few droplets of surfactant mixture until the glass surface is visibly covered. For one sample, the surfactant extract is diluted 1:2 with distilled water but, otherwise, treated identically. For the dehydrated lung surfactant sample, untreated beads are coated in an identical manner to that used for the hydrated samples, transferred to the detection cell, and dried overnight at room temperature under a 0.1 Pa vacuum.

(1) Ingman, P.; Jokisaari, J.; Diehl, P. *J. Magn. Reson.* 1991, 92, 163-169.

(2) Jokisaari, J.; Ingman, P.; Lounila, J.; Pukkinen, O.; Diehl, P.; Muenster, O. *Mol. Phys.* 1993, 78, 41-54.

(3) Horton-Garcia, C. F.; Pavlovskaya, G. E.; Meersmann, T. *J. Am. Chem. Soc.* 2005, 127, 1958-1962.

(4) Ito, T.; Fraissard, J. *J. Chem. Phys.* 1982, 76, 5225-5229.

(5) Ratcliffe, C. I. *Annu. Rep. NMR Spectrosc.* 1998, 36, 123-221.

(6) Springuel-Huet, M. A.; Bonardet, J. L.; Gedeon, A.; Fraissard, J. *Magn. Reson. Chem.* 1999, 37, S1-S13.

(7) Walker, T. G.; Happer, W. *Rev. Mod. Phys.* 1997, 69, 629-642.

(8) Raftery, D.; Long, H.; Meersmann, T.; Grandinetti, P. J.; Reven, L.; Pines, A. *Phys. Rev. Lett.* 1991, 66, 584-587.

(9) Goodson, B. M. *J. Magn. Reson.* 2002, 155, 157-216.

(10) Stapf, S.; Han, S. I., Eds. *Nuclear Magnetic Resonance Imaging in Chemical Engineering*; Wiley-VCH: Weinheim, Germany, 2005.

(11) Raftery, D. *Annu. Rep. NMR Spectrosc.* 2006, 57, 205-207.

(12) Volk, C. H.; Mark, J. G.; Grover, B. C. *Phys. Rev. A* 1979, 20, 2381-2388.

(13) Schaefer, S. R.; Cates, G. D.; Happer, W. *Phys. Rev. A* 1990, 41, 6063-6070.

(14) Butscher, R.; Wackerle, G.; Mehring, M. *Chem. Phys. Lett.* 1996, 249, 444-450.

(15) Cleveland, Z. I.; Pavlovskaya, G. E.; Stupic, K. F.; LeNoir, C. F.; Meersmann, T. *J. Chem. Phys.* 2006, 124, 044312.

(16) Stupic, K. F.; Cleveland, Z. I.; Pavlovskaya, G. E.; Meersmann, T. *Solid. State. Nucl. Mag.* 2006, 29, 79-84.

(17) Pavlovskaya, G. E.; Cleveland, Z. I.; Stupic, K. F.; Meersmann, T. *Proc. Nat. Acad. Sci.* 2005, 102, 18275-18279.

(18) Although the data in Table 3 agree qualitatively with earlier work involving similarly treated dehydrated samples (ref. 16), the values in the current report are systematically lower by about 30%. The exact cause of this variation is not investigated, but a probable explanation is a difference in the average bead surface area in the two studies. The glass beads are selected for their ability to undergo surface modifying reactions not bead-to-bead uniformity in size and shape. The beads are described as 1 mm diameter spheres; however, visual inspection reveals a distribution in the size, shape, and in surface features such as corrugation and cracks.

(19) Kwon, T. M.; Mark, J. G.; Volk, C. H. *Phys. Rev. A* 1981, 24, 1894-1903.

(20) Raftery, D.; Long, H. W.; Shykind, D.; Grandinetti, P. J.; Pines, A. *Phys. Rev. A* 1994, 50, 567-574.

(21) Meersmann, T.; Smith, S. A.; Bodenhausen, G. *Phys. Rev. Lett.* 1998, 80, 1398-1401.

(22) Deschamps, M.; Burghardt, I.; Derouet, C.; Bodenhausen, G.; Belkic, D. *J. Chem. Phys.* 2000, 113, 1630-1640.

(23) Moudrakovski, I. L.; Ratcliffe, C. I.; Ripmeester, J. A. *J. Am. Chem. Soc.* 2001, 123, 2066-2067.

(24) Millot, Y.; Man, P. P.; Springuel-Huet, M. A.; Fraissard, J. *Stud. Suff. Sci. Catal.* 2001, 135.

(25) Meersmann, T.; Deschamps, M.; Bodenhausen, G. *J. Am. Chem. Soc.* 2001, 123, 941-945.

(26) Higher polarizations have been achieved for this gas mixture in earlier work (ref. 15) by using a 60 W laser system. For the relaxation measurements and NMR spectra reported in this work, a 30 W laser system is found to yield sufficiently high signal intensities.

(27) Jaccard, G.; Wimperis, S.; Bodenhausen, G. *J. Chem. Phys.* 1986, 85, 6282-6293.

(28) Pfeffer, M.; Lutz, 0. *J. Magn. Reson. Ser. A* 1994, 108, 106-109.

(29) Driehuys, B.; Cates, G. D.; Happer, W. *Phys. Rev. Lett.* 1995, 74, 4943-4946.

(30) Breeze, S. R.; Lang, S.; Moudrakovski, I.; Ratcliffe, C. I.; Ripmeester, J. A.; Santyr, G.; Simard, B.; Zuger, I. *J. Appl. Phys.* 2000, 87, 8013-8017.

(31) Jacob, R. E.; Driehuys, B.; Saam, B. *Chem. Phys. Lett.* 2003, 370, 261-267.

(32) Brinkmann, D.; Kuhn, D. *Phys. Rev. A* 1980, 21, 163-167.

(33) Chann, B.; Nelson, I. A.; Anderson, L. W.; Driehuys, B.; Walker, T. G. *Phys. Rev. Lett.* 2002, 88, -.

(34) Abragam, A. *The Principles of Nuclear Magnetism*; Oxford University Press: Oxford, UK, 1961.

(35) Pavlovskaya, G.; Blue, A. K.; Gibbs, S. J.; Haake, M.; Cros, F.; Malier, L.; Meersmann, T. *J. Magn. Reson.* 1999, 137, 258-264.

(36) Schmidt-Nielsen, K. *Animal Physiology: Adaptation and Environment*; 5th ed. ed.; Cambridge University Press: Cambridge, UK, 1997.

(37) Zuo, Y. Y.; Gitiafroz, R.; Acosta, E.; Policova, Z.; Cox, P. N.; Hair, M. L.; Neumann, A. W. *Langmuir* 2005, 21, 10593-10601.

(38) Ochs, M.; Nyengaard, L. R.; Jung, A.; Knudsen, L.; Voigt, M.; Wahlers, T.; Richter, J.; Gundersen, H. J. G. *Am. J. Resp. Crit. Care.* 2004, 169, 120-124.

(39) Yablonskiy, D. A.; Sukstanskii, A. L.; Leawoods, J. C.; Gierada, D. S.; Bretthorst, G. L.; Lefrak, S. S.; Cooper, J. D.; Conradi, M. S. *Proc. Nat. Acad. Sci.* 2002, 99, 3111-3116.

(40) Repine, J. E. *Lancet* 1992, 339, 466-469.

(41) Schmidt, R.; Meier, U.; Yabut-Perez, M.; Walmrath, D.; Grimminger, F.; Seeger, W.; Gunther, A. *Am. J. Resp. Crit. Care.* 2001, 163, 95-100.

(42) Cochrane, C. G. *Am. J. Physiol., Lung Cell. Molec. Physiol.* 2005, 288, L608-L609.

(43) Guidot, D. M.; Folkesson, H. G.; Jain, L.; Sznajder, J. I.; Pittet, J.-F.; Matthay, M. A. *Am. J. Physiol. Lung Cell. Mol. Physiol.* 2006, 291, L301-L306.

(44) Schiller, H. J.; McCann, U. G.; Carney, D. E.; Gatto, L. A.; Steinberg, J. M.; Nieman, G. F. *Crit. Care Med.* 2001, 29, 1049-1055.

(45) Connelly, K. G.; Repine, J. E. *Annu. Rev. Med.* 1997, 48, 429-445.

(46) Cochrane, C. G.; Revak, S. D. *Chest* 1999, 116, 85S-86S.

(47) Adamson, A. W.; Gast, A. P. *Physical Chemistry of Surfaces*; John Wiley & Sons, Inc.: NewYork, 1997.

(48) Fuji, M.; Fujimori, H.; Takei, T.; Watanabe, T.; Chikazawa, M. *J. Phys. Chem. B.* 1998, 102, 10498-10504.

(49) Grunke, S. *Food Control* 2001, 12, 419-426.

(50) Zhang, F. Y.; Yang, X. G.; Wang, C. Y. *J. Electrochem. Soc.* 2006, 153, A225-A232.

(51) Mortuza, M. G.; Anala, S.; Pavlovskaya, G. E.; Dieken, T. J.; Meersmann, T. *J. Chem. Phys.* 2003, 118, 1581-1584.

Example 5

Detection of Tobacco Smoke Deposition by Hyperpolarized Krypton-83 MRI

This example shows tobacco smoke deposition on surfaces significantly alters the longitudinal ($T_1$) relaxation of hyperpolarized (hp) $^{83}$Kr when the krypton gas is brought into contact with the surfaces. After pre-treatment with tobacco smoke, an acceleration of the hp-$^{83}$Kr self-relaxation is observed for model glass surfaces and for surfaces coated with bovine lung surfactant extract. However, this effect is not found in similar experiments with hp-$^{129}$Xe. The $^{83}$Kr $T_1$ sensitivity for smoke deposition is not caused by paramagnetic species, but rather by high adsorption affinity of the noble gas for tobacco smoke deposits. In contrast to $^{129}$Xe (spin I=½), the noble gas isotope $^{83}$Kr (spin I=9/2), experiences quadrupolar relaxation that is particularly sensitive to surface adsorption processes. The $^{83}$Kr $T_1$ differences between smoke-treated and untreated surfaces are sufficient to produce a clear contrast in variable flip angle FLASH hp-$^{83}$Kr MRI, thus allowing for the visualization of tobacco smoke deposition. The contrast can be produced under near-ambient humidity, pressure, and temperature conditions, suggesting a potential use of hp-$^{83}$Kr as a contrast agent for in vivo MRI of airways to assess lung surface status, as well as pinpointing precise locations of lung surface requiring further investigation.

Exposure to tobacco smoke is known to cause emphysema[1], lung cancer,[2] and cardiovascular disease[3] in cigarette smokers. Because of the deleterious impact on human health, the deposition of tobacco smoke constituents in the human respiratory tract is the subject of a great deal of biomedical research[4-6]. For instance, a growing body of work suggests that both the type and location of smoking related cancers are influenced by the manner in which cigarettes are smoked[7,8]. This dependence presumably results from differences in smoke particulate deposition within the respiratory tract.

Measurement of the differences between inhaled and exhaled smoke particulate matter[4,9] provides information about the amount of material deposited in the respiratory tract but does not address medically important issues such the location of deposited materials or the rate at which the body removes the materials from the lungs. Mathematical models of particulate deposition[10,11] in the respiratory tract attempt to resolve these issues but currently lack experimental validation. Although studies using radioactively labeled tracer compounds have attempted to evaluate regional smoke particulate deposition and clearance, these attempts have led to conflicting results[5]. In general, the current understanding of diseases cause by smoking could be improved by developing techniques to visualize the deposition and clearance of tobacco smoke particulate matter from the respiratory tract.

As discussed herein, we have introduced hyperpolarized (hp) $^{83}$Kr as a new MRI contrast agent that allows investigations of surfaces under near-ambient pressure and temperature conditions[12]. The longitudinal ($T_1$) relaxation observed in magnetic resonance experiments with the stable krypton isotope $^{83}$Kr (natural abundance 11.5%, nuclear spin I=9/2) is shown to be highly dependent on the nature of the surfaces in contact with the krypton gas. The $^{83}$Kr $T_1$ relaxation yields information about the surface-to-volume ratio and the chemistry[13], temperature[14], and degree of hydration[15] at the gas-surface interface in host materials. In hp-krypton MR, the $^{83}$Kr isotope is both the contrast agent and the NMR active spin that can yield high signal intensities despite its low resonance frequency of 15.4 MHz at 9.4 T field strength. This is possible through rubidium vapor spin exchange optical pumping[16] (RbSEOP), a process known to produce hyperpolarized $^{83}$Kr[17,18] but further refined herein to generate hp-$^{83}$Kr that is separated from the paramagnetic and highly reactive rubidium vapor of the RbSEOP process[14]. The resulting signal enhancement of up to 1200 times that of thermally polarized $^{83}$Kr at 9.4 T field strength and ambient temperature is sufficient to allow the first hp-$^{83}$Kr MRI applications including images with surface chemistry sensitive contrast between siliconized (hydrophobic) and (hydrophilic) glass surfaces[12].

The signal intensity obtained from hp-$^{83}$Kr is presently less than that of the more widely used spin I=½ hp-noble gas isotopes $^{129}$Xe and $^{3}$He (see[19-23] for recent reviews). Additionally, $^{83}$Kr lacks the tissue solubility and relatively long dissolved-phase $T_1$ times of hp-$^{129}$Xe that allow MRI studies of pulmonary gas exchange and lung physiology[24-27]. However, the $^{83}$Kr quadrupolar interactions are typically orders of magnitude more sensitive to surface parameters such as temperature and chemical composition than the chemical shift interactions found in $^{129}$Xe. Therefore, hp-$^{83}$Kr is capable of probing the surface molecular layers directly exposed to the gas phase, even in media with relatively large pore dimensions such as lungs. Hence, hp-$^{83}$Kr is of interest because of its potential ability to serve as a novel surface sensitive contrast agent and probe in lungs, an ability that other hp gases are not sufficiently capable.

This example demonstrates that the longitudinal relaxation of hp-$^{83}$Kr is strongly accelerated by the presence of tobacco smoke deposited on model glass surfaces. The resulting $T_1$ variations are exploited to produce contrast in MR images that not only indicate the presence or absence of tobacco smoke deposited on surfaces but also the level of smoke deposition. Of potential biomedical interest is the observation that decreased hp-$^{83}$Kr $T_1$ times are also produced after tobacco smoke is deposited on lung surfactant extract coated surfaces.

Experiments using a variable angle FLASH pulse sequence are performed on a Chemagnetics CMX II 400 MHz NMR spectrometer in a 9.4 T wide-bore (89 mm) superconducting magnet. The magnet is equipped with an imaging system (Resonance Research, Billerica, Mass.) consisting of triple axis gradient coils (100 G/cm x,y axes and 720 G/cm z axis) and low-noise linear gradient amplifiers. All MR data are obtained using custom-built, gas-flow probes tuned to either the $^{83}$Kr frequency of 15.4 MHz or the $^{129}$Xe frequency of 110.6 MHz. The $T_1$ values from optically pumped gasses are calculated by nonlinear least-squares fitting of the NMR signal as a function of time and number of applied medium flip angle (~12°) r.f. pulses. All $T_1$ values reported are the averages of four to eight replicate measurements and are conducted at approximately 85 kPa (injection method) and 290 K. The errors reported are the standard deviations resulting from these replicate measurements. Image processing is performed in MATLAB (Version 14.2; Mathworks, Natick, Mass.) R2006a.

Rubidium vapor spin exchange optical pumping of $^{83}$Kr and $^{129}$Xe. All gas mixtures are produced from research grade krypton (99.995%, natural abundance), xenon (99.995%, natural abundance), molecular nitrogen (99.9997%), and helium (99.9999%) (Airgas, Radnor, Pa.). Optical pumping is performed in a cylindrical Pyrex cell (length=125 mm, I.D.=24 mm). The gas mixtures consist of 95% Kr and 5% $N_2$ ($T_1$ measurements); 25% Kr, 5% $N_2$, and 70% He (imaging experiments); or 20% Xe, 5% $N_2$, and 75% He (all xenon experiments). $N_2$ is added to the mixtures for radiation quenching purposes[28]. The pump cell, containing approximately 1 g of rubidium (99.75%; Alfa Aesar, Ward Hill, Mass.), is housed in a quartz and aluminum oven to maintain even heating (438±5 K for $^{83}$Kr and 393±5 K for $^{129}$Xe). The pressure in the pump cell is maintained above ambient (150-200 kPa) to decrease pump cell contamination with oxygen or water vapor. Light (794.7 nm) from two 30 W Coherent FAP diode-array lasers (line width approximately 2 nm) is directed via fiber optic coupling cables through a circular polarizer onto the pumping cell. After the light passes through the fiber optics and the polarizer, the power is reduced to approximately 40 W. The magnetic field needed for the optical pumping process is provided by the fringe field of the superconducting magnet (0.05 T). Rubidium vapor is separated from the hp-gas mixtures by means of an air-cooled trap at the outlet to the pump cell and a glass wool filter placed directly before the sample region.

In $T_1$ measurements, hp-gasses are delivered by the injection method described herein. Briefly, after an optical pumping period of several minutes, the hp-gas is vacuum shuttled through pneumatic valves from the pump cell to a storage cell. Subsequently, the gas at 150-200 kPa is released into a water filled glass container displacing some of the water into an attached syringe. The hp-gas is then injected into the sample cell through operation of the syringe. MR imaging experiments are conducted at 150 kPa, and the hp-gas mixture is delivered by the stopped-flow[12-14]. In these stopped-flow experiments, polarization is allowed to build for several minutes in the pump cell. During this time the sample is evacuated to less than 0.1 kPa. Following polarization buildup, the hp-gas is rapidly transferred from the pump cell to the sample by pressure equalization.

Sample preparation. In all experiments, the tobacco smoke is produced by combustion of 2R4F (Kentucky research and development center) reference cigarettes in ambient air. In experiments involving the combustion of a full cigarette, smoke is drawn from the cigarette through an intact cigarette filter at approximately 250 mL/min using a Watson-Marlow Bredel peristaltic pump. Samples are located in line between the cigarette filter and the pump. In experiments in which less than a full cigarette is combusted, smoke is deposited by pulling 60 mL of air through a lit cigarette in 4 s with a 10 s waiting period between pulls. In the text, one such deposition is referred to as one "puff."

Untreated, 1.0 mm diameter, borosilicate glass beads (Biospec Products, Inc., Bartlesville, Okla.) are stored overnight in contact with a saturated water vapor prior to surface treatment. For experiments involving suspension bovine pulmonary surfactant extract, a 4 mL vial of Survanta® (Ross Products Division, Abbott Laboratories, Columbus, Ohio) is applied to the borosilicate glass beads. Following Survanta® application, the beads are exposed to cigarette smoke with the same technique as for the other bead samples.

The image phantom consists of three Pyrex tubes (length=60 mm, O.D.=10.0 mm, and I.D.=7.8 mm). These tubes are formed from three individual pieces: the top cap (length=5 mm), the main body (length=50 mm), and the top portion of the gas delivery tubing (length=5 mm). Contained within each tube are 16 soda lime glass capillaries (length=59 mm, O.D.=1.5 mm, and I.D.=1.1 mm). Following smoke application, the three portions of the sampled tubes are sealed together using LOCITE® 409 Superbond® Instant Adhesive (Locite Corp., Kartford, Conn.). The adhesive is allowed to set for approximately 30 minutes prior to experiments to allow a gas tight seal to form.

Longitudinal relaxation measurements by NMR spectroscopy. In the previous examples (FIG. 18), an experimental apparatus is described that allows samples to be exposed to hp-gasses with minimal disturbance to surface hydration while maintaining reasonably high non-equilibrium spin polarization[15]. The same setup is used in this example to deliver hp-$^{83}$Kr or hp-$^{129}$Xe gas mixtures to a series of 1 mm diameter borosilicate glass beads samples that have been pre-exposed to tobacco smoke. These beads are exposed either to the smoke of one fully combusted cigarette or to five puffs of smoke from a single cigarette, as described. One bead sample is thoroughly coated with the commercially available bovine pulmonary surfactant extract Survanta® prior to tobacco smoke exposure. The results of hp-$^{83}$Kr and $^{129}$Xe $T_1$ measurements with these samples are summarized in Table 11 and FIG. 23.

rounding electronic environment[29]. In the absence of containers walls or other surfaces, the longitudinal relaxation of $^{83}$Kr is solely due to gas-phase processes such as binary $^{83}$Kr—Kr collisions that lead to an estimated relaxation time of $T_1$=470 s under ambient pressure and temperature conditions[30]. However, in the presence of surfaces the krypton atoms experience brief periods of adsorption that distort the noble gas electron cloud. The resulting electronic anisotropy produces electric field gradients (EFG) at timescales (i.e. adsorption times) that result in fast quadrupolar driven relaxation.

Although the relaxation times of surface adsorbed $^{83}$Kr are currently unknown, work in zeolites suggest that the $T_1$ times are in the millisecond regime or faster[31]. However, the relaxation measured in NMR experiments is the average between surface induced relaxation and the relaxation during the long bulk gas-phase residence time[18,32]. Therefore the $^{83}$Kr $T_1$ times typically range between a few seconds and a few tens of seconds when the gas is contained in desiccated lung tissue or materials with similar surface-to-volume ratios. Under these conditions, moderate fluctuations in gas-phase temperature and pressure have little influence on $^{83}$Kr relaxation. However, changes in the surface-to-volume ratio, surface temperature, and surface composition, or the co-adsorption of other molecules or atoms can dramatically alter the $^{83}$Kr relaxation rates as these changes affect $^{83}$Kr surface adsorption.

Hydrophobic surfaces lead to a higher krypton surface adsorption affinity and will therefore cause faster relaxation rates relative to hydrophilic surfaces for which krypton has lower affinity. For instance, a 95% krypton mixture in contact with 1 mm borosilicate glass beads that had been siliconized by treatment with the siliconizing agent SurfaSil® experiences a $T_1$ reduction by 75-80%[13,15] [see Examples 1 and 3] compared to untreated beads. Many of the components of the material deposited from tobacco smoke are highly nonpolar, and thus hydrophobic, in nature[33]. It is therefore reasonable to assume that these substances are responsible for the rapid $T_1$ relaxation of hp-$^{83}$Kr in the samples exposed to tobacco smoke.

Effects of paramagnetic species in the smoke deposits An alternative explanation for the observed $^{83}$Kr $T_1$ decrease could potentially be relaxation caused by trace levels of paramagnetic metal ions or long-lived radicals[34] in the tobacco smoke. However, the $^{129}$Xe data presented in Table 6 and FIG.

TABLE 6

$T_1$ values of hp-$^{83}$Kr$^a$ and $^{129}$Xe$^b$ in contact with borosilicate glass beads

| Kr untreated surface$^c$ | Kr full cigarette trial 1 | Kr full cigarette trial 2 | Kr 5 cigarette puffs | Kr + lung surfactant$^c$ | Kr full cigarette + lung surfactant |
|---|---|---|---|---|---|
| 62.8 ± 3.3 s | 3.3 ± 0.3 s | 2.8 ± 0.4 s | 24.4 ± 0.8 s | 16.1 ± 0.5 s | 10.6 ± 1.2 s |

| Xe untreated surface$^c$ | Xe Full cigarette | Xe + lung surfactant$^c$ | Xe full cigarette + lung surfactant |
|---|---|---|---|
| 103.0 ± 8.2 s | 120.1 ± 4.9 s | 420.1 ± 27.4 s | 346.4 ± 11.1 s |

All $T_1$ values are the averages resulting from 4-8 replicate measurements and the reported errors are the standard deviations resulting from those measurements.
$^a$95% Kr + 5% N$_2$
$^b$20% Xe + 5% N$_2$ + 75% He
$^c$previously reported in Table 4

Mechanisms of $^{83}$Kr relaxation in the presence of cigarette smoke condensate. Like all isotopes with nuclear spin I>½, $^{83}$Kr possesses a nonzero nuclear electric quadrupole moment and is extremely sensitive to anisotropy in its sur- 23B suggest that this not the case. The $T_1$ relaxation of $^{129}$Xe is much more sensitive to the presence of paramagnetic compounds than that of $^{83}$Kr due to the smaller gyromagnetic ratio of the $^{83}$Kr nucleus ($\gamma_{129Xe}/\gamma_{83Kr} \approx 50$).[12,15] Given the same surface residence time and proximity to the paramagnetic surface sites, this smaller gyromagnetic ratio leads to a theoretical ~50 fold reduced sensitivity to paramagnetic species for the longitudinal relaxation of $^{83}$Kr compared to that of $^{129}$Xe. Additionally, the smaller and thus less polarizable krypton electron cloud leads to a decreased surface affinity for krypton compared to xenon and, therefore, to reduced contact time with the paramagnetic sites. Therefore, $^{129}$Xe longitudinal relaxation is a much more sensitive probe to the presence species than $^{83}$Kr T$_1$ relaxation[15].

Figure 23:
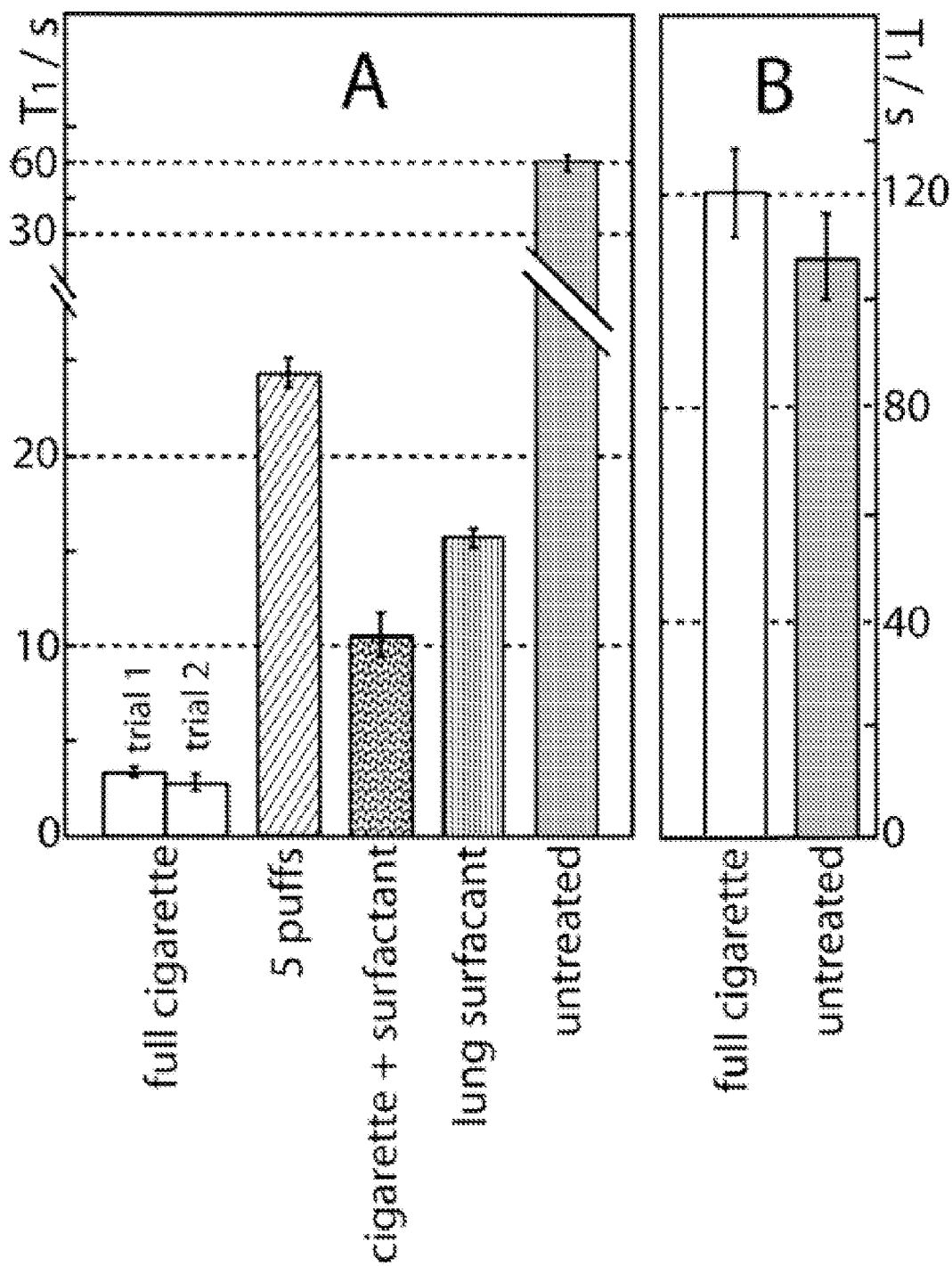
FIG. 23. $T_1$ values of hp-$^{83}$Kr and $^{129}$Xe in contact with surface treated, 1 mm diameter borosilicate glass beads. The data for surfaces without deposited tobacco smoke is reported in Tables 3, 4 and 5. (A) $T_1$ values for a 95% Kr gas mixture. (B) $T_1$ values for a 20% Xe gas mixture.

The data in FIG. 23 shows, however, that the $^{129}$Xe longitudinal relaxation is little affected by the presence of tobacco smoke deposits. The 103±8 s T$_1$ time of $^{129}$Xe in a 20% xenon mixture exposed to hydrated, 1 mm borosilicate glass beads is even somewhat less than the 120.1±4.9 s observed for the same gas mixture in a similar bead sample that had been exposed the smoke of one full cigarette. In fact, it appears that the presence of smoke condensate on glass surfaces may slightly prolong the $^{129}$Xe relaxation times. This finding suggests that the paramagnetic species present in the smoke condensate, such as trace levels of transition metal ions and persistent semiquinone radicals, contribute no more to the $^{129}$Xe T$_1$ times than do the paramagnetic impurities in the glass surface. The opposite effect occurs when the glass beads are pre-coated with lung surfactant. The $^{129}$Xe relaxation time decreases from T$_1$=420 s for lung surfactant coated glass beads to T$_1$=346 s after smoke deposition on the lung surfactant. The paramagnetic species in the smoke deposit may cause this acceleration in longitudinal relaxation. However, it is unlikely that this acceleration could be observed by in vivo $^{129}$Xe MRI of lungs where the presence of molecular oxygen leads to typical $^{129}$Xe relaxation times of T$_1$=10-20 s[35]. Because of the low sensitivity of the $^{83}$Kr nucleus to paramagnetic relaxation, it can be concluded that the 38% reduction in $^{83}$Kr T$_1$ time after smoke deposition is not caused by paramagnetic surface sites, in particular if one considers the short $^{83}$Kr T$_1$ time scale (i.e. T$_1$ is reduced from 16 s to 10 s). The $^{129}$Xe relaxation data indicate that relaxation caused by paramagnetic species within the deposited tobacco smoke plays an insignificant role in the hp-$^{83}$Kr longitudinal relaxation processes.

Figure 24A:
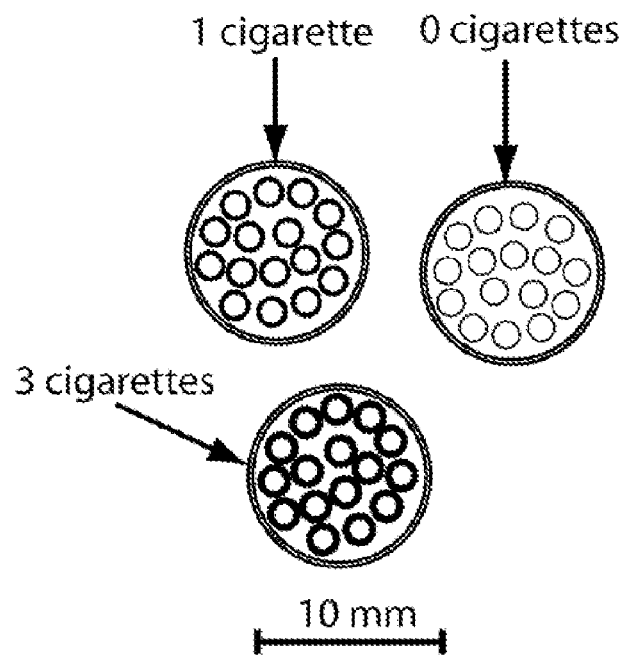
FIG. 24 Hp-$^{83}$Kr FLASH image of glass capillaries exposed to cigarette smoke. (A) Sketch of the phantom used to produce the image. Large circles represent the Pyrex tubes used to contain the hp-$^{83}$Kr. The smaller circles represent the glass capillaries forming the sample. The tube contents were exposed smoke from 0 (upper right), 1 (upper left), or 3 (bottom) cigarettes. (B) Variable flip angle FLASH image acquired immediately after stopped-flow transfer of the hp-$^{83}$Kr. Three FLASH images have been superimposed to obtain a better signal to noise ratio.

T$_1$ weighted FLASH MR imaging. Although the borosilicate glass beads discussed earlier provide simple and fairly reproducible samples for T$_1$ measurements, they are not an ideal medium for MR imaging. Assuming hard sphere packing, the sample void-space comprises only 26% of the sample volume. Consequently, an alternate model system that provides a higher gas-phase filling factor and thus higher $^{83}$Kr density is selected. The phantom used to produce the images (see FIG. 24A) comprises three 60 mm long Pyrex tubes (O.D.=10.0 mm, I.D.=7.8 mm). Enclosed within each Pyrex tube are sixteen, 59 mm long soda lime glass capillaries (O.D.=1.5 mm, I.D.=1.1 mm). One tube is not exposed to cigarette smoke, one is exposed to the smoke of one cigarette, and one was exposed to the smoke of three cigarettes, as described herein. The hp-$^{83}$Kr mixture is supplied to each tube from a common source through 1 mm wide holes at the bottom of each tube. This ensures equal gas pressure (150 kPa) in each tube, while limiting gas exchange between the tubes during the experiments.

Compared to MRI of thermally polarized spin systems, the application of FLASH sequences[36] is less straightforward for hyperpolarized nuclei, in particular when the signal intensity is a limiting factor. A variation of this technique was developed by Walsworth, Albert, and coworkers[37] where the small but constant flip angles of typical FLASH sequences are replaced by progressively increasing flip angles according to the relation:

$$\theta_n = \tan^{-1}\left(\frac{1}{\sqrt{N-n}}\right)$$

where n is the acquisition increment, N is the total number of r.f. pulses applied, and $\theta_n$ is the flip angle of the $n^{th}$ r.f. pulse. Note that the final r.f. pulse (n=N) corresponds to 90°. Incrementing the pulse lengths in this manner produces identical signal intensities for each increment, assuming negligible T$_1$ relaxation during image acquisition, and will therefore utilize all of the non-equilibrium spin polarization. Although this technique was originally designed with hp-$^{129}$Xe and hp-$^{3}$He in mind, it is particularly valuable for hp-$^{83}$Kr MRI because of the currently limited spin polarization where n is the acquisition increment, N is the total number of r.f. pulses applied, and $\theta_n$ is the flip angle of the $n^{th}$ r.f. pulse. Note that the final r.f. pulse (n=N) corresponds to 90°. Incrementing the pulse lengths in this manner produces identical signal intensities for each increment, assuming negligible T$_1$ relaxation during image acquisition, and will therefore utilize all of the non-equilibrium spin polarization. Although this technique was originally designed with hp-$^{129}$Xe and hp-$^{3}$He in mind, it is particularly valuable for hp-$^{83}$Kr MRI because of the currently limited spin polarization.

Figure 24B:
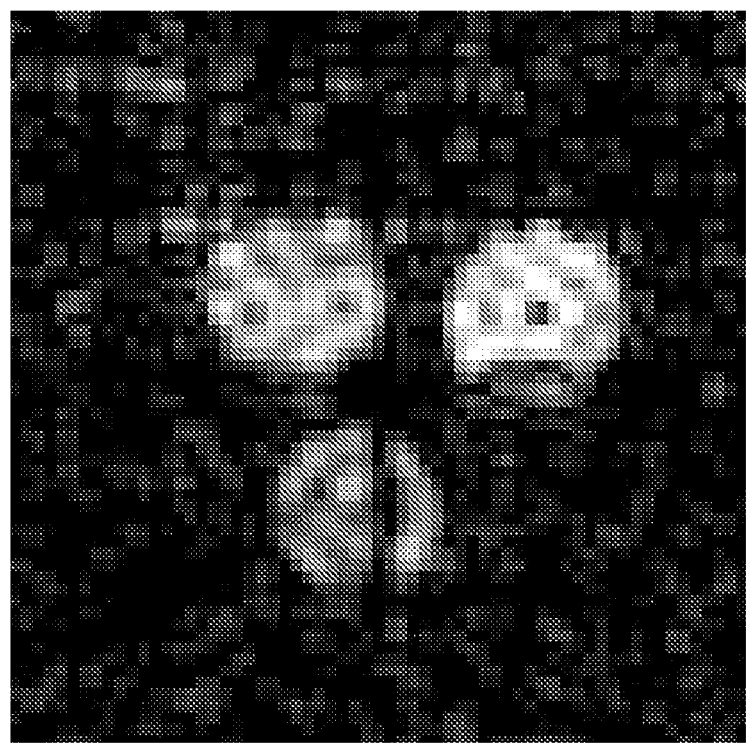

The progressively increased flip angle FLASH sequence, applied to individual stopped-flow deliveries of hp-$^{83}$Kr, is used to obtain the hp-$^{83}$Kr MR images (see FIGS. 24 and 25). FIG. 24B is produced by averaging three, 32 increment, variable flip angle FLASH sequences with no slice selection. Each of the three sequences was applied to hp-$^{83}$Kr delivered by stopped-flow and required 3.5 s of total experimental time. The resulting image was produced with minimal apodization and has a pixel resolution of 490 µm by 490 µm after zero filling to 64 points in each dimension. FIG. 24B displays several of noteworthy features. Within the images from each of the three tubes are alternating regions of higher and lower signal intensity. The approximately 1 mm diameter of these higher intensity regions corresponds well with the 1.1 mm I.D. of the glass capillaries forming the samples suggesting that the image resolution is sufficient to partially resolve the interior structure of the phantom. It should also be noted that, while all three tubes are clearly visible in FIG. 24B, the signal intensity from the tube with the greatest smoke exposure (3 cigarettes) is significantly less than that observed in the other two tubes. The smoke of three cigarettes leads to a smoke condensate deposition on the exposed surfaces of only 0.6 mg or less. This level of surface deposition does not significantly alter the surface-to-volume ratio of the sample, and thus cannot account for the observed decrease in hp-$^{83}$Kr signal intensity. In addition, the sample is constructed to provide equal gas pressure and thus equal krypton number density to each tube. Therefore, the lower intensity observed in the tube with the greatest cigarette smoke exposure must result from loss of non-equilibrium hp-$^{83}$Kr spin polarization to T$_1$ relaxation during the approximately 3 s gas delivery time needed to obtain complete pressure equalization and during the additional time needed for image acquisition.

Figure 25A:
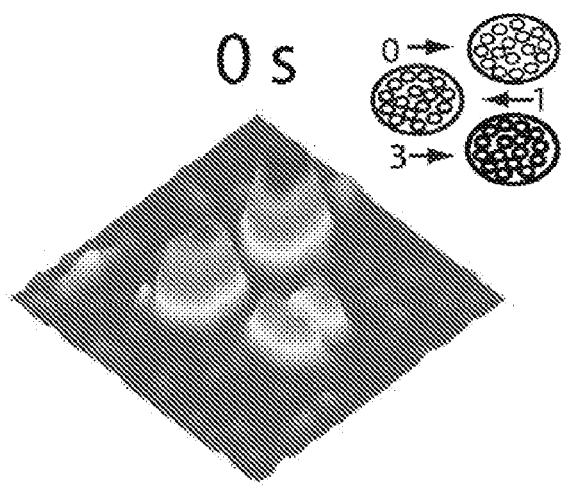
FIG. 25 $T_1$ weighted hp-$^{83}$Kr MR FLASH images. Each image was produced from a single, variable angle FLASH image. In these images, structure is not observed due to the lower image resolution compared to that of FIG. 2B. The scale at the bottom of the figure indicates the signal intensity in arbitrary units. (A) Image immediately after stopped-flow transfer of the hp-$^{83}$Kr. The inset figure is a sketch of the phantom used to produce the images. The labels 1-3 indicate the number of cigarettes used to supply smoke to a given tube. (B) Image acquired 5 s after hp-$^{83}$Kr transfer. (C) Image acquired 10 s after hp-$^{83}$Kr transfer.
Figure 25B:
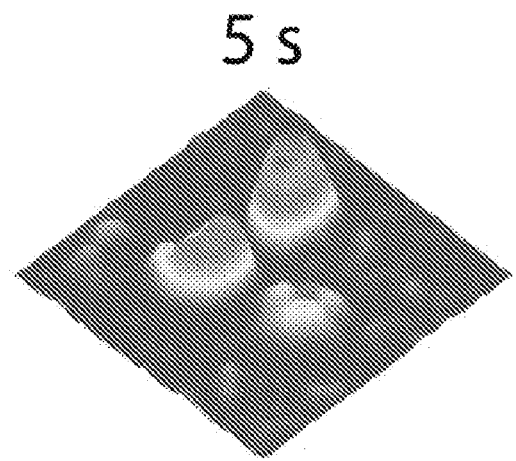
Figure 25C:
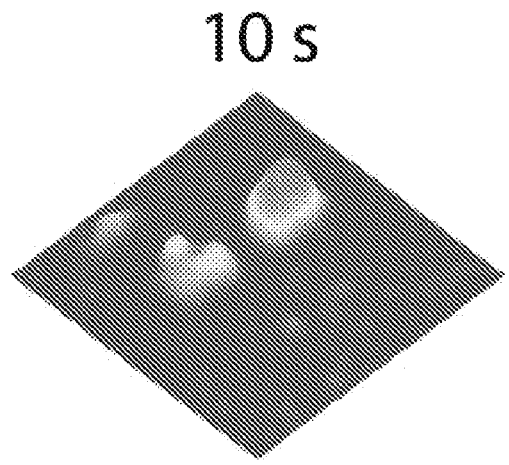

At longer waiting times, the effect of the cigarette smoke becomes even more pronounced (see FIG. 25). Each of the images displayed in FIG. 25A-C result from single, 32 increment, variable flip angle FLASH sequences with no slice selection applied. The internal structure of the each tube phantom is unresolved because apodization is applied in both dimensions to achieve satisfactory signal-to-noise ratio after data processing. The effect of the cigarette smoke deposition, however, is readily observed.

When a 5 s period elapses between the end of the stopped-flow transfer and the beginning of image acquisition (see FIG. 25B), the intensity of the hp-$^{83}$Kr gas in the tube containing untreated capillaries experiences only minor signal decay. At the same time the signal intensity from the tube exposed to the smoke of one cigarette visually decreases, and the intensity from the tube exposed to three cigarettes experiences a more dramatic change. After a 10 s waiting period (see FIG. 25C), moderate signal intensity loss is observed from the unexposed tube, as is expected from the slower $T_1$ relaxation experienced by the hp-$^{83}$Kr gas molecules in contact with untreated glass surfaces. The signal intensity from the two other tubes, however, either decays substantially (1 cigarette) or is not observed in the image above noise level (3 cigarettes). The rapid decay in $^{83}$Kr polarization seen in the tube exposed to the smoke of three cigarettes displays strong sensitivity of hp-$^{83}$Kr longitudinal relaxation to the more "heavily" smoked surfaces. More "smoked" surface leads to the significantly faster relaxation of the krypton gas.

Because of the limited nonequilibrium $^{83}$Kr nuclear spin polarization that can currently be generated, reasonable signal-to-noise ratios are achieved only for imaging sequence comprising a limited number of increments. However, substantial signal intensity gains are expected using a combination of isotopic enrichment, better gas delivery systems, better pump cell designs, higher laser power, and line-narrowed laser sources. Together, such refinements leads to additional signal enhancement of an order of magnitude or more, and facilitates higher increment FLASH sequences.

Unfortunately, higher increment imaging sequences introduce an additional complication in $T_1$ weighted hp-$^{83}$Kr FLASH imaging. In the time required to obtain a hundred or more increments with pulse delays of milliseconds or tens of milliseconds, substantial $T_1$ relaxation may occur during the image acquisition. Such polarization losses during image acquisition are known to introduce experimental artifacts. If the sample being imaged possesses $T_1$ homogeneity, these losses can be accounted for by appropriately altering the pulse lengths in a variable flip angle pulse sequence. This correction cannot be made if the sample possesses $T_1$ inhomogeneity or if the $T_1$ time is unknown, and both situations likely occur in practical applications. We approximate the effects of these difficulties by intentionally selecting a long delay time between r.f. pulses, resulting in image acquisition times of about 3.5 s. The $T_1$ decay occurring during image acquisition prohibits quantitative comparisons between the signal intensities arising from each of the sample tubes in FIG. 25A-C. However, FIG. 25 does show that qualitatively useful information is obtained even if substantial signal decay occurs during image acquisition.

This work demonstrates that the $T_1$ relaxation of hyperpolarized $^{83}$Kr can be accelerated by at least a factor of twenty in the presence of tobacco smoke deposits on surfaces. The $T_1$ differences are more than sufficient to produce meaningful $T_1$ contrast in hp-$^{83}$Kr MR images of samples with different levels of smoke deposition. The contrast is caused by quadrupolar relaxation during brief surface adsorption periods of the krypton atoms and can therefore not be observed in MRI using the spin I=½ noble gas isotopes $^{129}$Xe or $^3$He. An accelerated $^{83}$Kr $T_1$ relaxation is also found when surfaces coated with a pulmonary lung surfactant extract are exposed to tobacco smoke suggesting that the $^{83}$Kr specific contrast may potentially be obtained in vivo and enhance the current understanding of the pathology of smoking related respiratory diseases. Comparisons with $^{129}$Xe $T_1$ data indicate that the observed acceleration is not due to the presence of paramagnetic species in the deposited cigarette smoke. It is also concluded that paramagnetic species present in cigarette smoke are unlikely to cause longitudinal relaxation contrast in in vivo hp-$^{129}$Xe MRI of airways.

(1) Viegi, G.; Scognamiglio, A.; Baldacci, S.; Pistelli, F.; Carrozzi, L. *Respiration* 2001, 68, 4-19.
(2) Hecht, S. S. *Nature Reviews Cancer* 2003, 3, 733-744.
(3) Ambrose, J. a.; Barua, R. S. *Journal of the American College of Cardiology* 2004, 43, 1731-1737.
(4) Bernstein, D. M. *Inhalation Toxicology* 2004, 16, 675-689.
(5) Baker, R. R.; Dixon, M. *Inhalation Toxicology* 2006, 18, 255-294.
(6) Pankow, J. F. *Chemical Research in Toxicology* 2001, 14, 1465-1481.
(7) Wynder, E. L.; Muscat, J. E. *Environmental Health Perspectives* 1995, 103, 143-148.
(8) Janssen-Heijnen, M. L. G.; Coebergh, J. W. W. *Lung Cancer* 2003, 41, 245-258.
(9) Morawska, L.; Hofmann, W.; Hitchins-Loveday, J.; Swanson, C.; Mengersen, K. *Journal of Aerosol Science* 2005, 36, 939-957.
(10) Nazaroff, W. W.; Hung, W. Y.; Sasse, a. G. B. M.; Gadgil, a. J. *Aerosol Science and Technology* 1993, 19, 243-254.
(11) YEH, H. C.; Schum, G. M. *Bulletin of Mathematical Biology* 1980, 42, 461-480.
(12) Pavlovskaya, G. E.; Cleveland, Z. I.; Stupic, K. F.; Meersmann, T. *Proc. Nat. Acad. Sci.* 2005, 102, 18275-18279.
(13) Stupic, K. F.; Cleveland, Z. I.; Pavlovskaya, G. E.; Meersmann, T. *Solid. State. Nucl. Mag.* 2006, 29, 79-84.
(14) Cleveland, Z. I.; Pavlovskaya, G. E.; Stupic, K. F.; LeNoir, C. F.; Meersmann, T. *J. Chem. Phys.* 2006, 124, 044312.
(15) Cleveland, Z. I.; Stupic, K. F.; Pavlovskaya, G. E.; Repine, J. E.; Wooten, J. B.; Meersmann, T. *Journal of the America Chemical Society in press*.
(16) Walker, T. G.; Happer, W. *Rev. Mod. Phys.* 1997, 69, 629-642.
(17) Schaefer, S. R.; Cates, G. D.; Happer, W. *Phys. Rev. A* 1990, 41, 6063-6070.
(18) Butscher, R.; Wäckerle, G.; Mehring, M. *Chem. Phys. Lett.* 1996, 249, 444-450.
(19) Goodson, B. M. *J. Magn. Reson.* 2002, 155, 157-216.
(20) Raftery, D. *Annua Reports on NMR Spectroscopy* 2006, 57, 205-207.
(21) van Beek, E. J. R.; Wild, J. M.; Kauczor, H. U.; Schreiber, W.; Mugler, J. P.; de Lange, E. E. *Journal of Magnetic Resonance Imaging* 2004, 20, 540-554.
(22) Kadlecek, S. J.; Emami, K.; Fischer, M. C.; Ishii, M.; Yu, J. S.; Woodburn, J. M.; NikKhah, M.; Vahdat, V.; Lipson, D. A.; Baumgardner, J. E.; Rizi, R. R. *Progr. NMR Spectroc.* 2005, 47, 187-212.
(23) Conradi, M. S.; Saam, B. T.; Yablonskiy, D. A.; Woods, J. C. *Progr. NMR Spectroc.* 2006, 48, 63-83.
(24) Ruppert, K.; Brookeman, J. R.; Hagspiel, K. D.; Mugler, J. P. *Mag. Res. Med.* 2000, 44, 349-357.
(25) Ruppert, K.; Mata, J. F.; Brookeman, J. R.; Hagspiel, K. D.; Mugler, J. P. *Mag. Res. Med.* 2004, 51, 676-687.
(26) Driehuys, B.; Cofer, G. P.; Pollaro, J.; Mackel, J. B.; Hedlund, L. W.; Johnson, G. A. *Proc. Nat. Acad. Sci.* 2006, 103, 18278-18283.

(27) Driehuys, B. *Science* 2006, 314, 432-433.
(28) Mortuza, M. G.; Anala, S.; Pavlovskaya, G. E.; Dieken, T. J.; Meersmann, T. *J. Chem. Phys.* 2003, 118, 1581-1584.
(29) Abragam, A. *The Principles of Nuclear Magnetism*; Oxford University Press: Oxford, UK, 1961.
(30) Brinkmann, D.; Kuhn, D. *Phys. Rev. A* 1980, 21, 163-167.
(31) Horton-Garcia, C. F.; Pavlovskaya, G. E.; Meersmann, T. *J. Am. Chem. Soc.* 2005, 127, 1958-1962.
(32) Butscher, R.; Wackerle, G.; Mehring, M. *J. Chem. Phys.* 1994, 100, 6923-6933.
(33) Hoffmann, D.; Hoffmann, I.; El-Bayoumy, K. *Chemical Research in Toxicology* 2001, 14, 767-790.
(34) Pryor, W. a.; Hales, B. J.; Premovic, P. I.; Church, D. F. *Science* 1983, 220, 425-427.
(35) Moller, H. E.; Chen, X. J.; Saam, B.; Hagspiel, K. D.; Johnson, G. A.; Altes, T. A.; de Lange, E. E.; Kauczor, H. U. *Mag. Res. Med.* 2002, 47, 1029-1051.
(36) Haase, a.; Frahm, J.; Matthaei, D.; Hanicke, W.; Merboldt, K. D. *J. Magn. Reson.* 1986, 67, 258-266.
(37) Zhao, L.; Mulkern, R.; Tseng, C. H.; Williamson, D.; Patz, S.; Kraft, R.; Walsworth, R. L.; Jolesz, F. A.; Albert, M. S. *J. Magn. Reson. Ser. B* 1996, 113, 179-183.

We claim:

1. A method of probing a surface comprising:
   a. providing a noble gas, wherein said noble gas has a nuclear electric quadrupole moment;
   b. hyperpolarizing said noble gas to generate a purified hyperpolarized noble gas substantially free of alkali metal vapor;
   c. introducing said purified hyperpolarized noble gas to said surface, wherein said gas is capable of contacting said surface; and
   d. detecting an event that is a nuclear electric quadrupole interaction, wherein said event is generated by surface contact of said introduced purified hyperpolarized noble gas, thereby probing said surface
wherein the probing provides a measure of surface-to-volume ratio, surface shape, surface orientation with respect to a magnetic field, surface chemical composition, surface hydration, surface porosity, surface temperature distribution, adsorption of chemicals onto said surface, absorption of chemicals into said surface, surface grafting, surface wetting, surface electrochemical treatment, surface plasma treatment, surface chemical vapor deposition, or any combination thereof.

2. The method of claim 1, wherein said hyperpolarization step is selected from the group consisting of:
   a. alkali metal vapor spin exchange optical pumping;
   b. metastability exchange optical pumping;
   c. dynamic nuclear polarization; and
   d. brute force polarization.

3. The method of claim 1, wherein said hyperpolarization step comprises:
   a. hyperpolarizing said noble gas by optical pumping in the presence of an alkali metal vapor capable of providing spin exchange with said noble gas; and
   b. removing substantially all of said alkali metal vapor from said hyperpolarized noble gas to generate a purified hyperpolarized noble gas, wherein said removal occurs at a time prior to said introducing step.

4. The method of claim 3, wherein said alkali metal vapor is selected from the alkali metal group consisting of lithium-6, lithium-7, sodium-23, potassium-39, cesium-133, rubidium-85, rubidium-87, and a mixture thereof.

5. The method of claim 3, wherein greater than about 99% of the alkali metal vapor is removed prior to introducing the hyperpolarized noble gas to the surface.

6. The method of claim 1, wherein said noble gas serves as a magnetic resonance imaging contrast agent that is sensitive to surrounding surfaces.

7. The method of claim 1, wherein said surface is a reactive surface selected from the group consisting of a biological surface, non-biological surface, or both.

8. The method of claim 7, further comprising exposing said reactive surface to a chemical, wherein said exposure occurs at a time that is prior to or simultaneous to said detection step.

9. The method of claim 8, wherein said chemical is selected from the group consisting of water vapor, gasses, smoke, aerosols, liquids, colloids, suspensions, emulsions and plasma phase chemicals.

10. The method of claim 1, wherein said surface has been exposed to cigarette smoke, cigarette smoke condensates or cigarette tar.

11. The method of claim 1, wherein said surface is part of a material that is porous, or said surface is located within an opaque medium, or both.

12. The method of claim 1, wherein said noble gas is selected from the group consisting of $^{21}$Ne, $^{83}$Kr, $^{131}$Xe, and any combination thereof.

13. The method of claim 12, wherein said noble gas comprises a single noble gas.

14. The method of claim 12, wherein said noble gas further comprises a magnetic resonance detectable gas tracer selected from a group consisting of $^{129}$Xe, $^{3}$He, fluorinated gases, gas-phase hydrocarbons, or combinations thereof.

15. The method of claim 1, wherein said event is selected from the group consisting of:
   quadrupolar driven $T_1$ relaxation;
   quadrupolar driven $T_2$ relaxation;
   quadrupolar driven $T_{1p}$ relaxation;
   coherent quadrupolar interactions on the surface that generate quadrupolar splitting of the observed resonance line in the gas phase or a broadening of the resonance line;
   development of higher rank tensor elements of coherence, or magnetization, or both; and
   any combination thereof.

16. The method of claim 1, wherein said detection is by a technique selected from the group consisting of:
   a. nuclear magnetic resonance spectroscopy;
   b. magnetic resonance imaging,
   c. low field nuclear magnetic resonance detection,
   d. NMR relaxometry;
   e. measurement through superconducting quantum interference devices; and
   f. measurement through optical magnetometer.

17. The method of claim 1, wherein said nuclear quadrupolar interaction during surface contact of said noble gas with nuclear electric quadrupole moment is detected directly or indirectly through any NMR measurable parameter.

18. The method of claim 1, wherein said hyperpolarizing step occurs in the absence of said surface.

19. The method of claim 1, wherein said hyperpolarized noble gas is introduced to the surface by continuous flow.

20. The method of claim 1, wherein said hyperpolarized noble gas is introduced to the surface by stopped flow.

21. The method of claim 1, wherein the surface comprises a biological material.

22. The method of claim 21, wherein the biological material is a lung or lung tissue.

23. The method of claim 22, further comprising generating an image from the said detection step by magnetic resonance imaging.

24. The method of claim 1, wherein the surface is a non-biological material.

25. The method of claim 1, wherein said hyperpolarized noble gas comprises $^{83}$Kr, $^{21}$Ne, $^{131}$Xe, or any combination thereof and said hyperpolarized noble gas is detected by nuclear magnetic resonance spectroscopy, magnetic resonance imaging, or both.

26. The method of claim 1, further comprising adding oxygen to said purified hyperpolarized noble gas.

27. The method of claim 1, wherein said event is surface-induced relaxation of said purified noble gas.

28. A method of probing a surface comprising:
   a. providing a noble gas, wherein said noble gas has a nuclear electric quadrupole moment;
   b. hyperpolarizing said noble gas to generate a purified hyperpolarized noble gas substantially free of alkali metal vapor;
   c. introducing said purified hyperpolarized noble gas to said surface, wherein said gas is capable of contacting said surface; and
   d. detecting an event that is a nuclear electric quadrupole interaction, wherein said event is generated by surface contact of said introduced purified hyperpolarized noble gas, thereby probing said surface, wherein said event is selected from the group consisting of:
      quadrupolar driven $T_1$ relaxation;
      quadrupolar driven $T_2$ relaxation;
      quadrupolar driven $T_{1p}$ relaxation;
      coherent quadrupolar interactions on the surface that generate quadrupolar splitting of the observed resonance line in the gas phase or a broadening of the resonance line;
      development of higher rank tensor elements of coherence, or magnetization, or both; and
      any combination thereof;
   said method further comprising tuning said purified hyperpolarized noble gas by altering said noble gas composition, density, or pressure, thereby generating said event having a value falling within a user-selected range.

29. The method of claim 28, wherein said introduced noble gas comprises a gas mixture having at least two components, said mixture having
   a. a first component selected from the group consisting of $^{83}$Kr, $^{21}$Ne, $^{131}$Xe, and a mixture thereof; and
   b. a second component that is an inert gas;
wherein tuning is accomplished by altering the concentration of said first component by varying the amount of the first component, second component, or both.

30. The method of claim 28, wherein said hyperpolarizing step occurs in the absence of said surface.

* * * * *